(12) United States Patent
Nakamura et al.

(10) Patent No.: US 8,323,992 B2
(45) Date of Patent: Dec. 4, 2012

(54) METHOD OF MANUFACTURING SEMICONDUCTOR INTEGRATED CIRCUIT DEVICE

(75) Inventors: Seigo Nakamura, Kanagawa (JP); Iwao Natori, Kanagawa (JP); Yasuhiro Motoyama, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/228,334

(22) Filed: Sep. 8, 2011

(65) Prior Publication Data
US 2012/0064646 A1 Mar. 15, 2012

(30) Foreign Application Priority Data

Sep. 9, 2010 (JP) ................................. 2010-201991
Sep. 9, 2010 (JP) ................................. 2010-202203
May 20, 2011 (JP) ................................. 2011-113104

(51) Int. Cl.
*H01L 21/66* (2006.01)
*G01R 31/26* (2006.01)
(52) U.S. Cl. ................ 438/17; 438/14; 438/18
(58) Field of Classification Search ........... 438/14, 438/17, 18
See application file for complete search history.

(56) References Cited

U.S. PATENT DOCUMENTS

| 6,358,762 B1 * | 3/2002 | Kohno et al. ............ 438/17 |
| 6,835,589 B2 * | 12/2004 | Pogge et al. ............ 438/52 |
| 7,018,857 B2 * | 3/2006 | Kanamaru et al. ........... 438/18 |
| 2005/0093565 A1 | 5/2005 | Okamoto et al. |
| 2005/0227383 A1 | 10/2005 | Okamoto et al. |
| 2007/0108997 A1 | 5/2007 | Motoyama et al. |
| 2007/0190671 A1 | 8/2007 | Okamoto et al. |
| 2008/0160657 A1 | 7/2008 | Hasebe et al. |
| 2009/0017565 A1 | 1/2009 | Hasebe et al. |
| 2010/0277192 A1 | 11/2010 | Hasebe et al. |
| 2010/0279502 A1 | 11/2010 | Hasebe et al. |
| 2011/0136272 A1 | 6/2011 | Okamoto et al. |
| 2011/0175634 A1 | 7/2011 | Okamoto et al. |

FOREIGN PATENT DOCUMENTS

| JP | 2005-136246 A | 5/2005 |
| JP | 2005-302917 A | 10/2005 |
| JP | 2007-134554 A | 5/2007 |
| JP | 2008-164486 A | 7/2008 |
| WO | WO 2006/097982 A1 | 9/2006 |

* cited by examiner

*Primary Examiner* — Angel Roman
(74) *Attorney, Agent, or Firm* — Miles and Stockbridge P.C.

(57) ABSTRACT

The variation in the contact pressures of the plurality of contact terminals to the plurality of chip electrodes is decreased. A thin-film sheet (first sheet) includes: a principal surface (contact-terminal formation surface) on which a plurality of contactors (contact terminals) are formed; and a rear surface positioned on an opposite side to the principal surface. Also, in the thin film sheet, a plurality of wirings and dummy wiring are arranged between the principal surface and the rear surface. A slit formed of an opening portion penetrating from the principal surface of the thin-film sheet to the rear surface thereof is formed along the wiring between the dummy wiring and the contactor arranged at an end of a contactor group (first contact terminal group) in which the plurality of contactors are aligned.

20 Claims, 57 Drawing Sheets

METHOD OF MANUFACTURING SEMICONDUCTOR INTEGRATED CIRCUIT DEVICE

CROSS-REFERENCE TO RELATED APPLICATION

The present application claims priority from Japanese Patent Applications No. 2010-202203 filed on Sep. 9, 2010, No. 2010-201991 filed on Sep. 9, 2010, and No. 2011-113104 filed on May 20, 2011, the content of which is hereby incorporated by reference into this application.

TECHNICAL FIELD OF THE INVENTION

The present invention relates to a method of manufacturing a semiconductor integrated circuit device. More particularly, the present invention relates to a technique effectively applied to an electric inspection for the semiconductor integrated circuit device by pressing a contact terminal of a probe card on an electrode of the semiconductor integrated circuit device.

BACKGROUND OF THE INVENTION

Japanese Patent Application Laid-Open Publication No. 2005-136246 (Patent Document 1) and International Publication No. 2006/97982 (Patent Document 2) describe a method of electrical inspection (probe inspection) for a semiconductor integrated circuit by pressing a contact terminal of a probe card on an electrode pad of a semiconductor integrated circuit device and describe a probe card used for the method.

Japanese Patent Application Laid-Open Publication No. 2007-134554 (Patent Document 3) describes a probe card including a thin-film sheet in which a plurality of wiring layers are stacked on a contact terminal.

Japanese Patent Application Laid-Open Publication No. 2008-164486 (Patent Document 4) describes a probe card having a thin-film sheet in which a contact terminal and a wiring are electrically connected with each other via a through hole formed on the contact terminal.

Japanese Patent Application Laid-Open Publication No. 2005-302917 (Patent Document 5) describes a probe card in which a dummy wiring not affecting signal transmission is arranged on a thin-film sheet.

SUMMARY OF THE INVENTION

As an inspection technique for a semiconductor integrated circuit device, probe inspection is cited. The probe inspection includes: a function test for checking whether the device is operated as following a predetermined function or not; and a judgment test for judging a proper/improper product by performing a test for DC operation characteristic and AC operation characteristic; and others. In the probe inspection, a technique of performing the probe inspection in a state of a wafer is used because of requirements for wafer shipment support (quality differentiation), KGD (Known Good Die) support (yield improvement of MCP (Multi-Chip Package), total cost reduction, or others.

In recent years, multiplication of functions of a semiconductor integrated circuit device has been advanced, and fabrication of a plurality of circuits on one semiconductor chip (hereinafter, simply referred to as "chip") has been advanced. Also, in order to reduce the manufacturing cost of the semiconductor integrated circuit device, it has been advanced that a semiconductor element and a wiring is microfabricated to decrease a chip area, so that the number of the obtained chips per one semiconductor wafer (hereinafter, simply referred to as "wafer") is increased. Therefore, in addition to the increase in the number of chip electrodes (test pad and bonding pad), narrow pitch in chip electrode arrangement is achieved, and an area of the chip electrode is also decreased. As such a narrow pitch of the chip electrode, there is a problem that, if a prober having a cantilever-shaped contact terminal is used for the above-described probe inspection, it is difficult to place the contact terminal so as to be adjusted on an arranged position of the chip electrode.

The inventors of the present application have studied a technique capable of achieving the probe inspection also for the chip in which the narrow pitch of the chip electrode is achieved by using a prober having a contact terminal formed by using a technique of manufacturing a semiconductor integrated circuit device. During the studies, the inventors of the present application have found out the following further problems.

That is, in the probe inspection, a plurality of contact terminals are contacted with a plurality of chip electrodes formed on a principal surface of a wafer, and therefore, a technique of decreasing variation in a contact pressure between each contact terminal and each chip electrode is required. If the variation in the contact pressure is large, a contact resistance becomes uneven, and this becomes a cause that precise electrical inspection cannot be performed.

Also, if the contact pressure is too large, this becomes a cause that a wafer which is an inspected target is damaged. From a viewpoint of preventing the damage of the wafer, it is effective to decrease a center value (designed contact pressure) of the variation in the contact pressure. However, for this, it is required to further decrease the margin of the variation.

Also, according to the studies made by the inventors of the present application, it has been found out that, even when even load is applied to a contact-terminal arrangement region of a sheet on which a plurality of contact terminals are formed, the variation in the contact pressure is caused. For example, a contact pressure of a contact terminal arranged at an end portion of a contact terminal group in which the plurality of contact terminals are arranged is higher than contact pressures of other contact terminals. Also, if the contact terminal group includes a dense-arrangement region in which the plurality of contact terminals are densely arranged and a dispersive-arrangement region in which the plurality of contact terminals are dispersively arranged, a contact pressure of a contact terminal arranged in the dispersive-arrangement region is higher than a contact pressure of a contact terminal arranged in the dense-arrangement region.

The present invention has been made in consideration of the above-described problems, and a preferred aim of the present invention is to provide a technique capable of decreasing the variation in the contact pressure between the plurality of contact terminals and the plurality of chip electrodes.

The above and other preferred aims and novel characteristics of the present invention will be apparent from the description of the present specification and the accompanying drawings.

The typical ones of the inventions disclosed in the present application will be briefly described as follows.

That is, a method of manufacturing a semiconductor device which is a mode of the invention of the present application includes the following steps. The method includes the step of (a) preparing a semiconductor wafer which is partitioned into a plurality of chip regions, in which a semiconductor integrated circuit is formed in each of the plurality of chip regions, and on whose principal surface a plurality of chip electrodes each electrically connected to the semiconductor integrated circuit are formed. Also, the method includes the step of (b) preparing a first card including: a wiring substrate on which a plurality of first wirings are formed; a first sheet in which tips of a plurality of contact terminals to be contacted with the plurality of chip electrodes are provided on the wiring substrate so as to face the principal surface side of the semiconductor wafer; and a pressing portion which presses a contact-terminal arrangement region from a rear surface of the first sheet, the contact-terminal arrangement region being where the plurality of contact terminals are formed in the first sheet. Further, the method includes the step of (c) performing electrical inspection for the semiconductor integrated circuit by contacting the tips of the plurality of contact terminals of the first sheet with the plurality of chip electrodes of the semiconductor wafer.

Still further, the first sheet includes: a contact-terminal formation surface on which the plurality of contact terminals are formed; and the rear surface positioned on an opposite side to the contact-terminal formation surface. Still further, the first sheet includes: a first insulating film having the contact-terminal formation surface; a plurality of second wirings formed between the first insulating film and the rear surface and electrically connected to the plurality of first wirings and the plurality of contact terminals; and a second insulating film having the rear surface and formed on the first insulating film and the plurality of second wirings. Still further, the plurality of contact terminals include a plurality of first contact terminals formed in a first contact terminal group arranged along a first direction in a planar view. Still further, among the plurality of second wirings, the plurality of second wirings connected to the plurality of first contact terminals are arranged so as to be extended along a direction intersecting with the first direction in a planar view. Still further, in a planar view, among the plurality of first contact terminals, on an opposite side to the first contact terminal group of the first contact terminals arranged at an end portion of the first contact terminal group, a third wiring formed on the first insulating film and along the second wiring and not electrically connected to the plurality of contact terminals is arranged. Still further, between the third wiring and the first contact terminal arranged at the end portion of the first contact terminal group, a slit formed of an opening portion penetrating from one surface among the contact-terminal formation surface and the rear surface in the first sheet to the other surface is formed along the second wiring.

Still further, the end portion is arranged in a corner region of the contact-terminal arrangement region.

The effects obtained by typical aspects of the present invention will be briefly described below.

That is, according to a mode of the invention of the present application, the variation in the contact pressure between the plurality of contact terminals and the plurality of chip electrodes can be decreased.

BRIEF DESCRIPTIONS OF THE DRAWINGS

Figure 1:
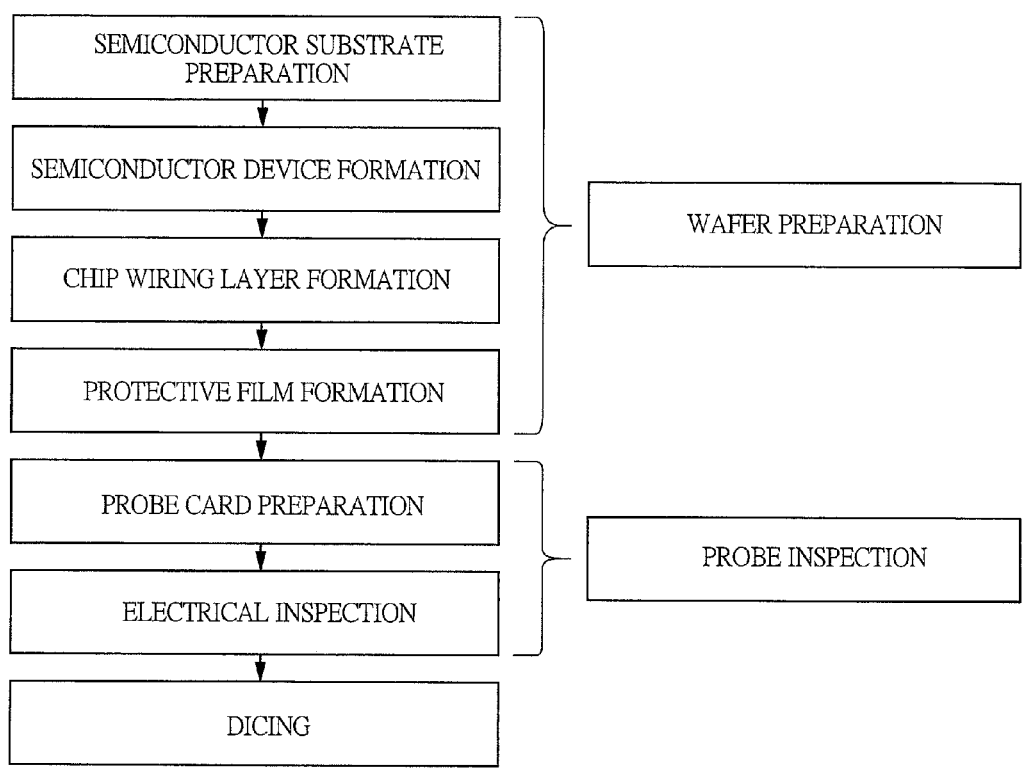
FIG. 1 is an explanatory diagram showing outline of a manufacturing flow of a semiconductor integrated circuit device according to an embodiment of the present invention.
Figure 25:
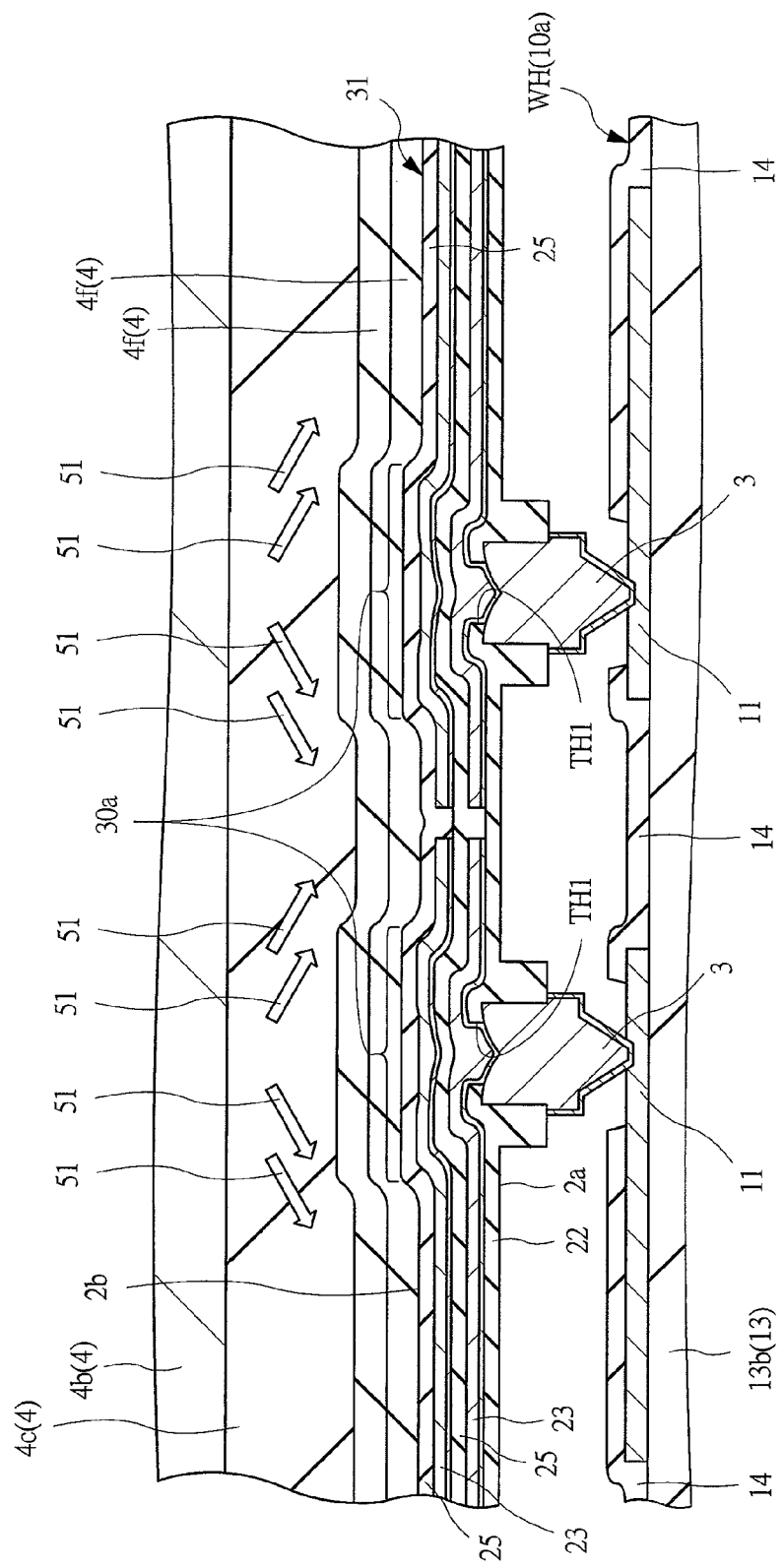
FIG. 25 is an enlarged cross-sectional view showing a state that contactors and pads of a wafer are contacted to each other by using a thin-film sheet shown in FIG. 23.
Figure 54:
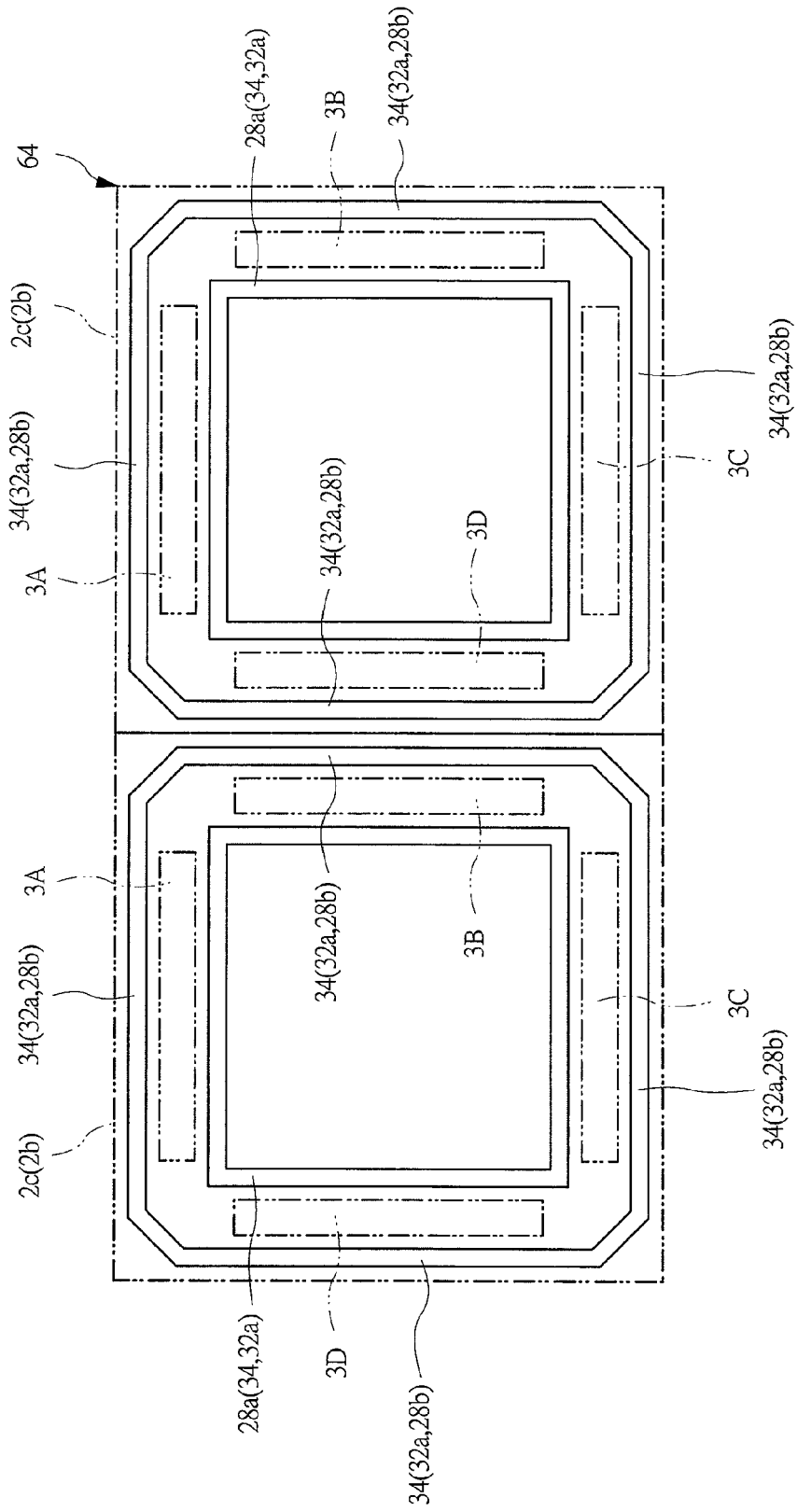
FIG. 54 is another enlarged plan view schematically showing the contactor arrangement region of the thin-film sheet used when the electrical inspection step shown in FIG. 1 is performed to the plurality of chip regions at one batch.
Figure 56:
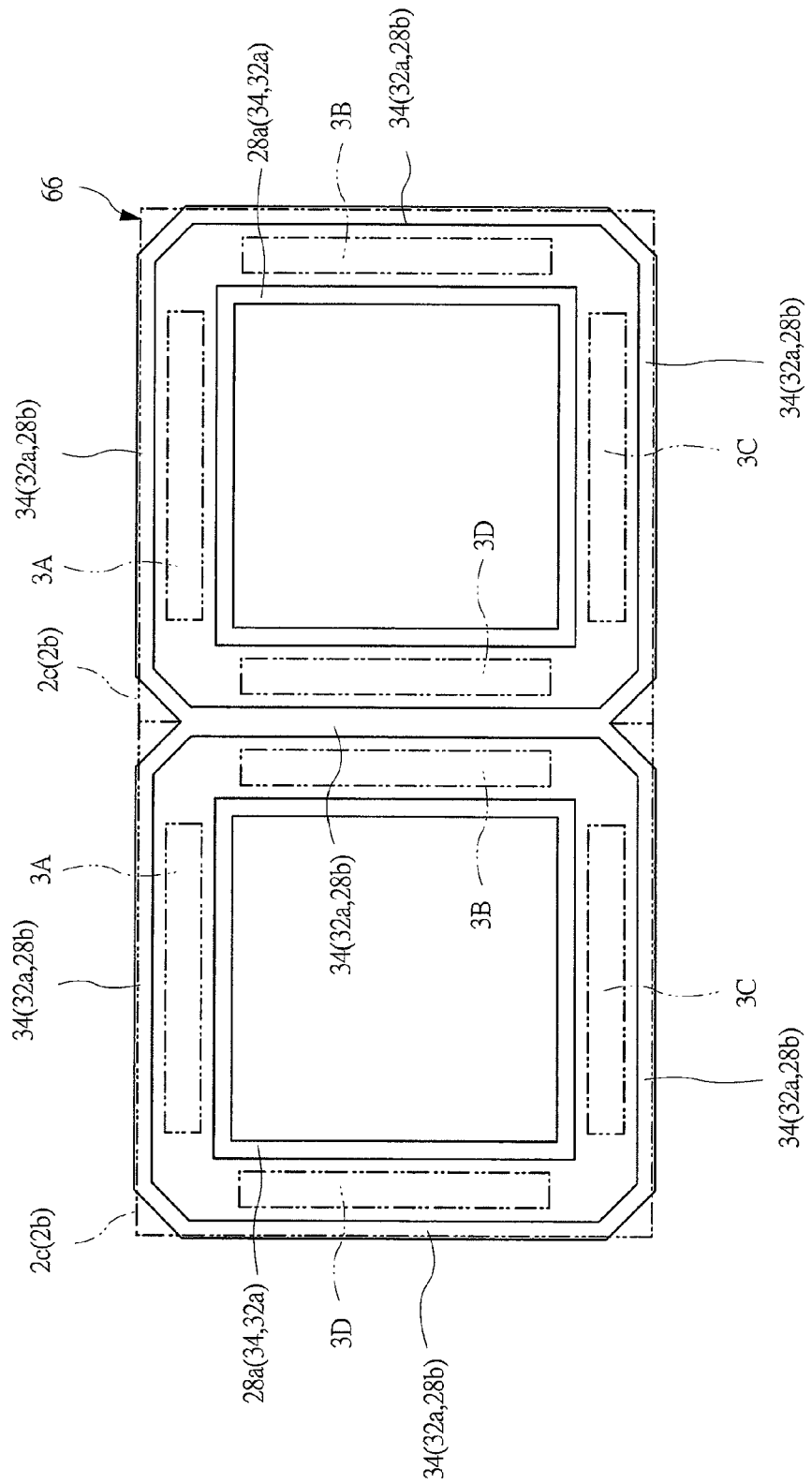
Figure 57:
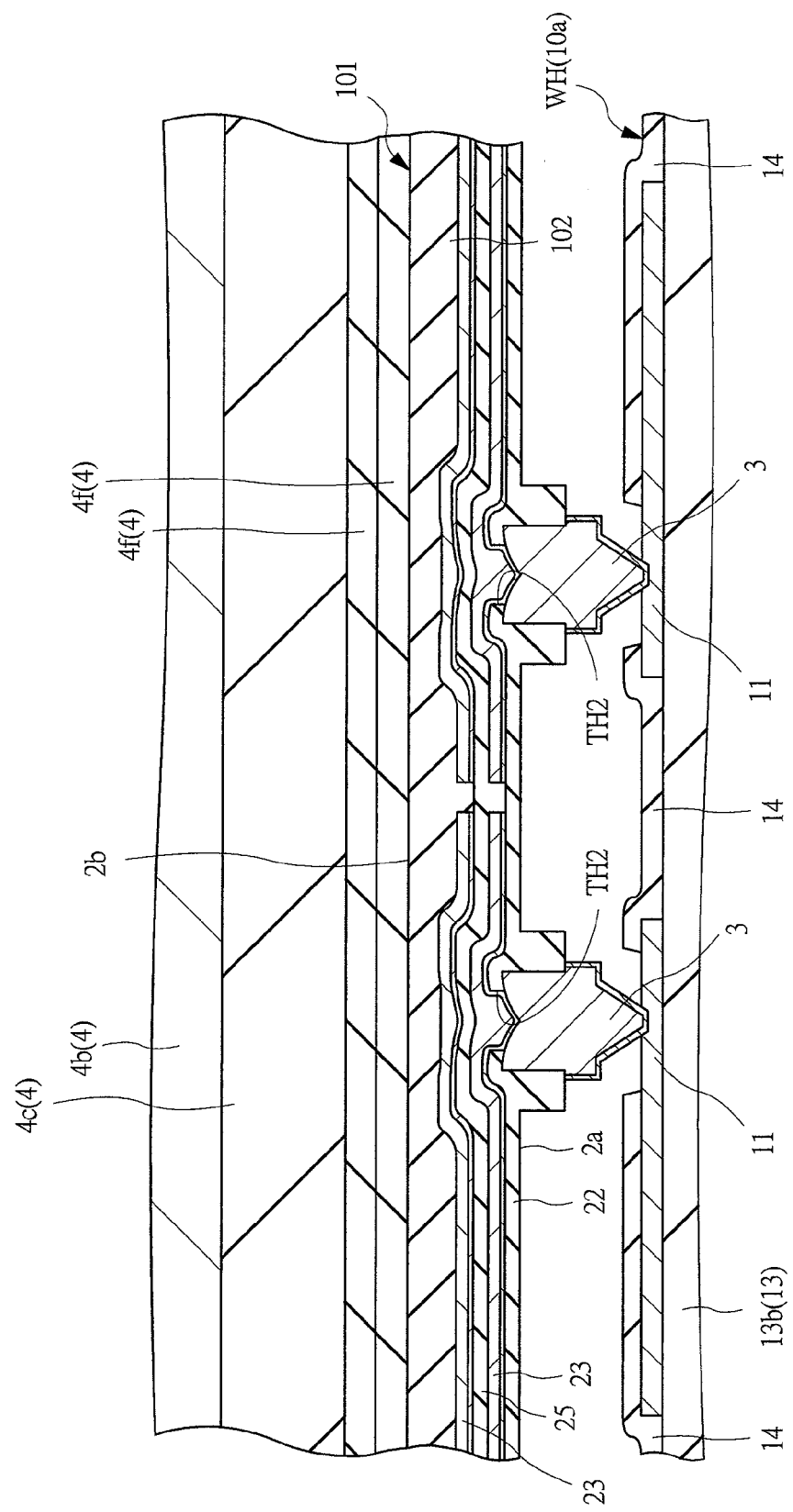

FIG. 56 is an enlarged plan view showing a modification example of FIG. 54 in the thin-film sheet used when the electrical inspection step shown in FIG. 1 is performed to the plurality of chip regions at one batch; and FIG. 57 is an enlarged cross-sectional view showing a state that contactors and pads of a wafer are contacted to each other by using a thin-film sheet which is another mode of FIG. 25.

DESCRIPTIONS OF THE PREFERRED EMBODIMENTS

Explanation of Description Format, Basic Term, and Usage in the Present Application In the present application, the modes are described separately in a plurality of sections, etc. in accordance with needs for the sake of convenience. However, unless otherwise particularly stated, the sections, etc. are not independent or separated from each other; and, regardless of the order of descriptions, for example, they are a part of a single example, or one of them is a partial detail of the others or a partial or entire modification example. Also, in principle, repeated explanation of similar parts will be omitted. Further, each constituent element in the modes is not essential unless otherwise particularly stated or except for the case in which the number thereof is theoretically limited to the described number and the case in which the constituent elements are obviously essential according to the context.

Similarly, in the description of the modes, even when "X formed of A" is described for materials, compositions, or the like, it goes without saying that other components than A are not eliminated unless otherwise particularly stated or the case in which the constituent elements are obviously essential according to the context. For example, when a component is described, it means "X containing A as a principal component" or others. For example, when "silicon member" or others is described, it goes without saying that the silicon member is not limited to pure silicon, and also includes SiGe (silicon germanium) alloy, a complex alloy containing other silicon as a main component, or a member containing other additives or others. Also, when gold plating, a Cu layer, nickel plating, and others are described, they are not only the pure ones but also include a member containing gold, Cu, nickel, and others, as a main component, respectively, unless otherwise stated or except for the case in which they are particularly specified.

Further, when specific numerical values or numerical volumes are described, they may be numerical values larger than the specific numerical values or less than the specific numerical values unless otherwise particularly specified or except for the case in which the number thereof is theoretically limited to the described number and the case in which the numerical values are obviously not the values according to the context.

Also, the same or similar components are denoted by the same or similar symbols or reference numbers throughout each drawing of the embodiments, and the description thereof is not repeated in principle.

Further, in the accompanying drawings, hatching, etc. are omitted in some cases even in a cross-sectional surface in the case in which the drawings are adversely complicated or the case in which the distinction from voids is clear. Regarding this, if it is clear from explanation etc., the outline of the background is omitted even at a planar-closed hole in some cases. Further, a hatching or a dot pattern may be added to a part which is even not a cross-sectional surface in order to clearly show that the part is not a void or to clearly show the boundary of regions.

Still further, before explaining the invention of the present application in detail, the meaning of terms in the present application will be explained as follows.

The probe inspection is an electrical test performed for a wafer which has been subjected to wafer steps (various treatment steps for the wafer obtained before dividing) by using a prober (semiconductor integrated circuit inspection apparatus), and this means to perform the electrical inspection for a semiconductor integrated circuit by applying a tip of a contact terminal onto an electrode formed on a principal surface of a chip region. In the probe inspection, proper/improper products are judged by performing a function test for checking whether the product is operated as following a predetermined function or not and tests for DC operation characteristic and AC operation characteristic. The probe inspection is distinguished from a selecting test (final test) which is performed after dividing the wafer into chips (or after packaging is completed).

The probe card is a structure body including a wiring substrate, the contact terminal contacted with the wafer which is an inspection target, and others. The prober or the semiconductor integrated circuit inspection apparatus is an inspection apparatus including a sample supporting system including an interface ring, the probe card, and a wafer stage on which the wafer of the inspection target is placed.

A tester (Test System) is for electrically inspecting the semiconductor integrated circuit, and generates a predetermined voltage and a signal indicating timing or others which is a reference.

A tester head is electrically connected to the tester, receives the voltage and the signal transmitted from the tester, generates a voltage and a signal indicating detailed timing for the semiconductor integrated circuit, and transmits the signal to the probe card via a Pogo pin or others.

The interface ring is electrically connected to the tester head and the probe card via an electrically-conducting path such as Pogo pin, and transmits a signal transmitted from the tester head to a probe card described later.

The Pogo pin (POGO pin) or a spring probe is a contact needle having a structure that the contact pin (plunger (contact needle)) is pressed onto an electrode (terminal) by elastic force of a spring (coil spring) and being electrically connected to the electrode as needed, and this is configured such that the spring arranged inside a metal tube (retaining member) transmits the elastic force to the contact pin via a metal ball.

A thin-film probe (membrane probe), a thin-film probe sheet, or a thin-film sheet is a thin film on which the contact terminal (protruding terminal) contacted to the inspection target as described above and a wiring drawn from the contact terminal are provided and in which an electrode for external contact is formed on the wiring. The thin-film sheet has a thickness of, for example, about 10 µm to 100 µm, and is obtained by integrally forming a wiring layer and a tip portion (contact terminal) electrically connected the wiring layer by a wafer process similarly performed for using a silicon wafer for manufacturing a semiconductor integrated circuit, that is, a patterning method in combination of a photolithography technique, a CVD (Chemical Vapor Deposition) technique, a sputtering technique, an etching technique, and others. Obviously, these processes are complicated. However, a part of the thin film can be separately formed and combined later.

The contact terminal, the protruding terminal, the contactor, or the probe is an electrically-conducting protruding body which is contacted onto the electrode (chip electrode) provided on each chip region for inspecting electrical characteristics.

First Embodiment

Method of Manufacturing Semiconductor Integrated Circuit Device

Figure 2:
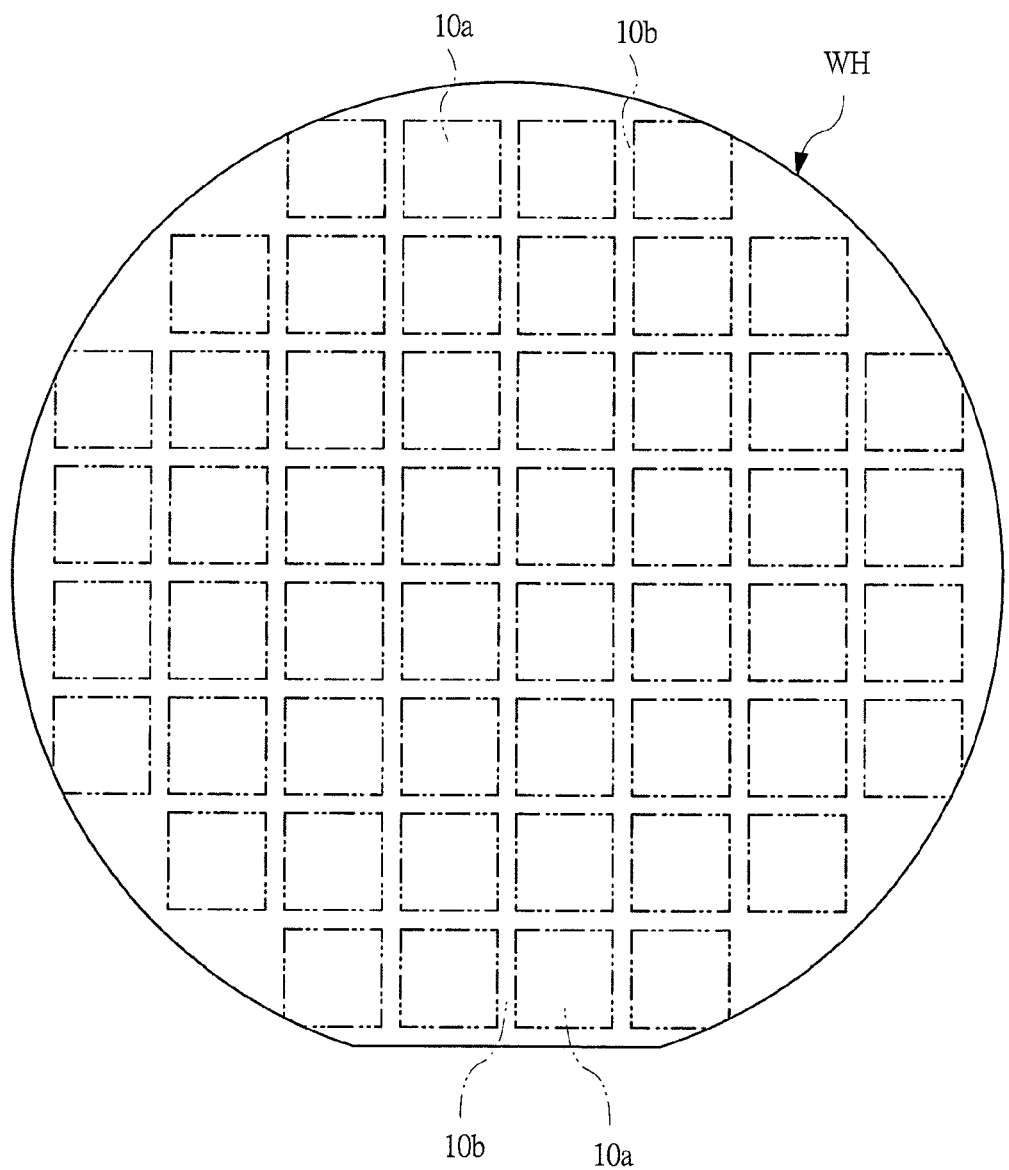
FIG. 2 is a plan view showing a principal surface side of a wafer prepared at a wafer preparation step shown in FIG. 1.
Figure 3:
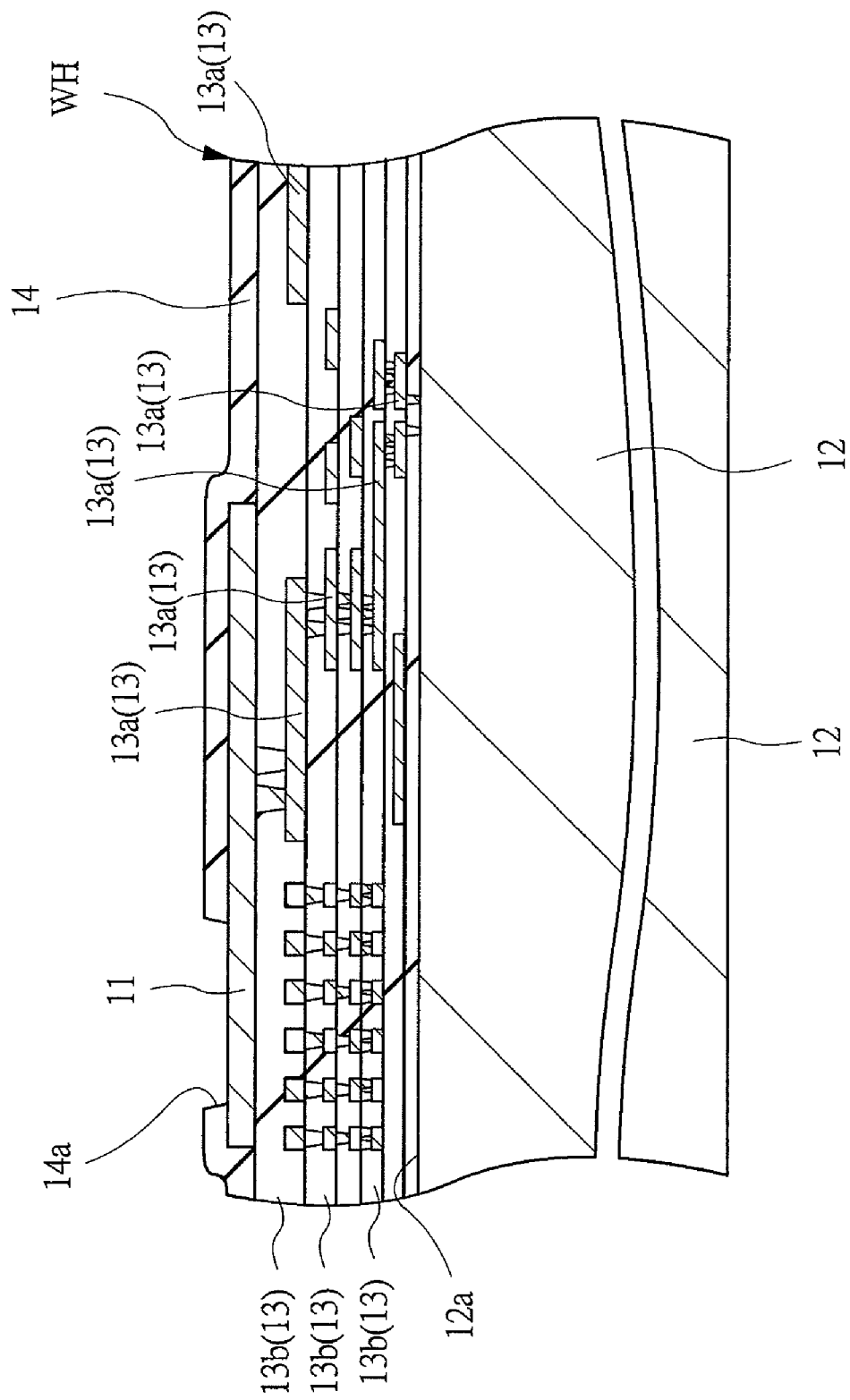
FIG. 3 is an enlarged cross-sectional view of a part of the wafer shown in FIG. 2.
Figure 4:
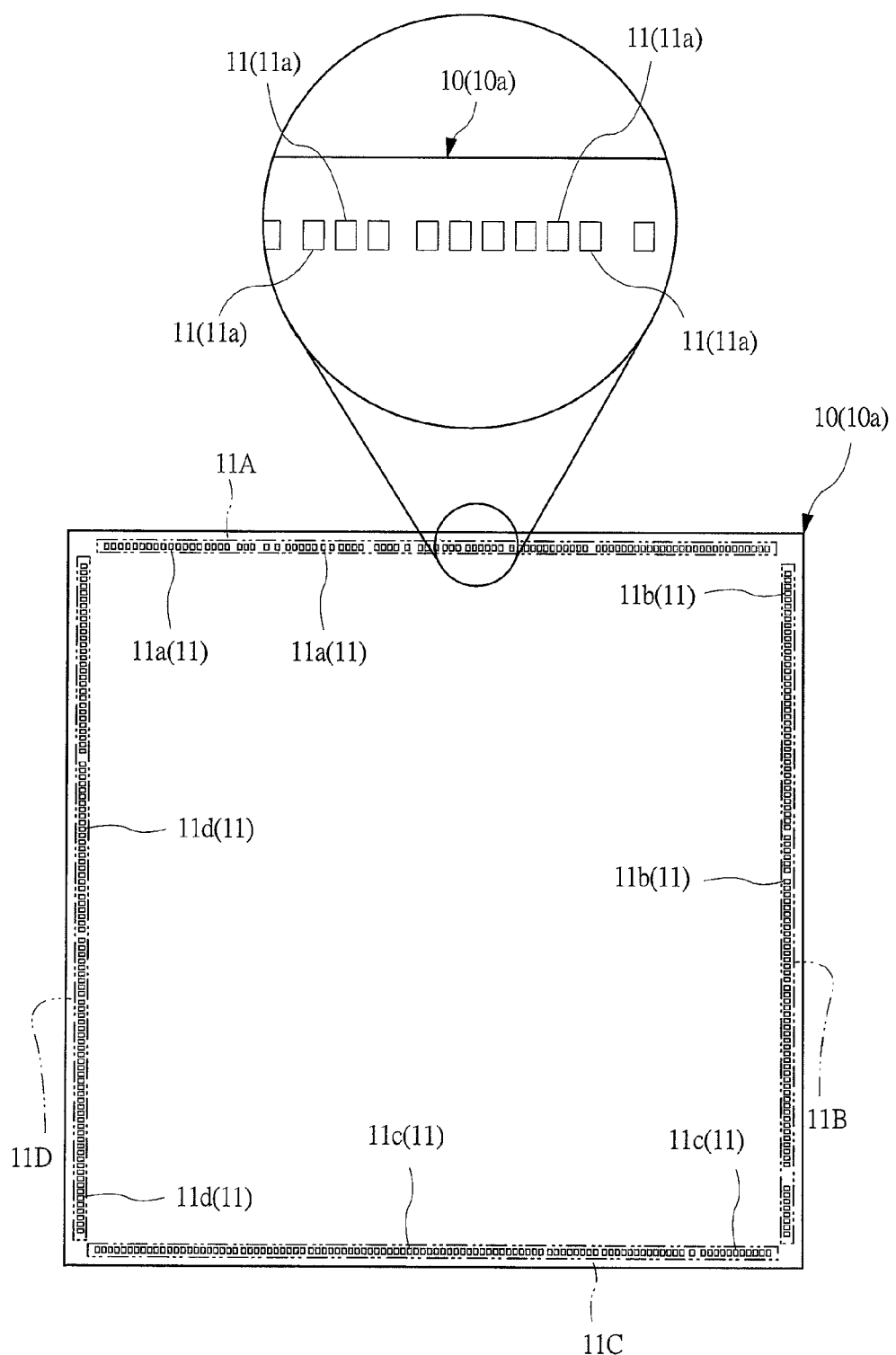
FIG. 4 is a plan view showing a principal surface side of one of a plurality of semiconductor chips obtained at a dicing step shown in FIG. 1.

First, with reference to FIGS. 1 to 4, an overall flow of a method of manufacturing a semiconductor integrated circuit device according to the present embodiment is described. FIG. 1 is an explanatory diagram showing an outline of a manufacturing flow of the semiconductor integrated circuit device according to the present embodiment. And, FIG. 2 is a plan view showing a principal surface side of a wafer prepared at a wafer preparation step shown in FIG. 1, FIG. 3 is an enlarged cross-sectional view of a part of the wafer shown in FIG. 2, and FIG. 4 is a plan view showing a principal surface side of one of a plurality of semiconductor chips obtained at a dicing step shown in FIG. 1.

First, at the wafer preparation step shown in FIG. 1, as shown in FIG. 2, for example, a wafer (semiconductor wafer) WH partitioned into a plurality of chip regions 10a shaped in quadrangle in a plan view is prepared. A semiconductor integrated circuit is formed in each of the plurality of chip regions 10a of the wafer WH, and a plurality of pads (electrodes, chip electrodes, and electrode pads) 11 (see FIG. 4) each electrically connected to the semiconductor integrated circuit are formed on a principal surface.

When an example of a method of forming the wafer WH shown in FIG. 2 is simply explained with reference to FIG. 3, the wafer is formed, for example, as follows. First, at a semiconductor substrate preparation step (see FIG. 1), a semiconductor substrate 12 having a principal surface (device formation surface) 12a is prepared. Then, at a semiconductor element formation step (see FIG. 1), on the principal surface 12a of the semiconductor substrate 12, a plurality of semiconductor elements such as transistors and diodes (whose illustrations are omitted) are formed. Then, at a chip wiring layer formation step (see FIG. 1), on the principal surface 12a of the semiconductor substrate 12, a wiring layer 13 is stacked. FIG. 3 shows the example in which the plurality of wiring layers 13 are stacked on the principal surface 12a. At the chip wiring layer formation step, on the most top layer, a plurality of pads 11 are formed, and each pad 11 is electrically connected to the plurality of semiconductor elements on the principal surface 12a via a plurality of wirings 13a provided in the wiring layers 13. The plurality of wirings 13a are insulated by insulating films 13b provided in the wiring layers 13. By these steps, on the principal surface 12a side of the wafer WH, a plurality of semiconductor integrated circuits are formed. Then, at a protective film formation step (see FIG. 1), a protective film (passivation film or insulating film) 14 is formed so as to cover the wiring layer and the pad 11. Then, an opening portion 14a is formed in a part of the protective film 14 to expose the pad 11 from the protective film 14 at the opening portion 14a. By the above-described steps, a plurality of semiconductor chips 10 are formed on the wafer WH, and the wafer WH shown in FIG. 2 is obtained. Note that the protective film (passivation film or insulating film) 14 is formed of, for example, a silicon nitride film, a silicon oxide film, or a stacked film of a silicon nitride film and a silicon oxide film. As shown in FIG. 4, the present embodiment has a pad group (chip electrode group) in which the plurality of pads 11 are arranged along each side of the semiconductor chip 10 (chip region 10a) which is shaped in quadrangle in the plan view. In other words, a pad group (chip electrode group) 11A in which a plurality of pads 11a are formed is arranged along a first side of the four sides forming an outer edge of the semiconductor chip 10 (chip region 10a shown in FIG. 2).

Also, along a second side, a pad group (chip electrode group) 11B in which a plurality of pads 11b are formed is arranged. Further, along a third side, a pad group (chip electrode group) 11C in which a plurality of pads 11c are formed is arranged. Still further, along a fourth side, a pad group (chip electrode group) 11D in which a plurality of pads 11d are formed is arranged.

Next, at a probe inspection step shown in FIG. 1, electrical inspection for the wafer WH shown in FIG. 2 is performed. The probe inspection step includes a probe card preparation step and an electrical inspection step as shown in FIG. 1. Note that, in FIG. 1, the wafer preparation step and the probe inspection step are separately shown for the convenience of explanation. However, it can be also considered that the wafer preparation step is included in the probe inspection step. The details of the probe inspection step will be described later.

Next, at a dicing step shown in FIG. 1, the wafer WH shown in FIG. 2 is divided into the chip regions 10a to obtain a plurality of semiconductor chips (semiconductor integrated circuit devices) 10 shown in FIG. 4. At the present step, for example, the wafer WH is cut along a scribe regions 10b arranged between the plurality of chip regions 10a shown in FIG. 2, and is diced in each of the chip regions 10a. By the above-described steps, the semiconductor chip 10 which is the semiconductor integrated circuit device according to the present embodiment is obtained. Note that, in the above description, outlines of main steps of manufacturing a semiconductor chip are explained, and various modification examples can be applied.

<Semiconductor Integrated Circuit Inspection Apparatus>

Figure 5:
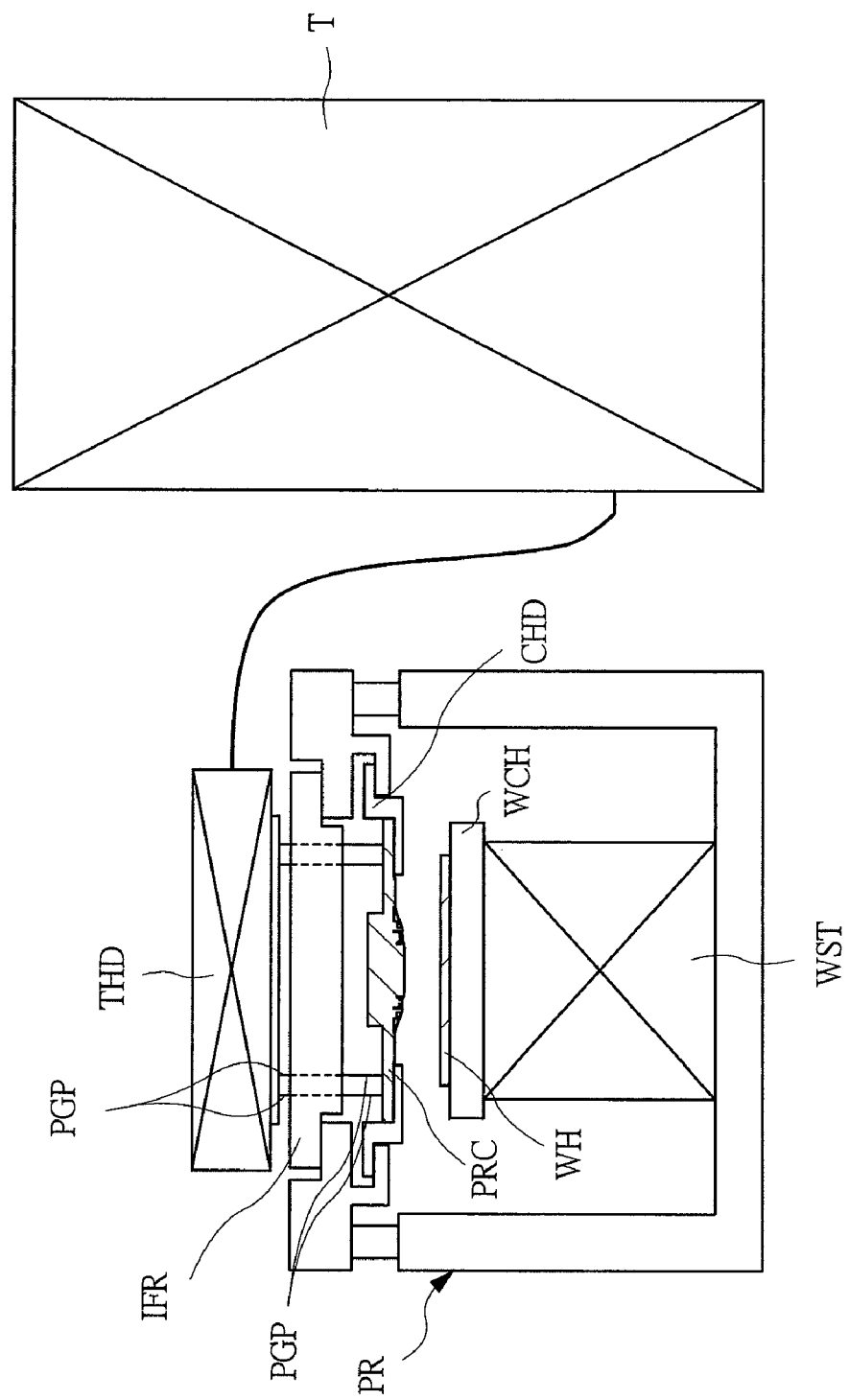
FIG. 5 is an explanatory diagram schematically showing a schematic configuration of a semiconductor integrated circuit inspection apparatus used at a probe inspection step shown in FIG. 1.
Figure 6:
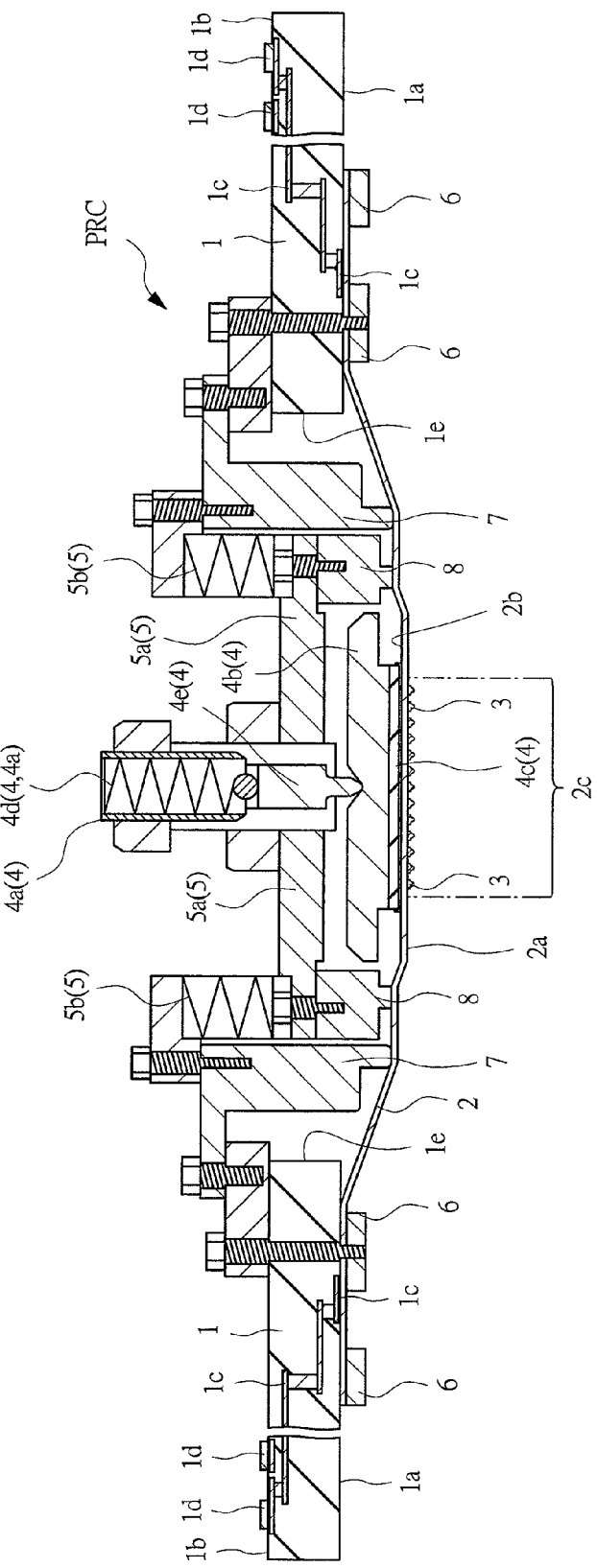
FIG. 6 is a cross-sectional view showing an entire structure of a probe card shown in FIG. 5.
Figure 7:
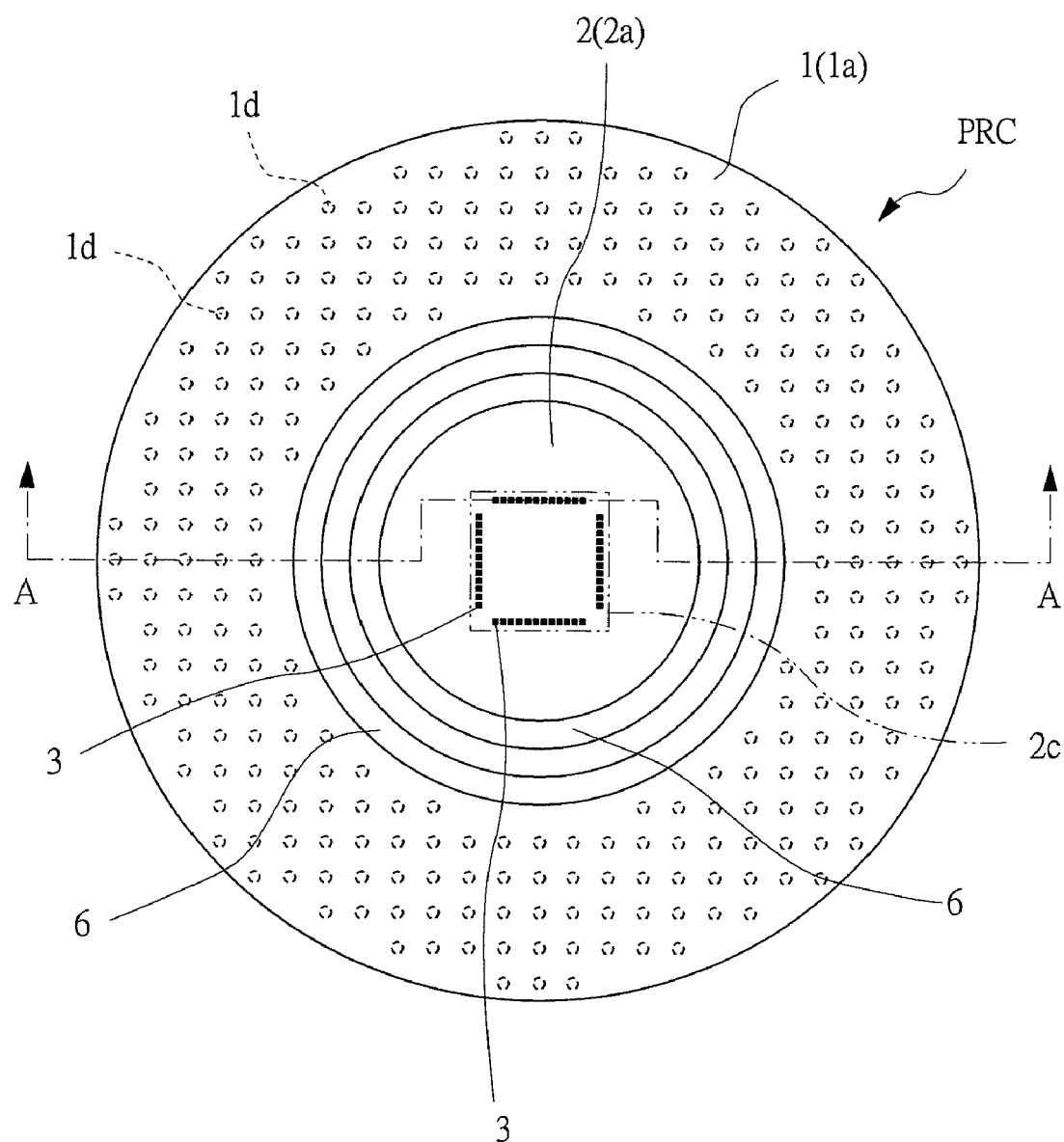
FIG. 7 is a plan view showing a wafer-facing surface side of the probe card shown in FIG. 5.

Next, an outline of the semiconductor integrated circuit inspection apparatus (semiconductor inspection apparatus) used at the probe inspection step shown in FIG. 1 is explained. FIG. 5 is an explanatory diagram schematically showing an outline configuration of the semiconductor integrated circuit inspection apparatus used at the probe inspection step shown in FIG. 1, FIG. 6 is a cross-sectional view showing an entire structure of the probe card shown in FIG. 5, and FIG. 7 is a plan view showing a facing surface (principal surface) side of the probe card to the wafer shown in FIG. 5. Note that FIG. 6 is a cross-sectional view taken along line A-A of FIG. 7.

As shown in FIG. 5, a prober (semiconductor integrated circuit inspection apparatus or semiconductor inspection apparatus) PR according to the first embodiment includes: a probe card PRC; a tester head THD; an interface ring IFR; a card holder CHD; a wafer stage WST; a wafer chuck (wafer retainer) WCH; and others. The tester head THD and the interface ring IFR are electrically connected to each other and the interface ring IFR and the probe card PRC are electrically connected to each other via the plurality of Pogo pins PGP, so that the tester head THD and the probe card PRC are electrically connected to each other. Also, the tester head THD is electrically connected to a tester T, so that voltages and signal currents required for the probe inspection are supplied thereto from the tester T.

The card holder CHD mechanically connects the probe card PRC to the prober PR, and has a mechanical strength which prevents the warpage of the probe card PRC due to a pressure of the Pogo pins PGP. Also, the wafer stage WST is arranged inside a chassis of the prober PR, and the wafer chuck WCH is arranged and fixed onto the wafer stage WST. The wafer WH which is the inspection target is fixed to the wafer chuck WCH in a state that the principal surface 12a (see FIG. 3) side on which the plurality of pads 11 (see FIG. 4) are formed faces the probe card PRC.

Next, a structure of the probe card PRC shown in FIG. 5 is explained. As shown in FIG. 6, the probe card PRC includes a wiring substrate 1 on which a plurality of wirings 1c are formed. Also, the probe card PRC includes a thin-film sheet 2 retained on the wiring substrate 1. The thin-film sheet 2 includes: a principal surface (contact-terminal formation surface) 2a on which a plurality of contactors (contact terminals) 3 are formed; and a rear surface 2b positioned on an opposite side to the principal surface 2a, and is retained on the wiring substrate 1 so that the principal surface 2a faces the principal surface side of the wafer WH (see FIG. 5). Further, the probe card PRC includes a pressing portion 4 which presses, from the rear surface 2b, a region of the thin-film sheet 2 where the plurality of contactors 3 are formed (a contactor-arranged region 2c shown in FIG. 7). Still further, the probe card PRC includes a pressurizing portion 5 which collectively applies load to the pressing portion 4 and the thin-film sheet 2 via a joint jig 5a. Note that the details of the pressing portion 4 and the pressurizing portion 5 will be described later.

The wiring substrate 1 includes a lower surface (sheet retaining surface) 1a and an upper surface (rear surface) 1b positioned on an opposite side to the lower surface 1a, and is a plate material shaped in circle in a plan view (see FIG. 7 for the planar shape). The wiring substrate 1 according to the present embodiment is so-called multilayered wiring substrate in which a plurality of wiring layers are stacked between the lower surface 1a and the upper surface 1b. A plurality of wirings 1c are formed in each of the wiring layers, and the lower surface 1a side and the upper surface 1b side are electrically connected to each other. On the lower surface 1a of the wiring substrate 1, a plurality of respective receiving portions (whose illustrations are omitted) electrically connected to the plurality of wirings 1c are formed. And, the plurality of receiving portions are electrically connected through the plurality of wirings 1c to a plurality of Pogo (POGO) seats 1d provided on the upper surface 1b of the wiring substrate 1. The Pogo seats 1d are terminals which receive the Pogo pins PGP (see FIG. 5) for inputting or outputting signals between the tester head THD (see FIG. 5) and the probe card. That is, the Pogo seats 1d are external terminals of the wiring substrate 1 (probe card PRC). Therefore, as shown in FIG. 7, a lot of Pogo seats 1d are arranged on the upper surface side of the wiring substrate 1. Also, the lower surface 1a of the wiring substrate 1 is connected and fixed to the card holder CHD (see FIG. 5).

The thin-film sheet 2 includes the principal surface 2a and the rear surface 2b as described above, and is shaped in circle whose diameter is smaller than that of the wiring substrate 1 in a plan view. Although described in detail later, the thin-film sheet 2 is a thin film having a base material containing, for example, a polyimide resin as a main component, and has flexibility. Also, the thin-film sheet 2 is fixed and retained on the wiring substrate 1 by connecting jigs 6 in a state that the rear surface 2b faces the lower surface 1a of the wiring substrate 1. As shown in FIG. 7, by the plurality of connecting jigs 6 shaped in ring, a peripheral portion of the thin-film sheet 2 and an inner region than the peripheral portion are fixed to the wiring substrate 1.

Further, an opening portion 1e is formed in a center of the wiring substrate 1. Inside the opening portion 1e, a protruding ring 7 fixed on the upper surface 1b of the wiring substrate 1 and extending lower than the lower surface 1a of the wiring substrate 1 inside the opening portion 1e is arranged. A region of the thin-film sheet 2 where the plurality of contactors 3 are formed is protruded downward to the wiring substrate 1 by the protruding ring 7, and is arranged lower than a lower surface of the card holder CHD (see FIG. 5). Further, an adhesive ring 8 is arranged inside the protruding ring 7. The adhesive ring 8 adheres on the rear surface 2b side of the thin-film sheet 2 via an adhesive agent (for example, epoxy-based adhesive agent), and is jointed and fixed to the pressurizing portion 5 via a connecting jig such as a bolt. In this manner, when a weight is applied by the pressurizing portion 5 or when the thin-film sheet 2 is pressed by the pressing portion 4, it is prevented that the thin-film sheet 2 is loosed.

Also, the pressing portion 4 includes: a plunger 4a; a pushing piece 4b which is a pressing tool; and an elastomer (buffer layer) 4c arranged on a lower surface (pressing surface) side of the pushing piece 4b. In the pressing portion 4, the thin-film sheet 2 of the region where the contactors 3 are formed is pressed from the rear surface (upper surface) 2b by the plunger 4a via the pushing piece 4b and the elastomer 4c to push out the pushing piece 4b, so that the thin-film sheet 2 is stretched to adjust a tip position of each of the contactors 3 to a position facing each corresponding pad 11 (see FIG. 4). The plunger 4a is fixed to the chassis of the probe card PRC. Further, since the wiring substrate 1 is also fixed to the chassis of the probe card PRC, the plunger 4a is fixed to the wiring substrate 1 via the chassis. A spring 4d is embedded inside the plunger 4a. By elastic force of the spring 4d, a certain pressing force is transmitted to the pushing piece 4b, the elastomer 4c, and the thin-film sheet 2 via a pushing pin 4e. In the first embodiment, as a material of the pushing piece 4b, 42 Alloy can be exemplified. Still further, as the elastomer 4c, a silicon sheet can be exemplified.

Still further, the pressurizing portion 5 includes: the joint jig 5a which joints the pressing portion 4 and the pressurizing portion 5; and a plurality of (two in FIG. 6) springs 5b fixed to the joint jig 5a. Although illustrations are omitted, the springs 5b are arranged at, for example, about eight to twelve locations on a planar surface of the wiring substrate 1. One end of each of the springs 5b is fixed to the wiring substrate 1, and the other end thereof is fixed to the joint jig 5a. The elastic force of the spring 5b functions to the joint jig 5a when the contactor 3 is contacted to the pad 11 (see FIG. 4) in the probe inspection and the probe card PRC is pushed toward the pad 11. At this point, the pressurizing portion 5 is fixed to the pressing portion 4 and the adhesive ring 8, and the joint jig 5a, the pushing piece 4b, the elastomer 4c, the adhesive ring 8, and the plunger 4a are integrated (forms a pressurizing mechanism). Therefore, the elastic force of the spring 5b functions so as to push down these integrated members toward the pad 11. Therefore, the pressing force transmitted from the spring 4d inside the plunger 4a to the thin-film sheet 2 is mainly used for stretching the thin-film sheet 2.

At the probe inspection step (see FIG. 1), after the thin-film sheet 2 is retained on the wiring substrate 1, the contactor arrangement region (contact-terminal arrangement region) 2c of the thin-film sheet 2 where the plurality of contactors 3 are formed is pressed by the pressing portion 4 via the elastomer (buffer layer) 4c from the rear surface 2b side. In this manner, the thin-film sheet 2 is stretched, and the plurality of contactors 3 arranged on the principal surface 2a are aligned to predetermined positions (at the electrical inspection step, the positions facing the plurality of pads 11 (see FIG. 4)) (sheet stretching step). The sheet stretching step is performed before the plurality of contactors 3 and the plurality of pads 11 (see FIG. 4) are contacted to each other at the electrical inspection step (see FIG. 1). For example, the sheet stretching step is included in the probe card preparation step shown in FIG. 1. And, at the electrical inspection step (see FIG. 1), by contacting the plurality of contactors 3 to the plurality of pads 11 (see FIG. 4), the elastic force of the springs 5b of the pressurizing portion 5 is transmitted to the plurality of contactors 3 of the thin-film sheet 2 via the pressing portion 4 (pressurizing step).

Incidentally, the thin-film sheet 2 described in detail below can be also applied to a modification example of the probe card PRC according to the present embodiment shown in FIG. 6. For example, the thin-film sheet can be applied to a modification example in which the plunger 4a of the pressing portion 4 is fixed to the wiring substrate 1 without arranging the pressurizing portion 5 shown in FIG. 6. In this case, the load applied to the pads 11 (see FIG. 4) is controlled by only the plunger 4a. However, the plunger 4a is used also for pushing the pushing piece 4b to protrude the thin-film sheet 2 so as to be lower than the lower surface 1a of the wiring substrate 1. Therefore, in the present embodiment, from a viewpoint of exactly protruding the thin-film sheet 2 so as to be lower than the lower surface 1a of the wiring substrate 1 and contacting the contactors 3 to the pads 11 with low load, the probe card PRC including the pressing portion 4 and the pressurizing portion 5 is employed.

<Detailed Structure of Thin-Film Sheet>

Figure 8:
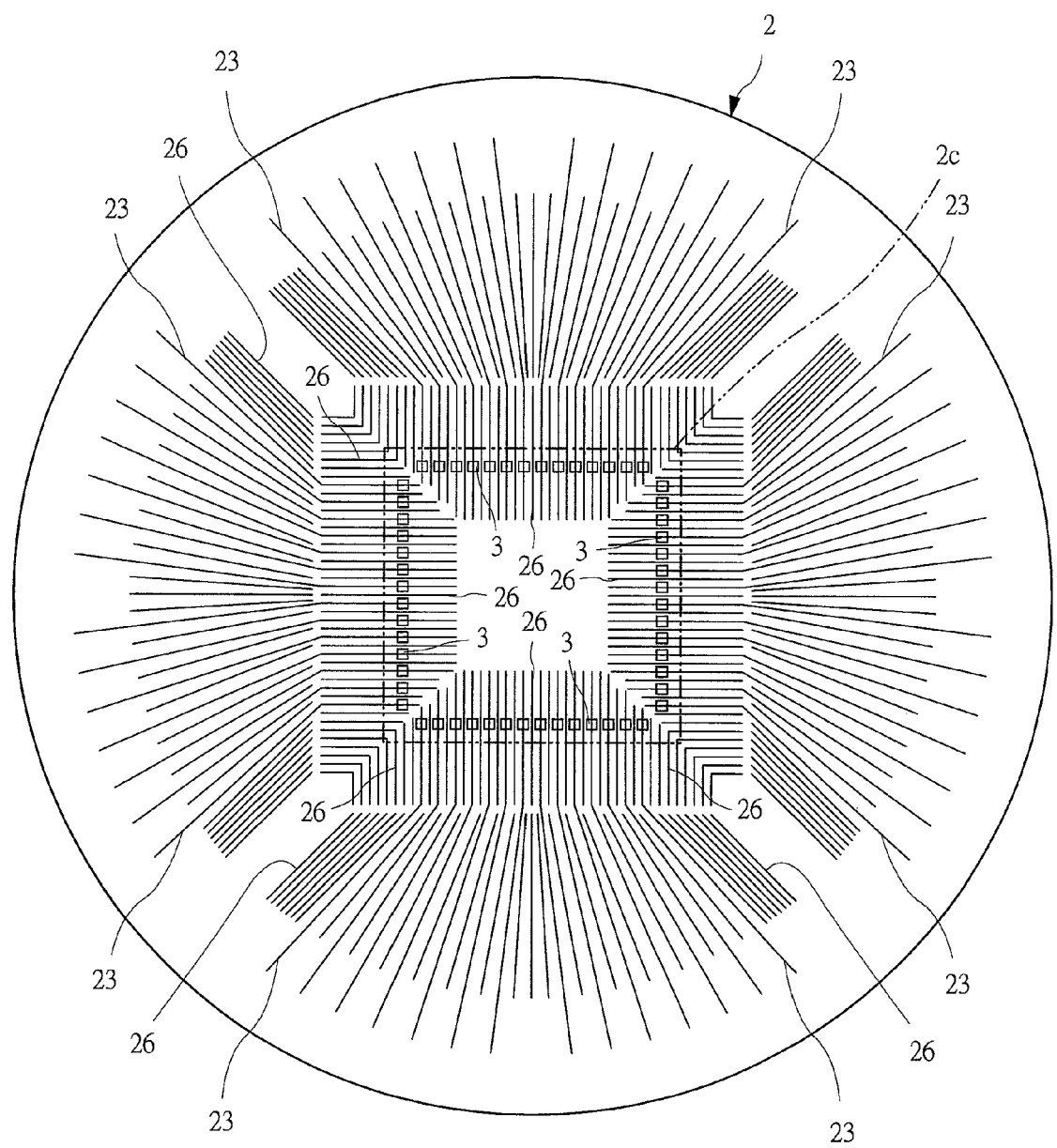
FIG. 8 is a plan view showing an outline of a wiring layout of a thin-film sheet shown in FIG. 7.
Figure 9:
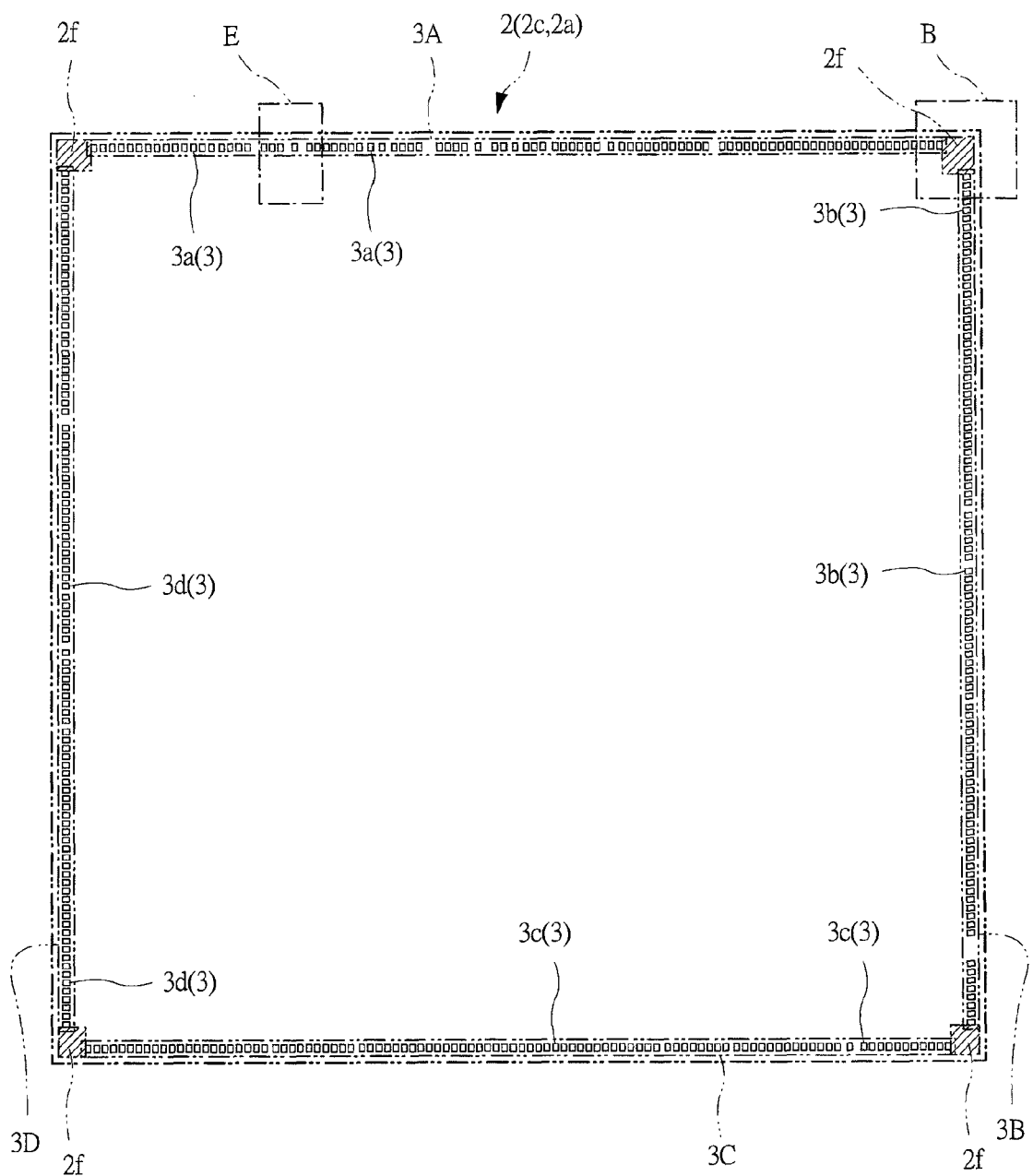
FIG. 9 is an enlarged plan view of a contactor arrangement region shown in FIG. 7.

Next, a detailed structure of the thin-film sheet 2 shown in FIGS. 6 and 7 is described. FIG. 8 is a plan view showing an outline of a wiring layout of the thin-film sheet shown in FIG. 7, and FIG. 9 is an enlarged plan view of the contactor arrangement region shown in FIG. 7. And, FIG. 10 is an enlarged plan view of a B portion of FIG. 9, FIG. 11 is an enlarged cross-sectional view taken along line C-C of FIG. 10, and FIG. 12 is an enlarged cross-sectional view taken along line D-D of FIG. 10.

As shown in FIG. 9, the plurality of contactors 3 are formed in the contactor arrangement region (contact-terminal arrangement region) 2c arranged on the principal surface 2a side of the thin-film sheet 2. In the present embodiment, the inspection is made for the wafer WH (see FIG. 2) on which the plurality of pads 11 are arranged along each side of the chip region 10a shaped in quadrangle in the plan view as shown in FIG. 4. Therefore, the contactor arrangement region 2c shown in FIGS. 8 and 9 is shaped in quadrangle in the plan view, and the plurality of contactors 3 are arranged along each side of the contactor arrangement region 2c. In other words, along a first side of four sides forming an outer edge of the contactor arrangement region 2c, a contactor group (contact-terminal group) 3A in which a plurality of contactors 3a are formed is arranged. Also, along a second side intersecting with the first side, a contactor group (contact-terminal group) 3B in which a plurality of contactors 3b are formed is arranged. Further, along a third side facing the first side, a contactor group (contact-terminal group) 3C in which a plurality of contactors 3c are formed is arranged. Still further, along a fourth side facing the second side, a contactor group (contact-terminal group) 3D in which a plurality of contactors 3d are formed is arranged.

Figure 10:
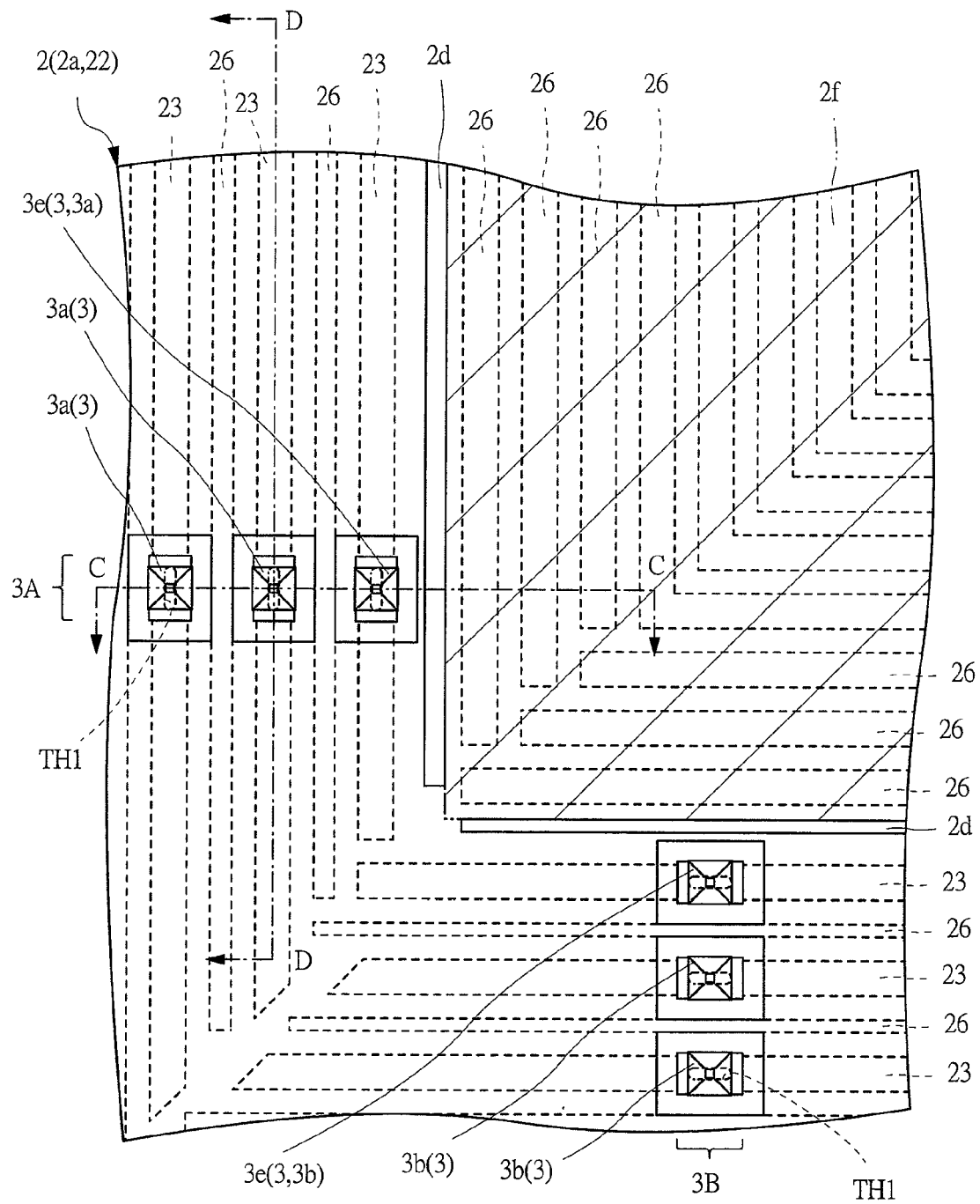
FIG. 10 is an enlarged plan view of a B portion of FIG. 9.
Figure 11:
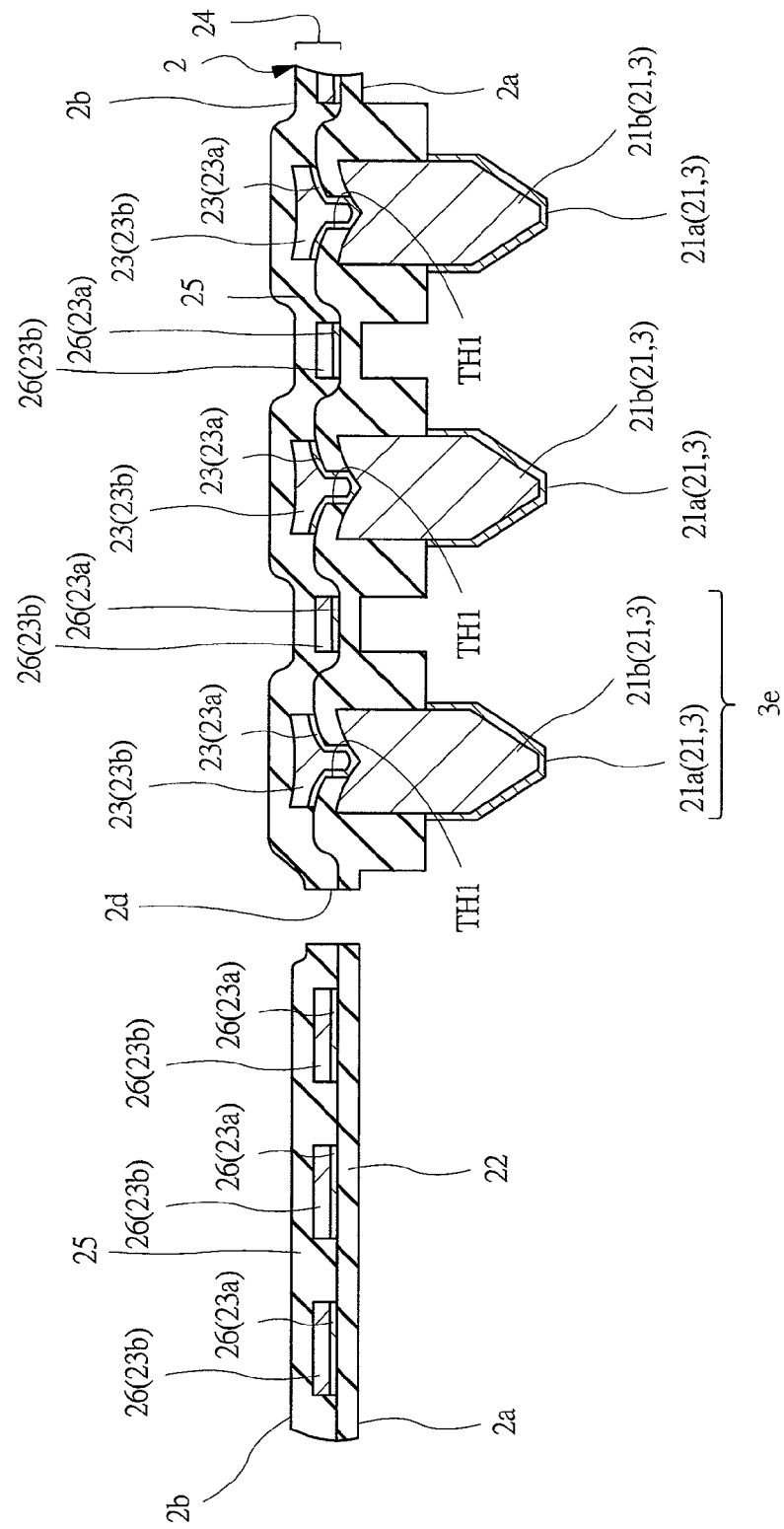
FIG. 11 is an enlarged cross-sectional view taken along line C-C of FIG. 10.
Figure 12:
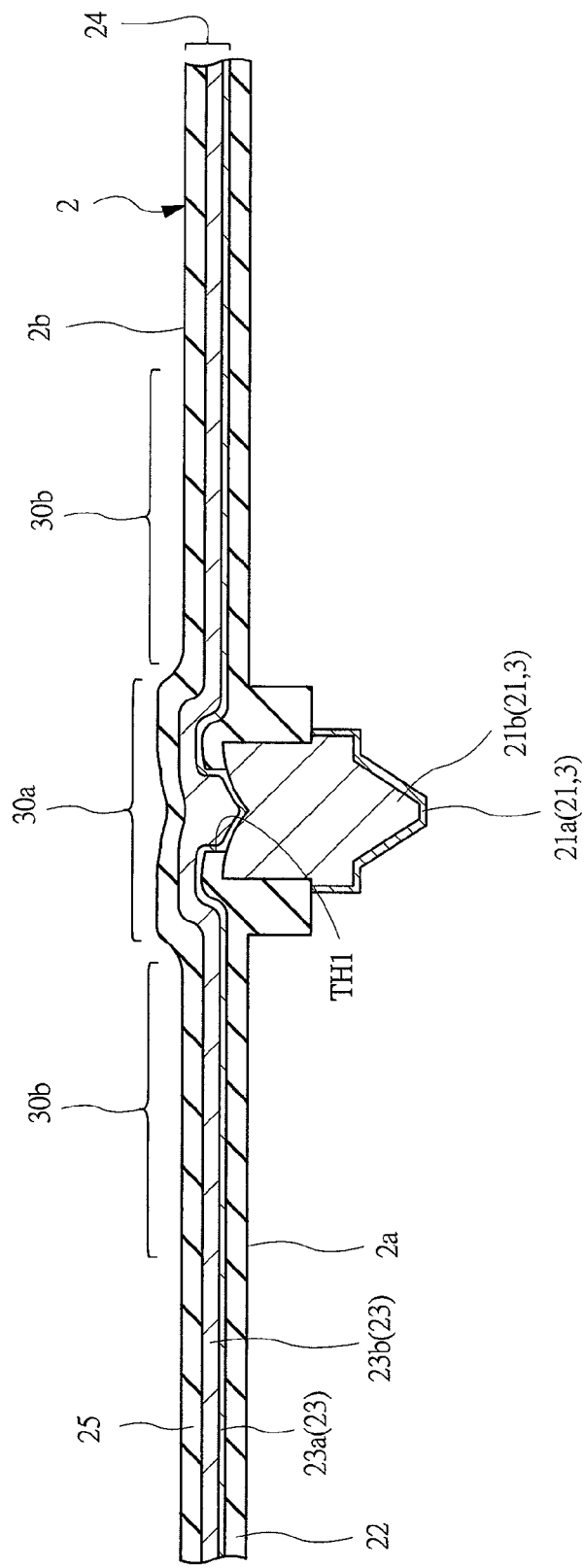
FIG. 12 is an enlarged cross-sectional view taken along line D-D of FIG. 10.

Still further, as shown in FIGS. 10 to 12, the thin-film sheet 2 includes a polyimide film (insulating film) 22 including the principal surface (contact-terminal formation surface) 2a. The plurality of contactors 3 are fixed to the principal surface 2a included in the polyimide film 22. Still further, as shown in FIG. 10, the plurality of contactors 3a are arranged along an extending direction (aligning direction and first direction) of the contactor group 3A. Each contactor 3 of the thin-film sheet 2 is formed so as to be arranged at a position facing the plurality of pads 11 shown in FIG. 4. Note that FIG. 10 exemplifies enlarged views of the contactor groups 3A and 3D of the contactor groups 3A, 3B, 3C, and 3D shown in FIG. 9. Hereinafter, a peripheral structure of each contactor 3 will be explained with taking the contactor 3a as an example. However, except for the case in which it is particularly described that the structure is different, the peripheral structures of the contactors 3b, 3c, and 3d are also similar to that.

As shown in FIG. 11 and FIG. 12, each of the plurality of contactors 3 is formed of a metal film 21. In the present embodiment, the metal film is, for example, a stacked film formed by sequentially stacking a rhodium film 21a and a nickel film 21b from a lower layer. The contactor 3 is the metal film 21 patterned in a planar quadrangle shape in the thin-film sheet 2, and is formed so as to be protruded lower than the principal surface 2a of the thin-film sheet 2. Various modification examples can be applied to the shape of the contactor 3. However, in the present embodiment, for example, as shown in FIGS. 10 and 12, a protruding portion shaped in truncated quadrangular pyramid is formed on a lower surface of a base portion shaped in rectangular cylinder. Also, a part of side surfaces of the base portion is covered by the polyimide film 22. In this manner, by forming the base portion on the protruding portion of the contactor 3, a height of the contactor 3 can be increased. Therefore, in performing the probe inspection, a distance from the principal surface 2a of the thin-film sheet 2 to a tip of the contactor 3 can be lengthened. For example, in the present embodiment, the distance from the principal surface 2a of the thin-film sheet 2 to the tip of the contactor 3 is about 50 µm. In this manner, in the probe inspection, it can be prevented or suppressed that the polyimide film 22 and the surface of the wafer WH (see FIG. 2) which are the inspected target are contacted to each other.

Also, the thin-film sheet 2 includes a plurality of wirings 23 formed between the polyimide film 22 and the rear surface 2b. Each of the plurality of wirings 23 is a stacked film formed by sequentially stacking a conductive film 23a and a conductive film 23b from a lower layer. The conductive film 23a is a base conductive film for forming the wiring 23, and can be formed by, for example, sequentially depositing a chromium film having a film thickness of about 0.1 µm and a copper film having a film thickness of about 1 µm by a sputtering method or a vapor deposition method. Also, the conductive film 23b is a main conductive film which reduces the parasitic inductance (for example, wiring resistance) of the wirings 23, and, for example, a copper film or a stacked film formed by sequentially depositing a copper film and a nickel film from a lower layer can be exemplified. The plurality of wirings 23 are covered by a polyimide film 25. In other words, in the thin-film sheet 2, a wiring layer 24 formed of the plurality of wirings 23 and the polyimide film 25 which is an insulating film covering the wirings is stacked on the polyimide film 22.

Further, the plurality of wirings 23 are drawn to connecting portions (for example, the above-described receiving portions) to the wiring substrate 1 shown in FIG. 6, and are electrically connected to the plurality of wirings 1c of the wiring substrate 1. The plurality of wirings 23 are radially drawn from the inside of the contactor arrangement region 2c shown in FIG. 6 toward the lower surface 1a of the wiring substrate 1, and are electrically connected to the plurality of wirings 1c on the lower surface 1a of the wiring substrate 1. For example, as schematically shown in FIG. 8, the wirings 23 connected to the contactors 3 inside the contactor arrangement region 2c are drawn (extended) from the inside of the contactor arrangement region 2c in a direction (second direction) orthogonal to the extending direction of the each contactor group. A distance of the wiring drawn in the orthogonal direction is about ⅓ to ½ distant from a center of the thin-film sheet 2 shaped in a substantial circular planar shape. Further, the wirings 23 are further radially drawn from a point at the distance toward the outer edge (peripheral portion) of the thin-film sheet 2. And, in a vicinity of the peripheral portion of the thin-film sheet 2, the plurality of wirings 23 are electrically connected to the plurality of receiving portions (whose illustrations are omitted) of the wiring substrate 1 shown in FIG. 6. Still further, end portions of the plurality of wirings 23 in the contactor arrangement region 2c are extended inner than the contactors 3. Note that FIGS. 11 and 12 exemplify that the single-layered wiring layer 24 is stacked on the polyimide film 22. However, the number of the wiring layer 24 is not limited to this. For example, on the wiring layer 24, another wiring layer is further stacked, so that a two or more layered structure can be also provided. In this case, a space for drawing the wirings can be increased. Therefore, even when the number of the contactors 3 arranged inside the contactor arrangement region 2c is increased, they can be electrically connected to each other.

Still further, the plurality of wirings 23 are electrically connected to the plurality of contactors 3, respectively. As shown in FIGS. 11 and 12, a through hole (opening portion) TH1 is formed on the contactor 3 in the polyimide film 22, and the wiring 23 formed on the polyimide film 22 and the contactor 3 are electrically connected to each other on a bottom of the through hole TH1. In the present embodiment, the through hole TH1 is formed immediately on the contactor 3. In this manner, by arranging the through hole TH1 immediately on the contactor 3, an arranging space for the through hole TH1 can be reduced, and therefore, narrowing pitches of the contactors 3 can be handled.

Still further, as shown in FIG. 10, the plurality of wirings 23 connected to the plurality of contactors 3a among the plurality of wirings 23 are arranged so as to be extended along the direction intersecting with (orthogonal to) the extending direction (aligning direction) of the contactor group 3A in the plan view. In this manner, by extending the plurality of wirings 23 along the direction intersecting with (orthogonal to) the extending direction (aligning direction) of the contactor group 3A, the plurality of wirings 23 can be efficiently drawn even if arranging pitches of the plurality of contactors 3 are dense. As shown in FIG. 8, the wirings 23 are further radially drawn from there toward the outer edge (peripheral portion) of the thin-film sheet 2. In the vicinity of the peripheral portion of the thin-film sheet 2, the plurality of receiving portions (whose illustrations are omitted) of the wiring substrate 1 shown in FIG. 6 and the plurality of wirings 23 are electrically connected to each other. The end portions of the plurality of wirings 23 inside the contactor arrangement region 2c are extended inner than the contactors 3. The wirings 23 in the wiring layer 24 (see FIGS. 11 and 12) are formed so that their density is uniformed in order to uniform the stress of the thin-film sheet 2.

Still further, as shown in FIGS. 8 and 10 to 12, a plurality of dummy wirings 26 are formed between the plurality of wirings 23 in the thin-film sheet 2. As shown in FIG. 10, as well as the plurality of wirings 23, the plurality of dummy wirings 26 are formed inside the wiring layer 24 stacked on the polyimide film 22. In other words, the plurality of dummy wirings 26 are formed on the polyimide film 22, and are covered by the polyimide film 25. The thin-film sheet 2 is a thin sheet containing polyimide as a main component as described above, and the thin-film sheet 2 is stretched by pushing the pressing portion 4 shown in FIG. 6 downward to adjust the positions of the contactors 3 and the pads 11 (see FIG. 4) (sheet stretching step). However, when the plurality of wirings 23 are separately formed from each other in the thin-film sheet 2, a behavior of stretching the thin-film sheet 2 is changed between a region where the wirings 23 are arranged and a region where the wirings are not arranged, and it is difficult to uniformly stretch the sheet. As a result, the thin-film sheet 2 is loosed, and this is a cause of positional misalignment between the contactors 3 and the pads 11 (see FIG. 4). By forming the plurality of dummy wirings 26 in the region where the wirings 23 are not formed, an area of the region where the wirings 23 are not formed is reduced. In this manner, the hardness and rigidity in the thin-film sheet 2 are uniformed, and therefore, it can be prevented or suppressed to cause the loosing at the above-described sheet stretching step.

Since the plurality of dummy wirings 26 are not electrically connected to the plurality of contactors 3, the dummy wirings can be also formed of a non-conductive material. However, as well as the plurality of wirings 23 as shown in FIGS. 11 and 12, for the plurality of dummy wirings 26, the stacked film formed by sequentially stacking the conductive film 23a and the conductive film 23b are from the lower layer is preferred. By commonalizing components of the wirings 23 and the dummy wirings 26, mechanical characteristics of the thin-film sheet 2 such as hardness and rigidity can be uniformed. Further, by commonalizing the components of the wirings 23 and the dummy wirings 26, the plurality of wirings 23 and the plurality of dummy wirings 26 can be formed at one batch in forming the thin-film sheet 2. Still further, since the plurality of dummy wirings 26 are not electrically connected to the plurality of contactors 3, the dummy wirings can be freely arranged between the regions where the plurality of wirings 23 are formed. However, in the peripheries of the contactors 3 where the plurality of wirings 23 are densely arranged, it is preferred that the dummy wirings 26 is arranged along the wirings 23 from the viewpoint of the efficient arrangement of the dummy wirings 26.

As shown in FIGS. 10 and 12, inside the region of the contactor group 3A, each of the dummy wirings 26 is arranged along the wirings 23 between the plurality of wirings 23. In this manner, the flatness of the rear surface 2b of the thin-film sheet 2 can be improved. However, if an arranging pitch between the plurality of wirings 23 is narrow and each arranging space for the dummy wirings 26 cannot be secured, a configuration in which the dummy wirings 26 are not arranged between the plurality of wirings 23 can be also employed. Also, as shown in FIG. 10, in a corner region (corner portion) 2f where the plurality of contactor groups 3A and 3B intersect with each other, the plurality of dummy wirings 26 are formed along the wirings 23 on an opposite side to a contactor group 3A of a contactor 3e arranged at an end portion of the contactor group 3A of the plurality of contactors 3a. Further, the plurality of dummy wirings 26 are formed along the wirings 23 on an opposite side to a contactor group 3B of a contactor 3e arranged at an end portion of the contactor group 3B of the plurality of contactors 3b. Still further, although illustrations are omitted, the plurality of dummy wirings 26 are similarly arranged along the wirings 23 at opposite-side end portions of the contactor groups 3A and 3B and at both ends of the contactor groups 3C and 3D shown in FIG. 9. Note that the corner region 2f is a region where extended lines of two contactor groups intersect with each other when the contactor groups 3A, 3B, 3C, and 3D are arranged respectively along respective sides of the contactor arrangement region 2c shaped in the planar quadrangle shape as shown in FIG. 9. In FIGS. 9 and 10, the corner region 2f is shown with hatching. In the corner region (corner portion) 2f where the plurality of contactor groups 3A and 3B intersect with each other, the area of the region where the plurality of wirings 23 are not formed is large, and therefore, it tends to loose the thin-film sheet 2 in stretching the thin-film sheet 2. However, by arranging the dummy wirings 26, the loosing can be suppressed.

Here, as shown in FIGS. 10 and 11, in the thin-film sheet 2 of the present embodiment, a slit 2d is formed between the dummy wiring 26 and the contactor 3e arranged at the end portion of the contactor group 3A. In FIGS. 10 and 11, the slit 2d is formed between the contactor 3e and the dummy wiring 26 arranged adjacent to the contactor 3e. Also, as shown in FIG. 10, the slit 2d is formed between the dummy wiring 26 and the contactor 3e arranged at the end portion of the contactor group 3B. In FIG. 10, the slit 2d is formed between the contactor 3e and the dummy wiring 26 arranged adjacent to the contactor 3e. Further, although illustrations are omitted, the slit 2d is formed between the dummy wirings 26 and the contactors 3e arranged at the opposite-side end portions of the contactor groups 3A and 3B and at both end portions of the contactor groups 3C and 3D shown in FIG. 9. Each of these slits 2d is formed of an opening portion penetrating from one surface among the principal surface 2a and the rear surface 2b of the thin-film sheet 2 shown in FIG. 11 to the other surface. Also, each of these slits 2d is formed along the wiring 23 (and the dummy wiring 26) arranged adjacent to the slit 2d. The slits 2d can be formed by, for example, irradiating laser beam from one surface among the principal surface 2a and the rear surface 2b of the thin-film sheet 2 toward the other surface. A further detailed structure of the slit 2d and a reason for forming the slit 2d will be described below.

<Study on Contact Pressure of Contactor>

Figure 13:
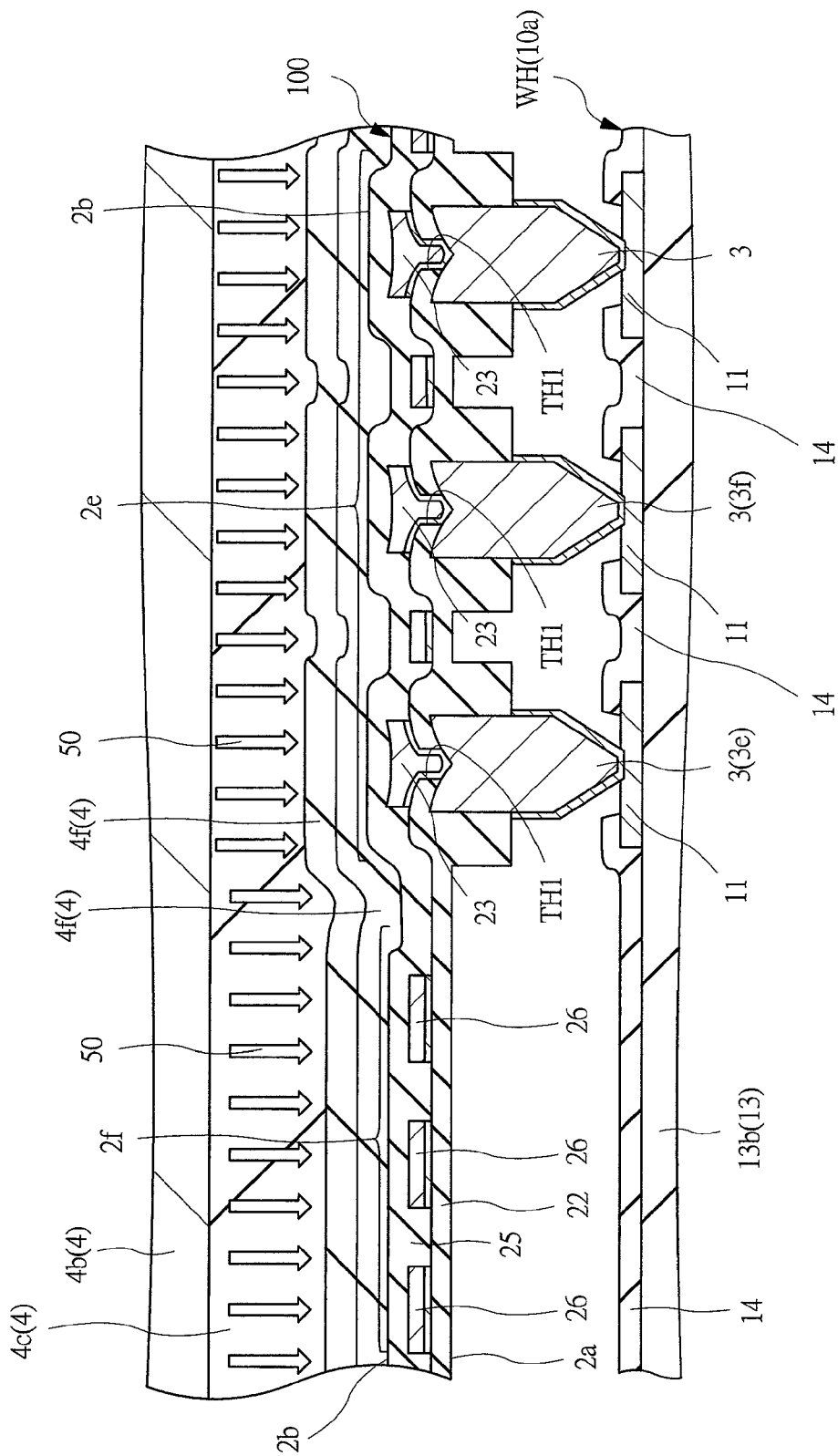
FIG. 13 is an enlarged cross-sectional view showing a state that contactors and pads of a wafer are contacted to each other by using a thin-film sheet of a different mode from that of FIG. 11.

Next, a further detailed structure of the periphery of the slit 2d and the reason for forming the slit 2d will be explained in detail. The problems caused at the electrical inspection step shown in FIG. 1 will be explained first by using another mode (comparative example) studied by the inventors of the present application, and then, the detailed structures according to the present embodiment will be explained. FIG. 13 is an enlarged cross-sectional view showing a state that the contactors and the pads of the wafer are contacted to each other by using a thin-film sheet of a different mode from that of FIG. 11. The mode shown in FIG. 13 is the same as that of the present embodiment except for the structure of the rear surface of the thin-film sheet. Therefore, in the following explanation, other members of the probe card to which the thin-film sheet is attached will be explained with reference to FIG. 6 and others as needed.

First, a thin-film sheet 100 shown in FIG. 13 is different from the present embodiment in a point that the slits 2d of the thin-film sheet 2 shown in FIG. 11 are not formed. The other points are the same as those of the thin-film sheet 2 of the present embodiment.

As shown in FIG. 13, at the probe inspection step (see FIG. 1) after the above-described sheet stretching step, the electrical inspection for the semiconductor integrated circuit is performed by contacting the tips of the plurality of contactors 3 of the thin-film sheet 100 to the plurality of pads 11 of the wafer WH, respectively. In FIG. 13, from a viewpoint of absorbing shock caused when the contactors 3 and the pads 11 are contacted to each other, the elastomer 4c is arranged as a buffer layer between the pushing piece 4b and the rear surface 2b of the thin-film sheet 100. Also, from a viewpoint of improving slidability at an adhesion interface between the pressing portion 4 and the rear surface 2b of the thin-film sheet 100, a polyimide sheet 4f formed separately from the thin-film sheet 100 is arranged between the elastomer 4c and the rear surface 2b of the thin-film sheet 100. FIG. 13 exemplifies that two polyimide sheets 4f separately formed from each other are overlapped. That is, the contact pressure between the contactors 3 and the pads 11 is adjusted by the load mainly applied from the pressurizing portion 5 (see FIG. 6) at the above-described pressurizing step, and the load is transmitted to the thin-film sheet 100 via the elastomer 4c of the buffer layer.

Here, as shown in FIG. 6, in order to uniformly transmit the load to the contactor arrangement region 2c of the thin-film sheet 100 (see FIG. 13), the pushing piece 4b and the elastomer 4c arranged in the lower layer of the pushing piece 4b (and the polyimide sheet 4f shown in FIG. 13 arranged in the lower layer of the elastomer 4c) cover a wider area than the contactor arrangement region 2c in the rear surface 2b of the thin-film sheet 100 (see FIG. 13). That is, as shown in FIG. 13, in the rear surface 2b of the thin-film sheet 100, a load-transmitted region which receives the load via the elastomer 4c includes a region 2e on the plurality of contactors 3 and a peripheral region of the region 2e (for example, the corner region 2f). On the other hand, the plurality of contactors 3 are contacted to the wafer WH in a principal surface side of the thin-film sheet 100, and a principal surface side of the corner region 2f is not contacted to the wafer WH.

Therefore, as shown by adding arrows 50 in FIG. 13, even when the load transmitted from the elastomer 4c toward the rear surface 2b of the thin-film sheet 100 is uniform in the rear surface 2b, the load transmitted to the contactors 3 is not uniform. That is, another contactor 3 is arranged on both adjacent sides of one contactor 3 not arranged at the end portion of the contactor group of the plurality of contactors 3, and therefore, the load transmitted from other region than the region immediately above the contactor can be dispersed and received by the contactor 3 and the both-adjacent-side contactors 3. On the other hand, in the contactor 3e arranged at the end portion of the contactor group, another contactor 3 is arranged on only one adjacent side of the both adjacent sides. Therefore, in addition to the load from the region 2e immediately above the contactor 3e, the load from the peripheral region thereof (for example, the corner region 2f where the plurality of dummy wirings 26 shown in FIG. 13 are formed) is also transmitted. More particularly, as shown in FIG. 10, due to adjacently arranging to the corner region (corner portion) 2f at which the plurality of contactor groups 3A and 3B intersect with each other, an amount of the load transmitted from the corner portion becomes large. As a result, the contact pressure between the contactor 3e arranged at the end portion and the pad 11 is higher than the contact pressure between the other contactor 3 and the pad 11.

Still further, when the contact pressure between the contactor 3e and the pad 11 is increased, the contactor 3e is deeply embedded into the pad 11, and therefore, a contactor 3f arranged adjacent to the contactor 3e is lifted up by a reaction of the embedding, so that the contact pressure between the contactor 3f and the pad 11 is lower than the contact pressure between the other contactor 3 and the pad 11. In other words, variation in the contact pressure of the plurality of contactors 3 is increased.

And, if the variation in the contact pressure is large, the contact resistances are not uniformed, and this causes that the precise electrical inspection cannot be performed. For example, in a location where the contact pressure is low, a signal current for the inspection does not flow, and this causes a conduction failure (open failure). Also, if the contact pressure is too large, this causes that the wafer which is the inspection target is damaged. From a viewpoint of preventing the damage of the wafer, it is effective to decrease a center value (designed contact pressure) of the variation in the contact pressure. However, for achieving this, it is required to further decrease a margin of the variation. More particularly, in recent years, from a viewpoint of preventing the damage of the wafer which is the inspection target in the probe inspection, it is demanded that the contact pressure between the contactor 3 and the pad 11 is further reduced. For example, from a viewpoint of improving a circuit operation of the semiconductor chip 10 (see FIG. 4), there is a technique in which an insulating film whose relative permittivity is lower than that of the protective film 14 such as lower than about 3.0 (called Low-k insulating film) is used as the insulating film 13b which is an interlayer insulating film. As a method of forming the Low-k insulating film, there is, for example, a method of forming a silica-glass-based material such as SiOC by a CVD (Chemical Vapor Deposition) method. Alternatively, for example, there is a method of forming a carbon-containing silicon-oxide-based material by the CVD method or a method of decreasing the relative permittivity by forming the insulating film to have a porous structure. The above-described Low-k insulating film has an electric characteristic that the relative permittivity is lower than that of the protective film 14. On the other hand, the Low-k insulating film also has a characteristic that a mechanical strength (fracture endurance) is lower than that of the protective film 14. Therefore, when the contact pressure between the contactor 3 and the pad 11 is high, this causes to destroy the insulating film 13b or circuits.

<Peripheral Detail of Slit of Thin-Film Sheet of Present Embodiment>

Figure 14:
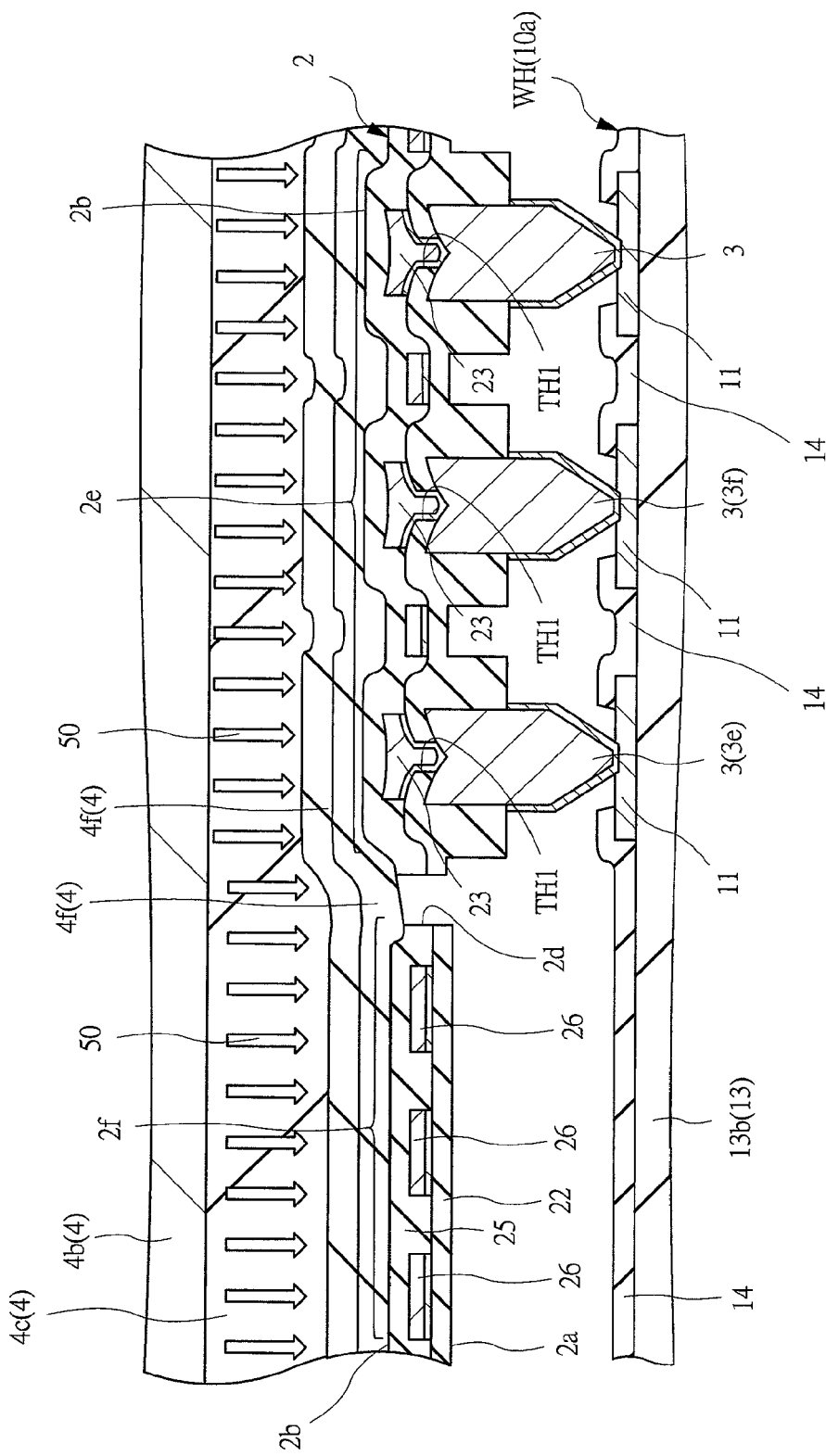
FIG. 14 is an enlarged cross-sectional view showing a state that the contactors and the pads of the wafer are contacted to each other by using the thin-film sheet shown in FIG. 11.

Next, in consideration of the above-described results by the studies, a further detailed structure of the periphery of the slit 2d of the present embodiment and a preferred mode will be explained. FIG. 14 is an enlarged cross-sectional view showing a state that contactors and pads of a wafer are contacted to each other by using the thin-film sheet shown in FIG. 11.

As shown in FIG. 14, at the probe inspection step (see FIG. 1) of the present embodiment, after the above-described sheet stretching step, the electrical inspection for the semiconductor integrated circuit is performed by contacting the tips of the plurality of contactors 3 of the thin-film sheet 2 to the plurality of pads 11 of the wafer WH, respectively. In the present embodiment, similarly to the comparative example shown in FIG. 13, the elastomer 4c is arranged as the buffer layer between the pushing piece 4b and the rear surface 2b of the thin-film sheet 2 from the viewpoint of absorbing the shock caused when the contactor 3 and the pad 11 are contacted to each other. Also, from the viewpoint of improving the slidability at the adhesion interface between the pressing portion 4 and the rear surface 2b of the thin-film sheet 2, the polyimide sheet 4f separately formed from the thin-film sheet 2 is further arranged between the elastomer 4c and the rear surface 2b of the thin-film sheet 2. FIG. 14 exemplifies that the two polyimide sheets 4f separately formed from each other are overlapped. The elastomer 4c and the polyimide sheets 4f may be simply arranged between the pushing piece 4b and the rear surface 2b of the thin-film sheet 2, and may be fixed by the pressing force of the pressing portion 4 (see FIG. 6). However, in the present embodiment, a lower surface of the pushing piece 4b and an upper surface of the elastomer 4c are fixed to each other by adhesion. In this manner, the pushing piece 4b and the elastomer 4c are integrated, and a pressing tool in which the buffer layer is arranged on the pressing surface side is provided. Further, in the present embodiment, the polyimide sheets 4f are fixed to a lower surface of the elastomer 4c by adhesion. In this manner, the pushing piece 4b, the elastomer 4c, and the polyimide sheets 4f are integrated, and a pressing tool including the polyimide film with good slidability with respect to the thin-film sheet 2 in the pressing surface is provided.

Here, in the present embodiment, the slit 2d is formed along the wiring 23 (and the dummy wiring 26) between the dummy wiring 26 and the contactor 3e arranged at the end portion of the contactor group. On the other hand, the slit 2d is not formed between the contactor 3e and the contactor 3f.

And, the slit 2d is formed of the opening portion penetrating from one surface among the principal surface 2a and the rear surface 2b of the thin-film sheet 2 to the other surface. Therefore, for example, a part of the load transmitted to the corner region 2f shown in FIG. 14 is transformed to a force pushing the corner region 2f of the thin-film sheet 2 downward, and is eased. Also, the other part of the load transmitted to the corner region 2f shown in FIG. 14 is dispersed onto a region outer than the slit 2d (the outer edge side of the contactor arrangement region 2c shown in FIG. 9). Therefore, the load transmitted to the contactor 3e is formed of the load transmitted from the region 2e on the contactor 3 and the load transmitted form the slight region of the periphery of the region 2e reaching the boundary with the slit 2d. That is, the load transmitted to the contactor 3e can be equivalent to the load transmitted to the peripheral contactor 3. In other words, the slit 2d is an opening end portion which divides a path through which the load is directly transmitted from the corner region 2f to the contactor 3e. As a result, the contact pressure between the contactor 3e arranged at the end portion and the pad 11 becomes equivalent to the contact pressure between the other contactor 3 and the pad 11. Also, by forming the contact pressure between the contactor 3e and the pad 11 to be equivalent to the contact pressure with the other contactor 3, the contact pressure between the contactor 3f arranged adjacent to the contactor 3e and the pad 11 can be equivalent to the contact pressure between the other contactor 3 and the pad 11. That is, the variation in the contact pressure between the plurality of contactors 3 and the plurality of pads 11 can be reduced.

As a result, the failure at the electrical inspection step caused by the variation in the contact pressure with each of the plurality of contactors 3 can be prevented or suppressed. For example, it can be prevented or suppressed to cause the conduction failure (open failure) due to the extremely low load transmitted to the contactor 3f. Also, for example, it can be prevented or suppressed to destroy the pad 11, the insulating film 13b, or the semiconductor integrated circuit due to the extremely high load transmitted to the contactor 3e. For example, in performing the electrical inspection for the wafer WH with using the above-described Low-k insulating film as the insulating film 13b, it is required to set the contact pressure with each contactor 3 to be low. For example, the load transmitted to each contactor 3 in the contact is about $5 \times 10^{-3}$ N. According to the present embodiment, even when the electrical inspection is performed with such a low load, the margin of the variation in the contact pressure can be reduced, and therefore, the conduction failure and the damage of the wafer WH can be prevented.

<Preferred Mode of Periphery of Slit>

Next, a preferred mode of the slit 2d will be explained. As described above, the slit 2d is the opening end portion which divides the path through which the load is directly transmitted from the corner region 2f to the contactor 3e. However, from a viewpoint of increasing an effect of dividing the transmission path of the load, it is preferred to lengthen the slit 2d in the extending direction. As shown in FIG. 10, it is preferred to lengthen the slit longer than widths of the contactor groups 3A and 3B. By lengthening the slit 2d, a dividing distance of the transmission path of the load is lengthened.

Also, in the present embodiment, the slit 2d is arranged between the corner region 2f where the contactor groups 3A and 3B intersect with (orthogonal to) each other (the region shown with hatching in FIGS. 9 and 10) and the contactor group 3A and the contactor group 3B, respectively. In this manner, in the thin-film sheet 2 including the plurality of contactor groups 3A and 3B whose extending directions intersect with (orthogonal to) each other, it is preferred to arrange the slit 2d between the corner region 2f and the contactor group 3A and the contactor group 3B, respectively. This is because the slit 2d can be arranged immediately adjacent to the contactor 3e arranged at the end portion of each of the contactor groups 3A and 3B.

Further, in this case, the length (first length) of the slit 2d from the contactor group 3A or the contactor group 3B toward an inner side (center direction) of the contactor arrangement region 2c has a limit. Otherwise, the slit could intersect with the plurality of wirings 23 connected to the contactor groups or the other slit 2d. On the other hand, the length (second length) of the slit 2d from the contactor group 3A or the contactor group 3B toward an outer side (outer edge direction) of the contactor arrangement region 2c does not have such a limit or has little limit. Therefore, by forming the second length longer than the above-described first length, a total length of the slit 2d can be increased.

Still further, for the width of the slit 2d, there is no particular limitation from a viewpoint of the function as the opening end portion which divides the path through which the load is directly transmitted from the corner region 2f to the contactor 3e. As long as the slit exactly penetrates from the principal surface 2a of the thin-film sheet 2 to the rear surface 2b thereof, the slit can be functioned as the opening end portion even if the width of the slit 2d is narrower than, for example, the wiring 23. That is, the slit 2d can be functioned as the opening end portion regardless of the width itself. On the other hand, by increasing the width of the slit 2d, a large opening portion is formed in the corner region 2f of the thin-film sheet 2. If such a large opening portion is formed, while the slit can be functioned as the opening end portion, the slit may become a factor of decrease in the durability of the thin-film sheet 2 or an obstructive factor preventing the stretch of the thin-film sheet 2 without loosening at the above-described sheet stretching step. Therefore, from such a viewpoint, it is preferred to form the width of the slit 2d equal to or smaller than the width of the wiring 23.

Still further, from the viewpoint of the function as the opening end portion which divides the path through which the load is directly transmitted from the corner region 2f to the contactor 3e, side surfaces of the wiring 23 and the dummy wiring 26 (side surface on the slit 2d side) arranged along the slit 2d can be also exposed from the polyimide film 25 at the slit 2d. However, if a part of the wiring 23 or the dummy wiring 26 is exposed, the wiring 23 or the dummy wiring 26 are easily oxidized or corroded. Therefore, from a viewpoint of suppressing decrease in the reliability of the electrical inspection step due to the oxidization or corrosion of the wiring 23 or the dummy wiring 26, it is preferred to cover the side surfaces on the slit 2d side of the wiring 23 or the dummy wiring 26 arranged adjacent to the slit 2d by the polyimide film 25 as shown in FIG. 11.

Figure 15:
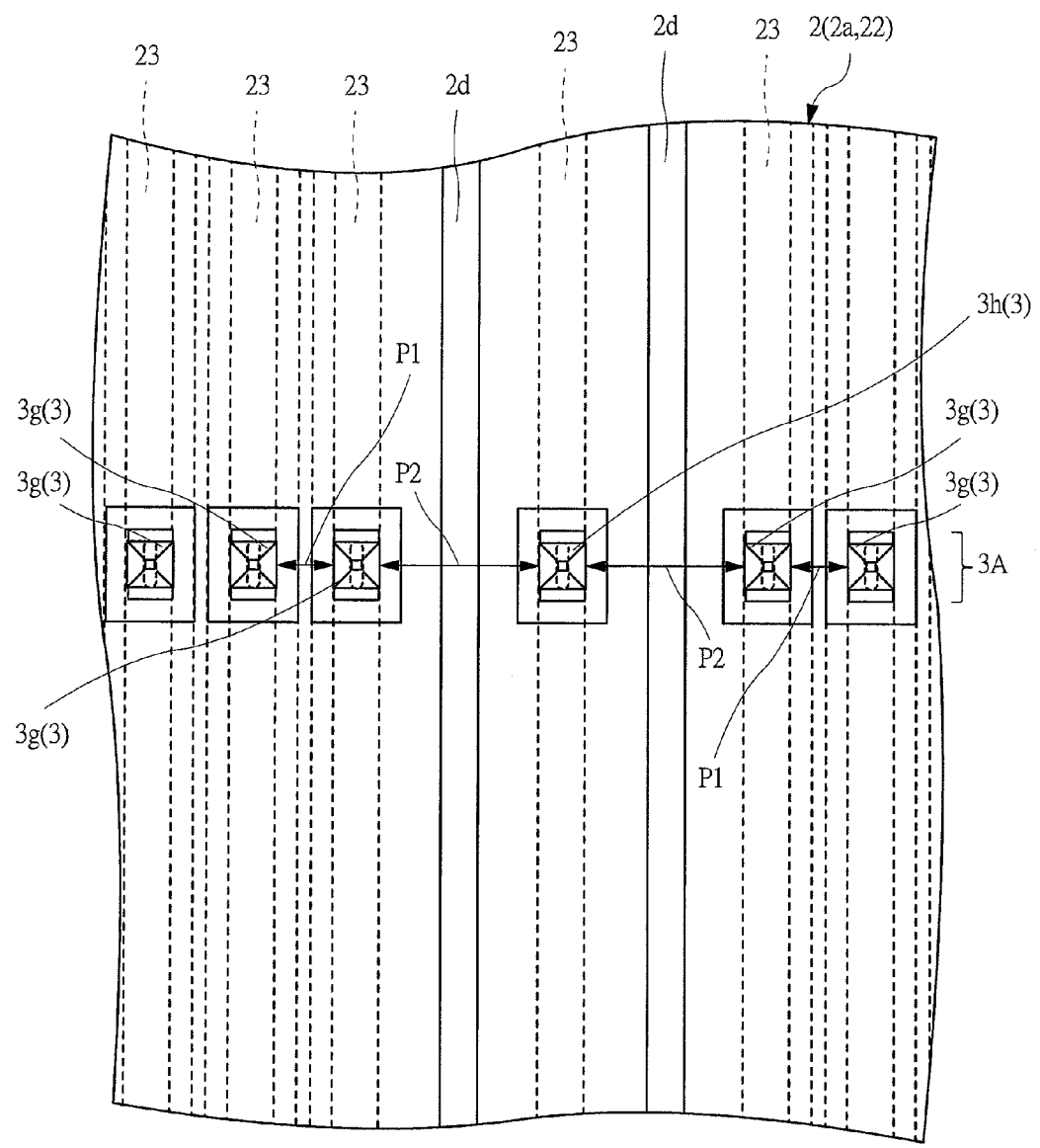
FIG. 15 is an enlarged plan view of an E portion of FIG. 9.
Figure 16:
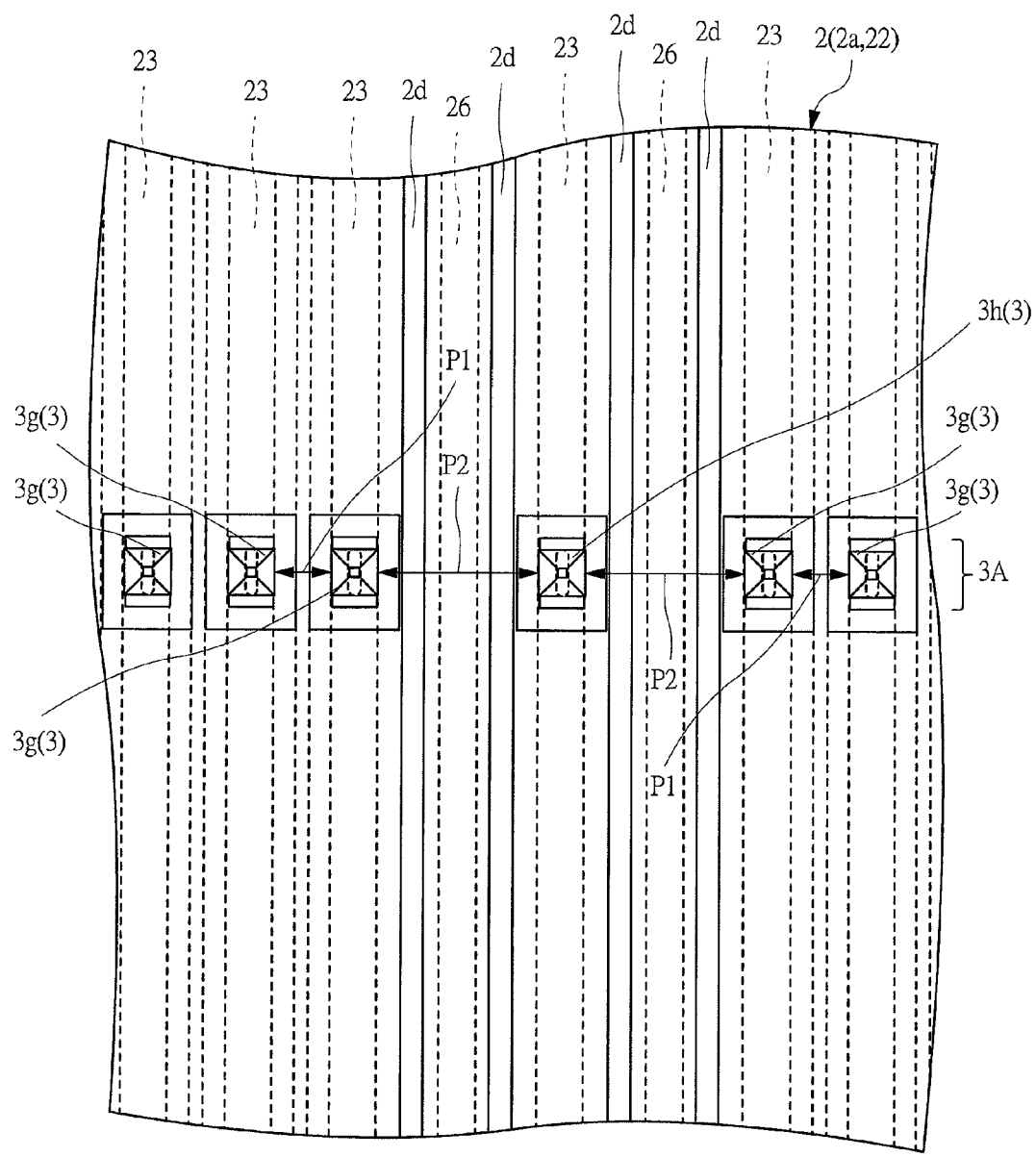
FIG. 16 is an enlarged plan view showing a modification example of FIG. 15.

Still further, in FIG. 10, the example of arranging the slit 2d at the end portion (corner region 2f) of the contactor group where the margin of the variation in the contact pressure with the contactor 3 is particularly easily increased has been explained. However, the slit 2d can be formed at other portion than the corner region 2f (see FIG. 9). For example, as shown in FIGS. 15 and 16, the slits 2d can be arranged in the contactor group 3A. FIG. 15 is an enlarged plan view of an E portion of FIG. 9, and FIG. 16 is an enlarged plan view showing a modification example of FIG. 15. As shown in FIG. 15, in the contactor group 3A, a plurality of contactors 3g arranged at a first interval P1 and a contactor 3h arranged at a second interval P2 wider than the first interval P1 are arranged. In other words, the contactor group 3A includes: a dense-arrangement region where the plurality of contactors 3g are arranged at the first interval P1; and a dispersive-arrangement region where the contactor 3h is arranged at the second interval P2 wider than the first interval P1. As described above, the plurality of contactors 3 are arranged so as to face to the pads 11 (see FIG. 4) of the inspection targets, and therefore, all of the contactors 3 are not always arranged at an equal interval, and the dense-arrangement region and the dispersive-arrangement region are mixed in some cases as shown in FIG. 15. Here, due to the same principle such that the contact pressure of the contactor 3e is increased as described above, contact pressures of the contactor 3h arranged in the dispersive-arrangement region and the contactors 3g arranged at an end portion of the dense-arrangement region is easily higher than a contact pressure of the other contactor 3. This is because the load is transmitted from a region between the contactors 3g and 3h to the contactor 3h arranged in the dispersive-arrangement region and the contactors 3g arranged at the end portion of the dense-arrangement region.

Accordingly, as shown in FIG. 15, the slit 2d is formed between the contactors 3g and 3h arranged at the second interval P2. In FIG. 15, the contactors 3g are arranged at the second interval P2 on both adjacent sides of the contactor 3h, and therefore, the slits 2d are arranged along the wirings 23 on the both adjacent sides of the contactor 3h. On the other hand, the slit 2d is not formed between the contactors 3g arranged at the first interval P1. In this manner, the load transmitted from the region between the contactors 3g and 3h to the contactor 3h and the contactors 3g arranged at the end portions of the dense-arrangement region can be reduced. Therefore, the load transmitted to the contactors 3g and 3h can be equivalent to the load transmitted to the peripheral contactors 3.

Still further, as shown in FIG. 16, the dummy wiring 26 may be arranged between the contactors 3g and 3h arranged at the second interval P2, and the slit 2d may be formed along the wirings 23 between the dummy wiring 26 and the contactor 3g and between the dummy wiring 26 and the contactor 3h. In this case, the respective distances between the slit 2d and the contactors 3g and 3h can be reduced compared with the case shown in FIG. 15, and therefore, the load transmitted to the contactors 3g and 3h can be further reduced. However, if the second interval P2 is narrow, due to the formation of the plurality of slits 2d between the contactors 3g and 3h, it is concerned that the strength of the thin-film sheet 2 is locally reduced and the durability is reduced. Therefore, if the second interval P2 is equal to or smaller than two times the first interval P1, it is preferred to arrange one slit 2d as shown in FIG. 15.

<Building Step of Thin-Film Sheet>

Figure 17:
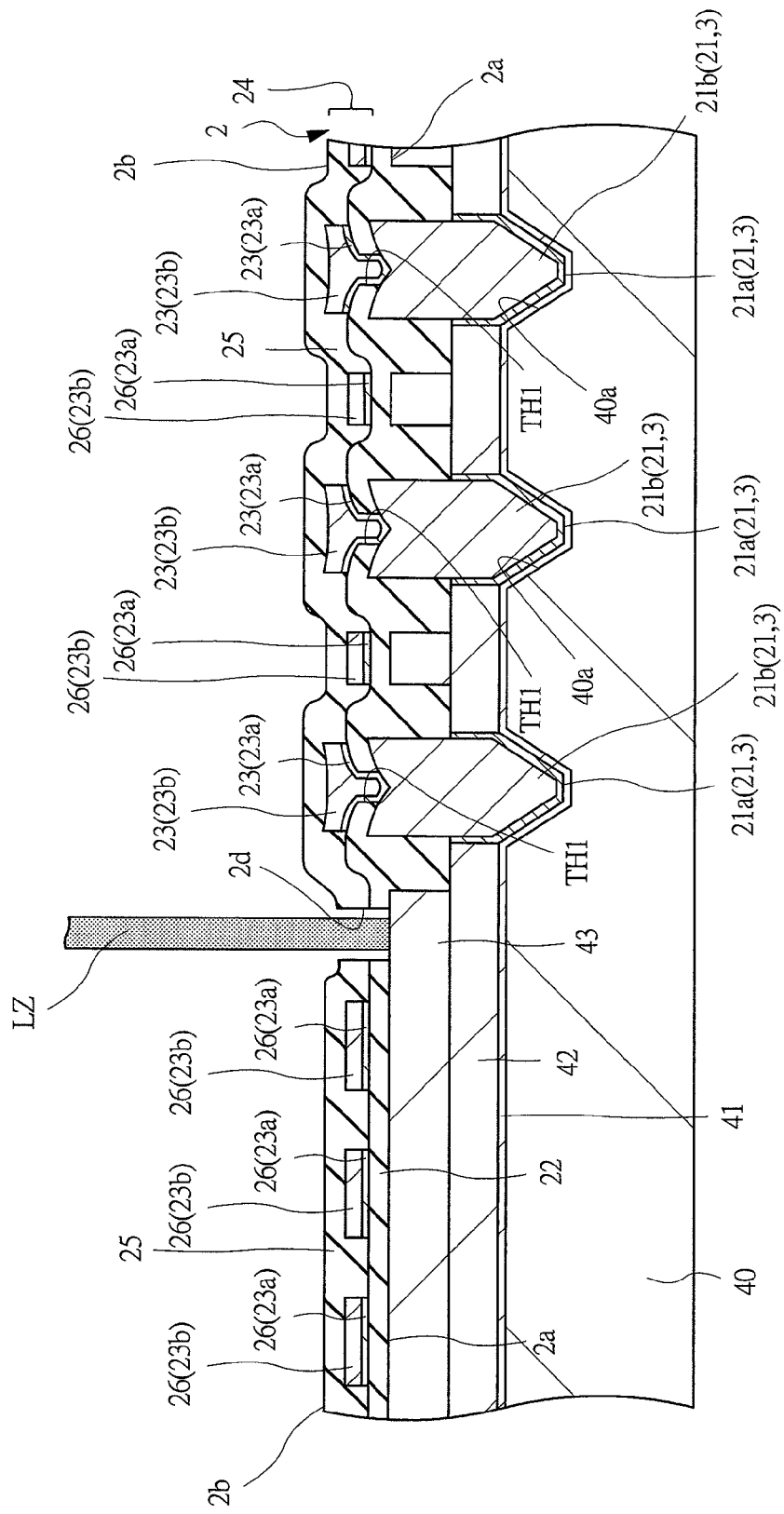
FIG. 17 is an enlarged cross-sectional view showing an example of a building step of the thin-film sheet shown in FIG. 10.
Figure 18:
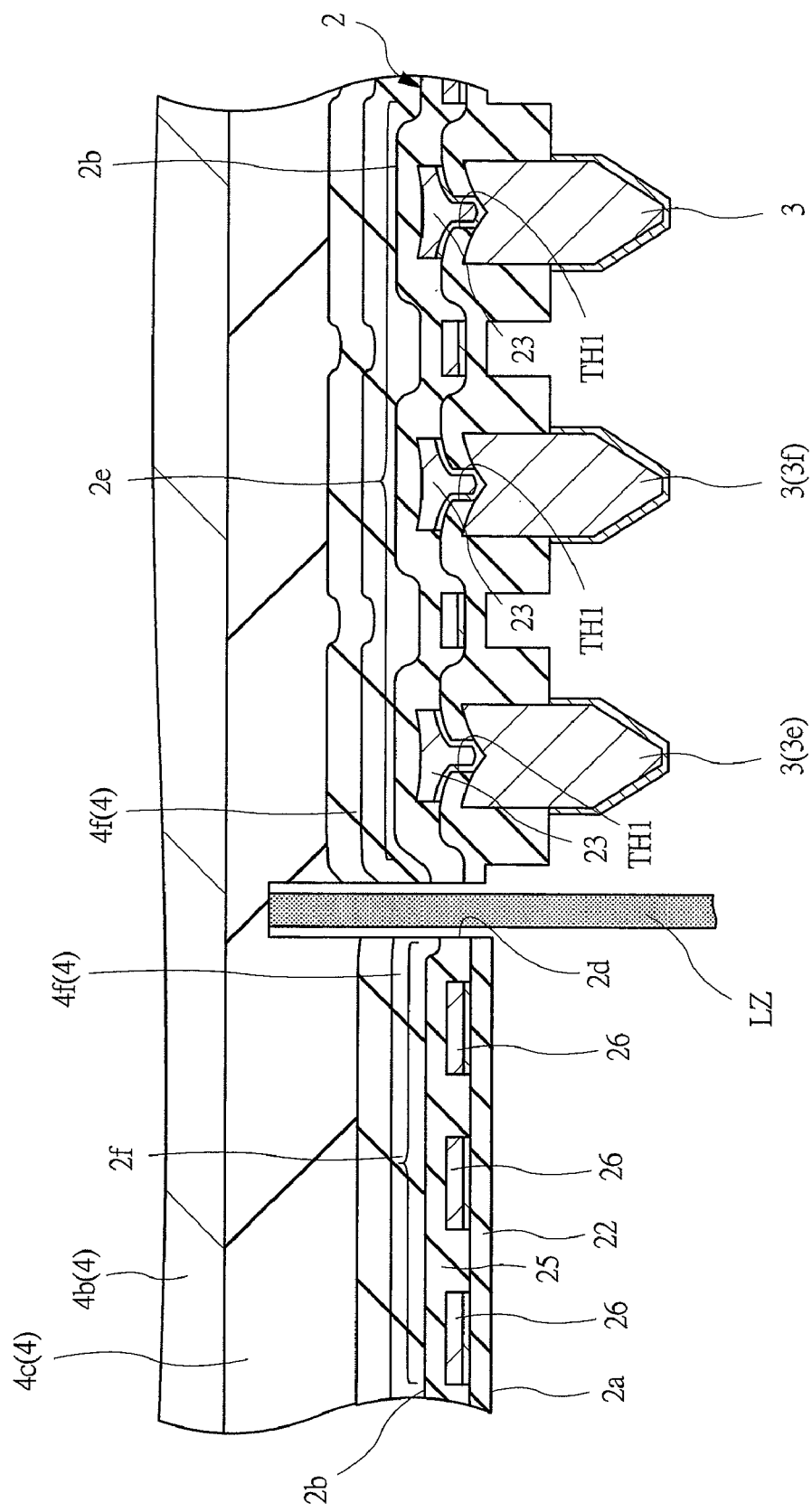
FIG. 18 is an enlarged cross-sectional view showing a modification example of the building step shown in FIG. 17.

Next, a building step of the thin-film sheet 2 will be explained. The above-described thin-film sheet 2 is formed by sequentially stacking a member of each layer from the plurality of contactors 3 arranged in the most lower layer to the polyimide film 25 arranged in the most upper layer. Hereinafter, with reference to FIGS. 17 and 18, two types of an example of a step of forming the thin-film sheet 2 will be briefly explained. FIG. 17 is an enlarged cross-sectional view showing an example of a building step of the thin-film sheet shown in FIG. 10. FIG. 18 is an enlarged cross-sectional view showing a modification example of the building step shown in FIG. 17.

First, as shown in FIG. 17, a substrate (for example, silicon substrate) 40 for forming the thin-film sheet is prepared, and opening portions (holes) 40a for forming the plurality of contactors 3 are formed on the substrate 40. Then, on the substrate including the openings 40a, a conductive film 41 used for plating the contactors 3 or others is formed. Then, in a state (whose illustration is omitted) that the opening portions 40a are masked, a thin film 42 having a thickness of about 10 µm to 20 µm which is made of, for example, copper is formed in a periphery of the opening portions 40a. In a structure shown in FIG. 17, regions where the thin film 42 is not formed become the contactors 3. Then, after removing the mask closing the opening portions 40a, a mask (whose illustration is omitted) covering the periphery of the opening portions is formed, and the rhodium film 21a (conductive film) and the nickel film (conductive film) 21b which are the conductive films covering the surfaces of the contactors 3 are sequentially deposited by an electrolytic plating method with using the conductive film 41 as an electrode. At this time, the rhodium film 21a and the nickel film 21b are formed along the shape of the base of the film formation regions. Then, after exposing the thin film 42, a mask (whose illustration is omitted) is formed so as to cover the nickel film 21b, and a thin film 43 having a thickness of about 10 µm to 20 µm which is made of, for example, copper is further formed on the thin film 42. By forming the thin film 43 which is a second layer, a step portion of the polyimide film 22 which covers a part of the side surfaces of the contactors 3 at a later step is formed. Then, the mask on the nickel film 21b is removed, and the nickel film 21b is further deposited on the nickel film 21b by an electrolytic plating method. Through the steps up to this time, the shapes of the contactors 3 shown in FIGS. 10 to 12 are formed. Since the upper surfaces of the contactors 3 are formed along the shape of the base of the film formation region, peripheral portions of their shapes are swelled larger than center portions thereof as shown in FIG. 17.

Then, the mask is removed, and the polyimide film 22 is formed so as to cover the contactors 3 and the above-described thin film 43 which is the upper layer. At this time, since the polyimide film 22 is formed along the shape of the base of the film formation region, upper portions of the peripheral portions of the contactors 3 are swelled larger than surrounding portions of the peripheral portions as shown in FIG. 17. Then, in the polyimide film 22, the through holes TH1 reaching the upper surfaces of the contactors 3 are formed. Subsequently, on the polyimide film 22 including insides of the through holes TH1, the conductive films 23a and 23b are sequentially stacked. In this manner, the wirings 23 electrically connected to the contactors 3 are formed. Also, the dummy wirings 26 not electrically connected to the contactors 3 are also formed at one batch at this time. Then, the polyimide film 25 is formed on the polyimide film 22, the wirings 23, and the dummy wirings 26. In this manner, the wiring layer 24 is formed. And, by removing the substrate 40, the conductive film 41, and the thin films 42 and 43 (for example, removing them by etching), the thin-film sheet 2 is obtained.

Incidentally, the slit 2d shown in FIGS. 10 and 11 can be formed by, for example, radiating laser beam LZ from one surface among the principal surface 2a and the rear surface 2b of the thin-film sheet 2 toward the other surface (laser irradiation step). By irradiating the laser beam LZ to the formation region of the slit 2d (between the wiring 23 and the dummy wiring 26), the polyimide films 22 and 25 inside the irradiated region are removed, so that an the opening portion can be formed. As the timing of performing this laser irradiation step, for example, in the example shown in FIG. 17, the opening portion is formed by irradiating the laser beam LZ from the rear surface 2b side of the thin-film sheet 2 before removing the substrate 40, the conductive film 41, and the thin films 42 and 43. At this time, since metal patterns such as the wirings 23 and the dummy wirings 26 are not formed in the region to which the laser beam LZ is irradiated, the polyimide films 22 and 25 can be easily removed. In this manner, when the slit 2d is formed before connecting the thin-film sheet 2 to the wiring substrate 1 (see FIG. 6) and retaining it on the wiring substrate, the thin-film sheet 2 in which the slit 2d is formed is then connected to and retained on the wiring substrate 1 (see FIG. 6). More specifically, after forming the slit 2d, the substrate 40, the conductive film 41, and the thin films 42 and 43 shown in FIG. 17 are removed, and then, the thin-film sheet 2 is connected to and retained on the wiring substrate 1 (see FIG. 6). Then, the above described sheet stretching step is performed to adjust the positions of the plurality of contactors 3.

Still further, the timing of the laser irradiation step is not limited to the above-described timing, and the laser irradiation step can be performed after connecting the thin-film sheet 2 to the wiring substrate 1 shown in FIG. 6 and retaining it on the wiring substrate (after the above-described sheet stretching step). In this case, as shown in FIG. 18, in a state that the thin-film sheet 2 is pressed from the rear surface 2b side of the thin-film sheet 2 by the pressing portion 4 and is stretched, the laser beam LZ is irradiated from the principal surface 2a side thereof. In this manner, when the laser beam LZ is irradiated in the state that the thin-film sheet 2 is attached to the wiring substrate 1, an opening portion reaching a part of the polyimide sheet 4f and the elastomer 4c in the laser irradiation region is formed. Also, an opening portion penetrating through the elastomer 4c is formed in some cases. That is, the opening portion reaching at least a part of the elastomer 4c arranged in the upper layer of the slit 2d is formed. By removing a part or all of the buffer layer on the slit 2d, the load transmitted to the corner region 2f can be further exactly divided, and therefore, the variation in the contact pressure of the plurality of contactors 3 can be decreased as less as or less than that of the case explained with reference to FIG. 14. Further, since the slit 2d is formed after the above-described sheet stretching step, the positional misalignment between the slit 2d and the pressing portion can be prevented or suppressed by maintaining the state that the thin-film sheet 2 is stretched after the slit formation. However, when the thin-film sheet 2 and the wiring substrate 1 (see FIG. 6) are detached from each other, and then, the thin-film sheet 2 and the wiring substrate 1 are connected to and retained on each other again for the purpose of maintenance or others, if the opening portion is formed in a part of the elastomer 4c, precise positional alignment is required. Therefore, when the building is performed again after the detachment, it is preferred to change the elastomer 4c and the polyimide sheet 4f adhered and fixed to the pressing portion 4 into new ones and use them in the mode shown in FIG. 14.

Second Embodiment

In the above-described first embodiment, in order to easily understand a basic technical idea, the mode in which the plurality of contactors 3 are arranged in one row along the sides of the contactor arrangement region 2c has been explained. However, due to demands for downsizing and high functionality of a semiconductor integrated circuit device in recent years, narrower pitch and more pins are promoted. As one method of achieving the narrower pitch and more pins, there is a technique (plural-row arranging technique) of arranging chip electrodes (pads) in a plurality of rows along one side of a semiconductor chip. When electrical inspection for the semiconductor integrated circuit device with using the plural-row arranging technique is performed, it is required to arrange the plurality of contactors also in a plurality of rows so as to correspond to the arrangement of the chip electrodes. In the present embodiment, a mode applied to a method of manufacturing the semiconductor integrated circuit device with using the plural-row arranging technique will be explained. Note that the present embodiment is a modification example to which the techniques explained in the above-described first embodiment are applied and utilized. Therefore, the explanations overlapping with that of the above-described first embodiment will be omitted as much as possible, and different points from the above-described first embodiment will be mainly explained.

Figure 19:
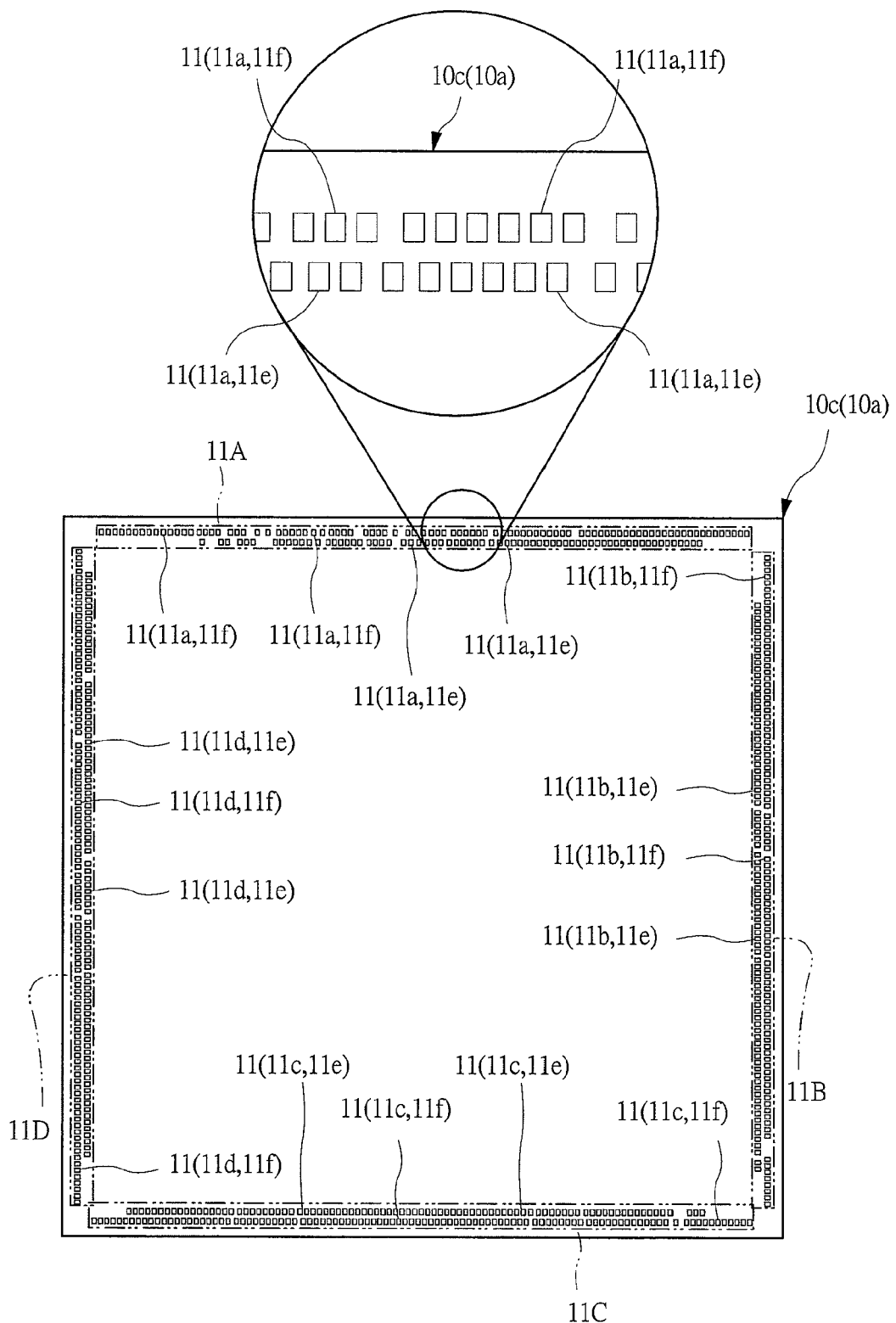
FIG. 19 is a plan view showing a principal surface side of a semiconductor chip which is a modification example of FIG. 4.
Figure 20:
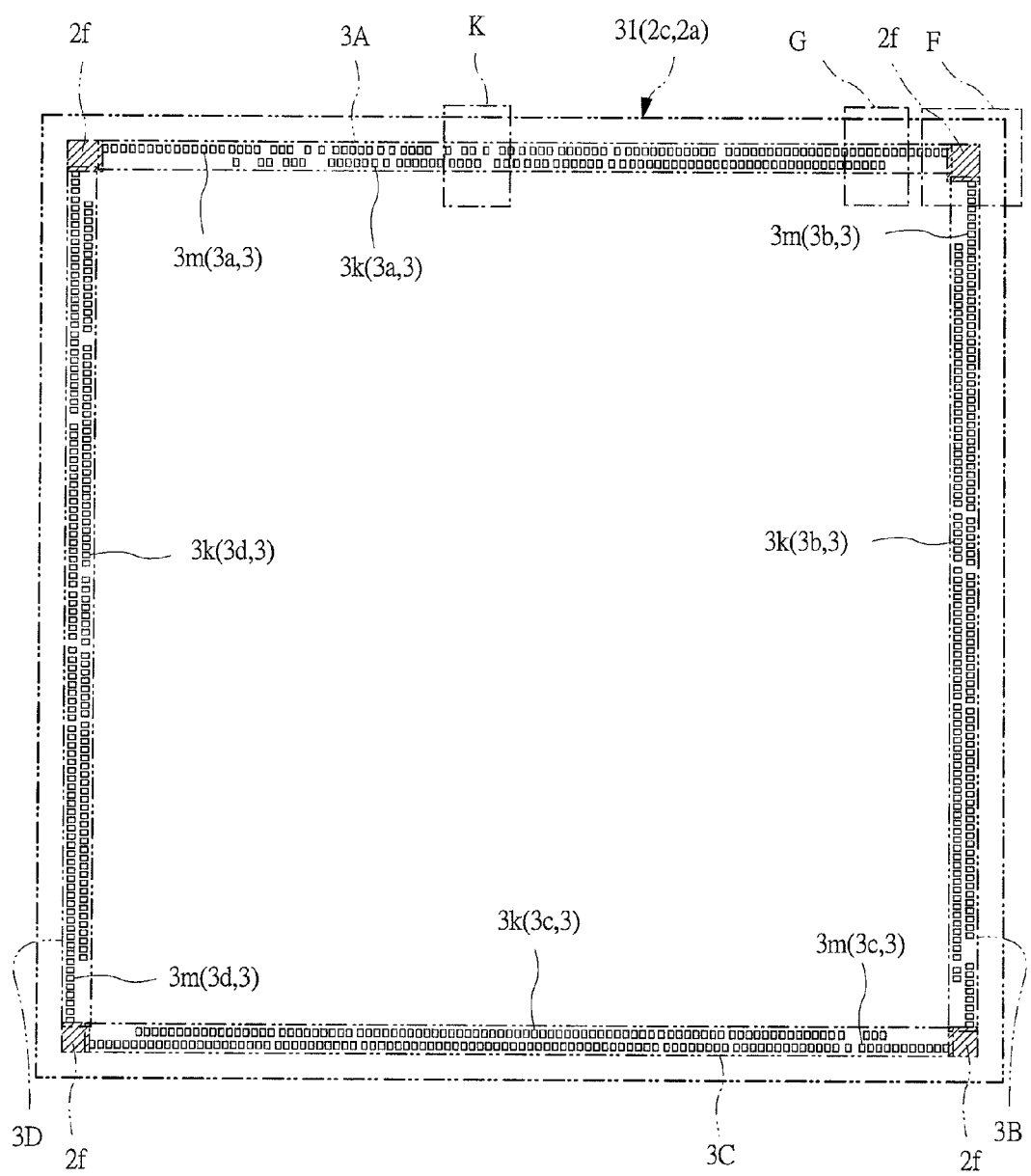
FIG. 20 is an enlarged plan view showing a periphery of a contactor arrangement region of a thin-film sheet which is a modification example of FIG. 9.
Figure 21:
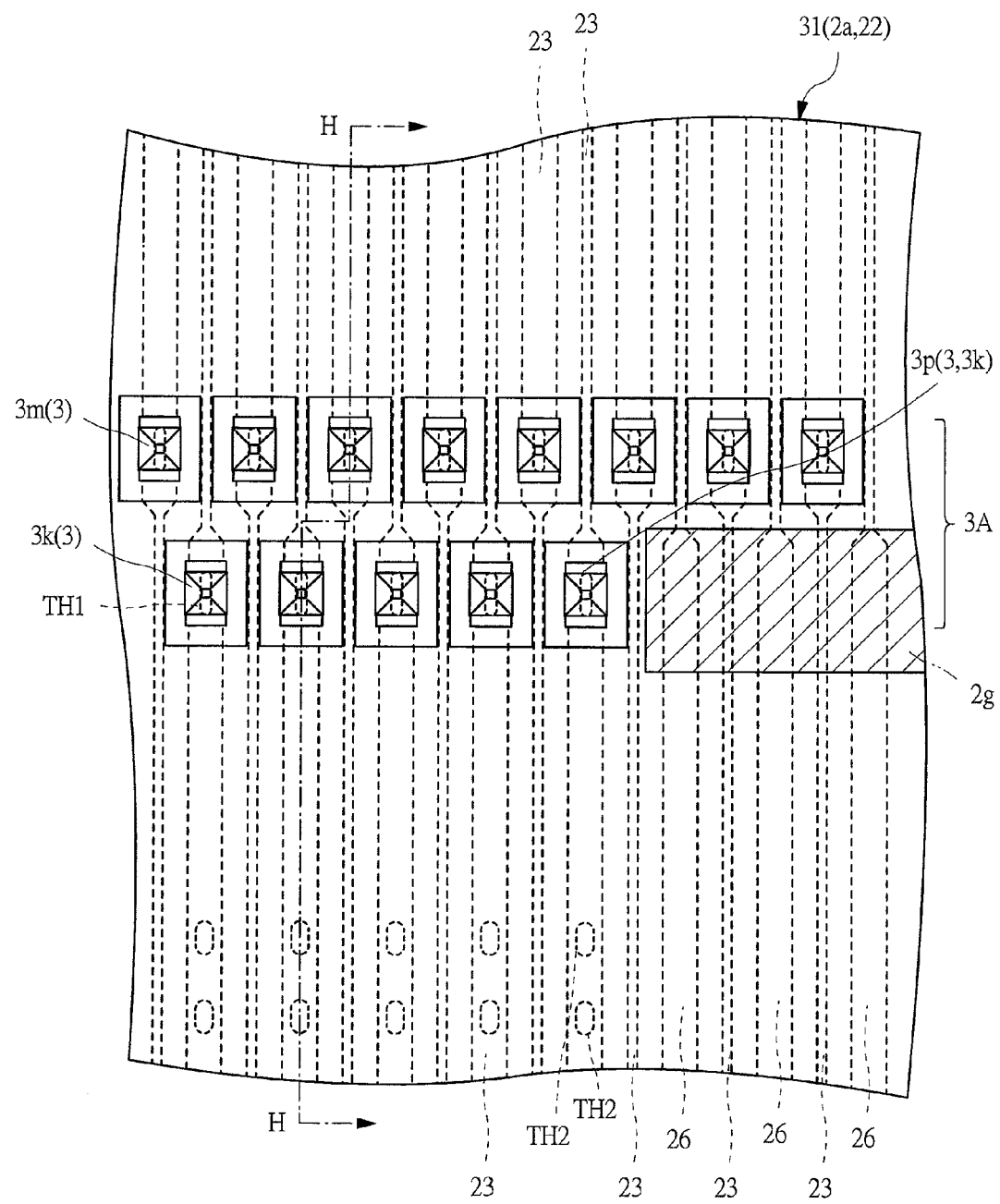
FIG. 21 is an enlarged plan view of an F portion of FIG. 20.
Figure 22:
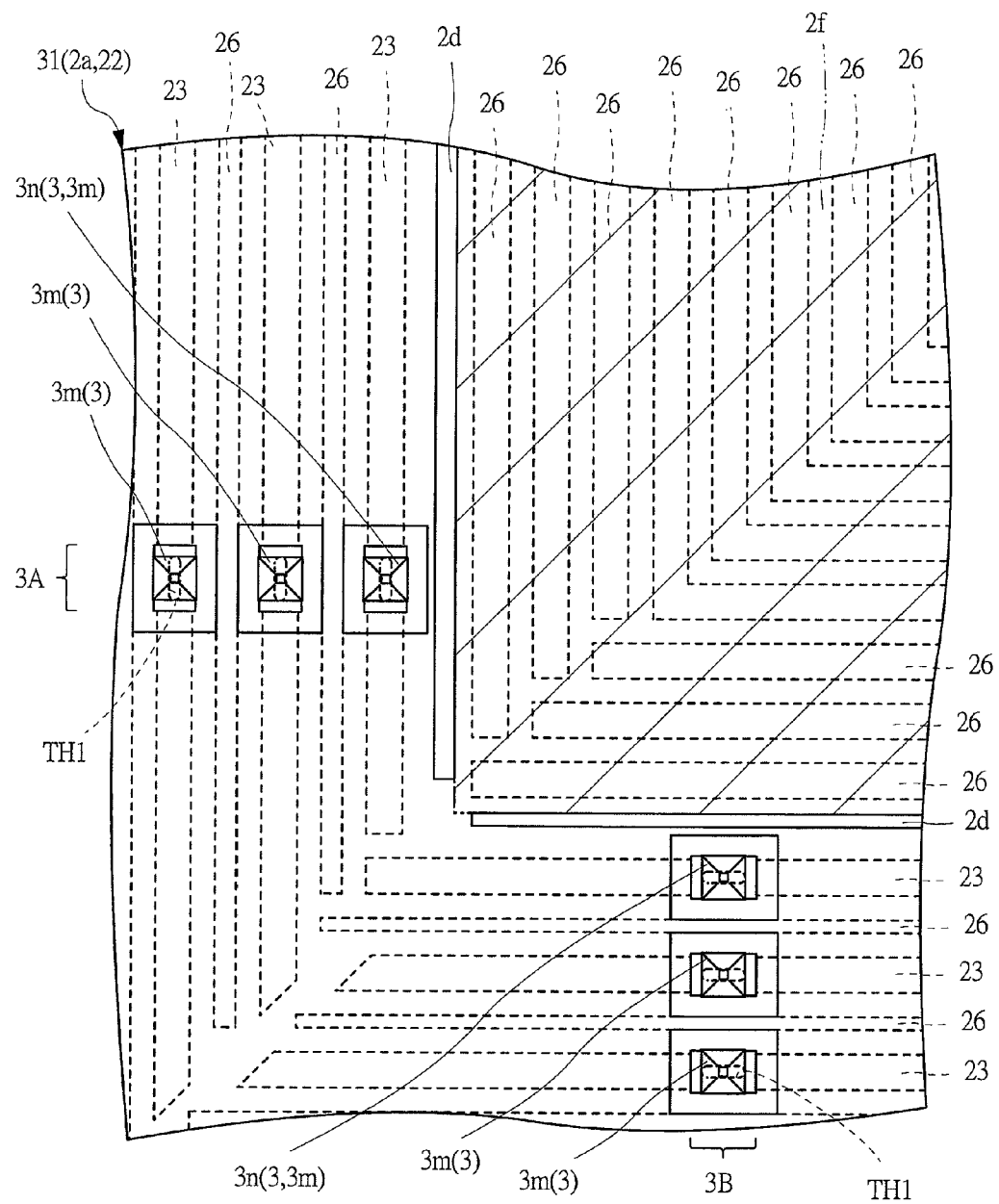
FIG. 22 is an enlarged plan view of a G portion of FIG. 20.
Figure 23:
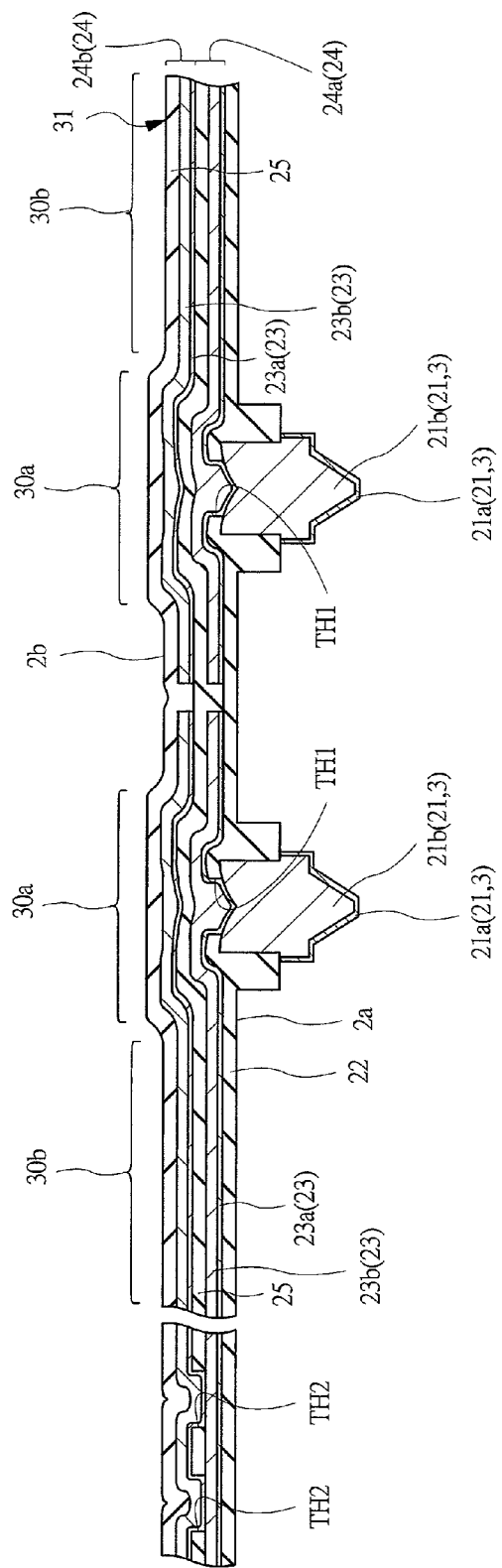
FIG. 23 is an enlarged cross-sectional view taken along line H-H of FIG. 21.
Figure 24:
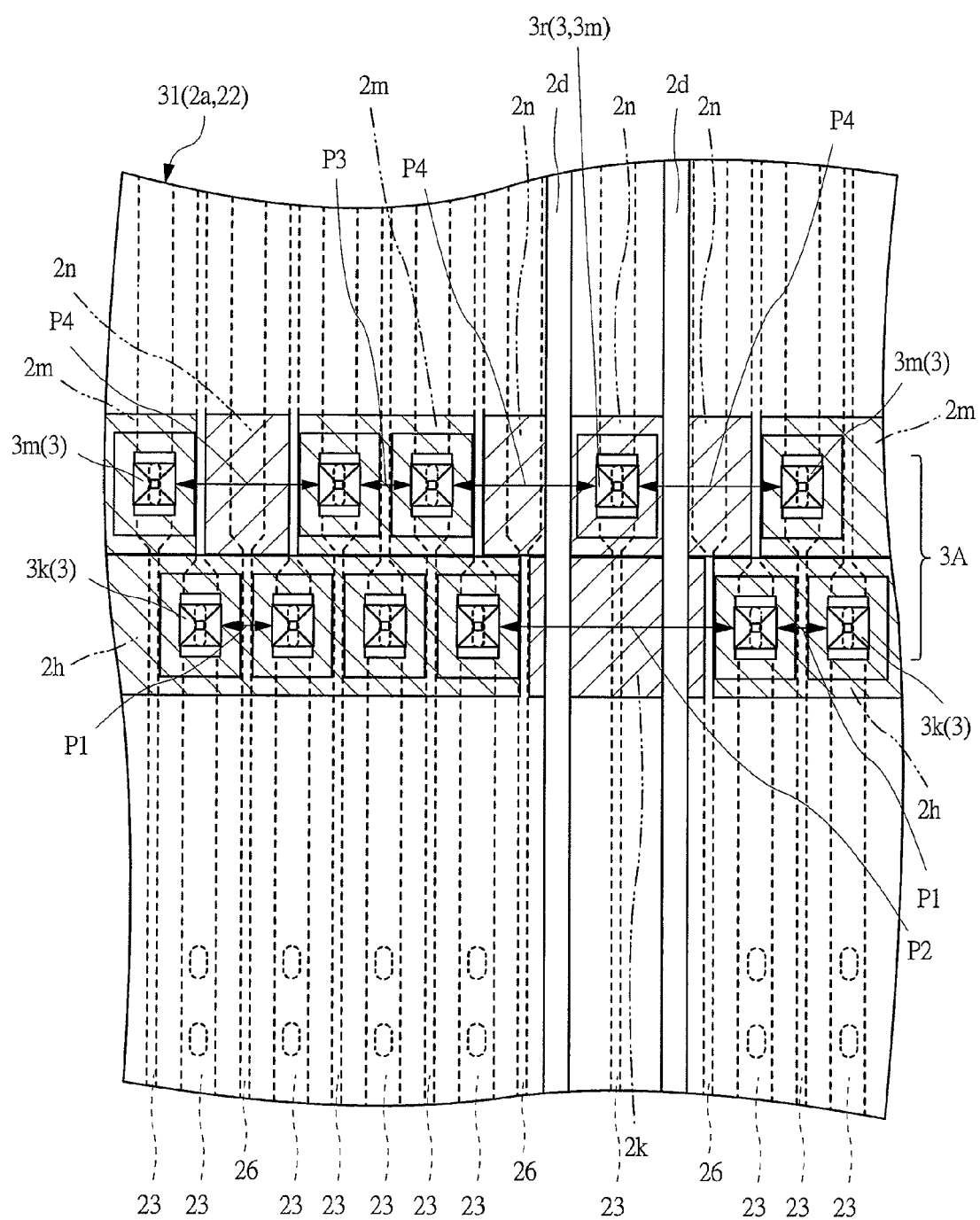
FIG. 24 is an enlarged plan view of a K portion of FIG. 20.

FIG. 19 is a plan view showing a principal surface side of a semiconductor chip which is a modification example of FIG. 4. And, FIG. 20 is an enlarged plan view showing a periphery of a contactor arrangement region of a thin-film sheet which is a modification example of FIG. 9. Also, FIG. 21 is an enlarged plan view of an F portion of FIG. 20, and FIG. 22 is an enlarged plan view of a G portion of FIG. 20. Further, FIG. 23 is an enlarged cross-sectional view taken along line H-H of FIG. 21. Still further, FIG. 24 is an enlarged plan view of a K portion of FIG. 20.

A semiconductor chip 10c (chip region 10a) shown in FIG. 19 is shaped in quadrangle in a plan view, and a plurality of pads 11 are arranged in a plurality of rows in each of pad groups (chip electrode groups) 11A, 11B, 11C, and 11D arranged along sides of the semiconductor chip, respectively. In other words, the plurality of pads 11 arranged in each of the pad groups 11A, 11B, 11C, and 11D include: a plurality of pads (first-row chip electrodes) 11e arranged in a first row; and a plurality of pads (second-row chip electrodes) 11f arranged in a second row positioned between the first row and one side of the semiconductor chip 10c (chip region 10a). In this manner, by arranging the pads 11 in the plurality of rows along one side, the number of the pads 11 arranged in each of the pad groups 11A, 11B, 11C, and 11D can be increased.

Also, for example, as shown in the enlarged view of FIG. 19, the pads are alternately aligned (in a so-called zigzag arrangement) along an aligning direction of the pad group 11A so that one pad 11f arranged in the second row is arranged between the pads 11e arranged in the first row. In this manner, by using the zigzag arrangement in the arrangement of the pads 11 in the plurality of rows, a layout of the wiring (see FIG. 3) connected to each pad 11 can be efficient.

As shown in FIG. 19, when the plurality of pads 11 are arranged in the plurality of rows in each of the pad groups 11A, 11B, 11C, and 11D arranged along the respective sides of the chip region 10a which is an inspection target, as a thin-film sheet 31 shown in FIG. 20, it is required to correspond a layout of the plurality of contactors 3 to the layout of the pads 11 of the inspection target. That is, the thin-film sheet 31 shown in FIG. 20 includes the contactor arrangement region 2c shaped in quadrangle in a plan view. The plurality of contactors 3 are arranged in the plurality of rows in each of the contactor groups (contact terminal groups) 3A, 3B, 3C, and 3D arranged along the respective sides of the contactor arrangement region 2c. In other words, the plurality of contactors 3 arranged in each of the contactor groups 3A, 3B, 3C, and 3D include: a plurality of contactors (first-row contact terminals) 3k arranged in a first row; and a plurality of contactors (second-row contact terminals) 3m arranged in a second row positioned between the first row and one side of the contactor arrangement region 2c. Also, the contactors are alternately aligned (in a so-called zigzag arrangement) along an aligning direction of each of the contactor groups 3A, 3B, 3C, and 3D so that one contactor 3m arranged in the second row is arranged between the contactors 3k arranged in the first row.

Further, as shown in FIG. 23, in the present embodiment, the wiring layer 24 including the plurality of wirings 23 is stacked, and the wiring layer 24a which is the lower layer and the wiring layer 24b which is the upper layer arranged on the polyimide film 22 are electrically connected to each other. Each wiring layer 24 includes: the plurality of wirings 23; and the polyimide film (insulating film) 25 for covering the plurality of wirings 23. And, on the wirings 23 of the wiring layer 24a which is the lower layer, through holes (opening portions) TH2 are formed in the polyimide film 25, and the wirings 23 in the upper layer and the wirings 23 in the lower layer are electrically connected to each other at bottom portions of the through holes TH2. In this manner, even when the arranging pattern of the contactors 3 forms the narrow pitch and more pins, the space for drawing the wirings 23 can be ensured. Note that FIG. 23 exemplifies that the two wiring layers 24 are stacked. However, the number of the wiring layers 24 is not limited to this. For example, as the above-described first embodiment, a one-layer structure can be employed. Also, for example, the wiring layer 24 is further stacked, so that a three- or more-layer structure can be also employed. Further, in the present embodiment, as described above, the plurality of contactors 3k in the first row and the plurality of contactors 3m in the second row are aligned in the zigzag arrangement. Therefore, the wiring 23 connected to the contactor 3a in the second row is arranged between the adjacent contactors 3k arranged in the first row, and the wiring 23 connected to the contactor 3m in the first row is arranged between the adjacent contactors 3a arranged in the second row. In this manner, by extending the plurality of wirings 23 in a direction intersecting with (orthogonal to) the extending direction (aligning direction) of the contactor group 3A, the space for drawing the wirings 23 can be ensured.

The thin-film sheet 31 shown in FIG. 23 can be built by applying the <building step of the thin-film sheet> of the above-described first embodiment. That is, in the <building step of the thin-film sheet>, the through holes TH2 reaching the upper surface of the wirings 23 are formed in the polyimide film 25 after forming the polyimide film 25 on the polyimide film 22, the wirings 23, and the dummy wirings 26 and before the step of removing the substrate 40 (see FIG. 12). Subsequently, the conductive films 23a and 23b are sequentially stacked on the polyimide film 25 including the insides of the through holes TH2. In this manner, the wirings 23 which are the upper layer electrically connected to the wirings 23 which are the lower layer are formed. Also, at this time, the dummy wirings of the wiring layer 24b which is the upper layer are formed. Then, the polyimide film 25 is further formed on the polyimide film 25, the wirings 23, and the dummy wirings. In this manner, the wiring layer 24b which is the upper layer is formed. And, by removing the substrate 40, the conductive film 41, and the thin films 42 and 43 shown in FIG. 12 (by, for example, etching), the thin-film sheet 31 shown in FIG. 23 is obtained. Further, the laser irradiation step explained in the above-described first embodiment can be performed by irradiating the laser beam LZ from the rear surface 2b side of the thin-film sheet 31 before removing the substrate 40, the conductive film 41, and the thin films 42 and 43 as the example shown in FIG. 17. Still further, as its modification example, as the example shown in FIG. 18, the laser irradiation step can be performed after the above-described sheet stretching step.

When each of the contactor groups 3A, 3B, 3C, and 3D is arranged in the plurality of rows as shown in FIG. 20, a position of an end portion of each row arranged in the contactor group 3A, 3B, 3C, and 3D is different from each other in some cases. For example, as shown in FIGS. 21 and 22, in the contactor group 3A, a position of a contactor 3p (see FIG. 21) arranged at an end portion of the first-row arrangement among a plurality of contactors 3k arranged in the first row is inner in the arrangement than a position of a contactor 3n (see FIG. 22) arranged at an end portion of the second-row arrangement among a plurality of contactors 3m arranged in the second row. In other words, in a periphery of the end portion of the contactor group 3A, the contactors 3k of the first row are not arranged, and the plurality of contactors 3m of the second row are arranged in one row. In this case, by assuming the contactors 3k and 3m arranged in each row as one row, the technique explained in the above-described first embodiment can be applied. That is, between the dummy wiring 26 and the contactor 3n arranged at the end portion of the contactor group 3A among the contactors 3n and 3p arranged at the end portion of each row, the slit 2d explained in the above-described first embodiment is formed. On the other hand, as shown in FIG. 21, the slit 2d shown in FIG. 22 is not formed between the contactor 3p and the wiring 23 or the dummy wiring 26 arranged adjacent to the contactor 3p.

The contactor 3k of the first row is not arranged in the periphery of the contactor 3n shown in FIG. 22. Therefore, if the slit 2d is not formed, the load from the corner region 2f is concentrated on the contactor 3n similarly to the contactor 3e (see FIG. 10) explained in the above-described first embodiment, and the contact pressure with respect to the pad 11 (see FIG. 19) is easily increased. On the other hand, while the contactor 3p shown in FIG. 21 is arranged at the end portion of the contactors 3k of the first row, the plurality of contactors 3m are arranged in the vicinity of the contactor 3p, and therefore, the load from a peripheral region (for example, a region 2g shown with hatching in FIG. 21) is dispersed and transmitted onto the contactor 3p and the plurality of contactors 3m. Therefore, even when the slit 2d shown in FIG. 22 is not formed, the contact pressure of the contactor 3p is not easily increased compared with the contact pressure of the contactor 3n. Accordingly, the slit 2d is formed between the contactor 3n whose contact pressure is particularly easily increased and the dummy wiring 26 shown in FIG. 22, so that the variation in the contact pressure is decreased. As explained in the above-described first embodiment, the slit 2d is effective as an opening end which divides the path through which the load is directly transmitted to the contactor 3 from the region such as the corner region 2f where the contactor 3 is not formed immediately below. However, by forming extremely many slits 2d, it is concerned that the slits may become the factor of the decrease in the durability of the thin-film sheet 2 or the obstructive factor in stretching the thin-film sheet 2 without loosening. That is, according to the present embodiment shown in FIGS. 21 and 22, the variation in the contact pressure can be decreased, and the decrease in the durability of the thin-film sheet can be suppressed. Also, the occurrence of the loosening in stretching the thin-film sheet 2 can be suppressed, and therefore, the plurality of contactors 3 can be precisely contacted to the plurality of corresponding pads 11 (see FIG. 19), respectively.

Further, as shown in FIGS. 15 and 16 explained in the above-described first embodiment, even when the technique of forming the slits 2d in an intermediate portion of the contactor group is applied to the present embodiment, the technique can be applied by assuming the contactors 3k and 3m arranged in each row as one row. That is, as shown in FIG. 24, the slit 2d is formed in a region where an interval between the contactor 3k and the contactor 3m peripherally arranged among the plurality of contactors 3k and 3m is wider than the others. As shown in FIG. 24, the first row of the contactor group 3A includes: a region (dense-arrangement region) 2h where the plurality of contactors 3k are arranged at a first interval P1; and a region (dispersive-arrangement region) 2k where the contactors 3k are arranged at a second interval P2 wider than the first interval P1. Also, the second row of the contactor group 3A includes: a region (dense-arrangement region) 2m where the plurality of contactors 3m are arranged at a third interval P3; and a region (dispersive-arrangement region) 2n where the contactors 3m are arranged at a fourth interval P4 wider than the third interval P3.

And, when the region 2k which is the dispersive-arrangement region of the first row and the region 2n which is the dispersive-arrangement region of the second row are adjacently arranged to each other along the extending direction (aligning direction) of the contactor group 3A, the load from the regions 2k and 2n is concentrated on a contactor 3r arranged inside the dispersing region similarly to the contactor 3h (see FIGS. 15 and 16) explained in the above-described first embodiment, and the contact pressure with respect to the pad 11 (see FIG. 19) is easily increased. On the other hand, when the region 2h which is the dense-arrangement region of the first row is arranged adjacent to the region 2n of the second row, the load from the region 2n is dispersed and transmitted onto the plurality of contactors 3 in the periphery of the region 2n, and therefore, the contact pressure with the pad is not easily increased compared with that of the contactor 3r. Accordingly, in the present embodiment, the slit 2d is formed between the contactors 3 adjacent to each other in a region where the region (dispersive-arrangement region) 2k of the first row whose contact pressure is particularly increased and the region (dispersive-arrangement region) 2n of the second row are adjacent to (overlapped with) each other. On the other hand, the slit 2d is not formed in a region where the region (dispersive-arrangement region) 2k of the first row and the region (dense-arrangement region) 2m of the second row are adjacent to (overlapped with) each other or in a region where the region (dense-arrangement region) 2h of the first row and the region (dispersive-arrangement region) 2n of the second row are adjacent to (overlapped with) each other. In other words, the contactors 3k and 3m arranged in each row are assumed as one row, and the slit 2d is formed in the region where the arrangement interval between the adjacent contactors 3 is particularly wide. For example, in FIG. 24, the slit 2d is not formed in a region where the plurality of contactors 3m or contactors 3k are arranged between the adjacent contactors 3k or the adjacent contactors 3m via the dispersive-arrangement region. On the other hand, the slit 2d is formed when the number of the contactor 3m or the contactor 3k arranged between the adjacent contactors 3k or the adjacent contactors 3m via the dispersive-arrangement region is one or less. In this manner, the variation in the contact pressure can be decreased, and the decrease in the durability of the thin-film sheet can be suppressed. Also, the occurrence of the loosening in stretching the thin-film sheet 2 at the above-described sheet stretching step can be suppressed, and therefore, the plurality of contactors 3 can be correctly contacted to the plurality of corresponding pads 11 (see FIG. 19), respectively.

As described above, when each of the contactor groups 3A, 3B, 3C, and 3D is arranged in the plurality of rows, the technique explained in the above-described first embodiment can be applied by assuming the contactors 3k and 3m arranged in each row as one row. However, as the modification example, the technique explained in the above-described first embodiment can be also applied by assuming the first row and the second row arranged in each of the contactor groups 3A, 3B, 3C, and 3D serve as independent contactor groups. For example, in FIG. 21, a slit (similar to the slit 2d shown in FIG. 22, but its illustration is omitted) can be formed between the contactor 3p arranged at the end portion of the contactors 3k arranged in the first row and the dummy wiring 26 arranged adjacent to the contactor 3p. Also, for example, in FIG. 24, the slit 2d can be formed also in the region where the plurality of contactors 3m or contactors 3k are arranged between the adjacent contactors 3k or the adjacent contactors 3m via the dispersive-arrangement region. In these cases, by individually forming the slits 2d depending on the arrangement pitch of the contactors 3 arranged in each row, the variation in the contact pressure of each contactor 3 can be further precisely decreased.

In other points except for the above-described different points, the present embodiment is the same as the above-described first embodiment. Therefore, overlapping explanations are omitted. However, for example, <preferred mode of the periphery of the slit> or others can be applied by replacing the thin-film sheet 2 explained in the first embodiment by the thin-film sheet 31.

Third Embodiment

The above-described first and second embodiments have explained the technique capable of decreasing the variation in the contact pressure of each of the contactors 3 arranged at the end portion or the dispersive-arrangement region of the contactor group. The present embodiment will explain a technique of decreasing the variation in the contact pressure of each of the plurality of contactors 3 including the plurality of contactors 3 arranged in the dense-arrangement regions. Note that the present embodiment is an applied technique of the technique explained in the first or second embodiment. Therefore, the explanations overlapped with the first or second embodiment will be omitted as much as possible, and different points from the first embodiment will be mainly explained.

The thin-film sheet 2 (see FIG. 12) explained in the first embodiment and the thin-film sheet 31 (see FIG. 23) explained in the second embodiment are formed by sequentially stacking a plurality of metal patterns and resin films made of polyimide or others from the principal surface 2a side. Therefore, the upper surface (rear surface 2b of the thin-film sheet 2 or 31) of the polyimide film 25 arranged in the most upper layer is an uneven surface along the metal patterns (for example, the contactors 3 and the wirings 23) arranged in the lower layer. And, the through hole TH1 is formed on the contactor 3, and the wiring 23 and the contactor 3 are electrically connected to each other on the contactor 3, and therefore, a region 30a of the rear surface 2b arranged on the contactor 3 is protruded compared with a periphery of the region. In other words, in the rear surface 2b of the thin-film sheet 2, a height of the region 30a positioned on the plurality of contactors 3 is higher than a height of a peripheral region 30b of the region 30a.

FIG. 25 is an enlarged cross-sectional view showing a state that contactors and pads of a wafer are contacted to each other by using the thin-film sheet 31 shown in FIG. 23. As shown in FIG. 25, at the probe inspection step (see FIG. 1), the electrical inspection for the semiconductor integrated circuit is performed after the above-described sheet stretching step by contacting the tips of the plurality of contactors 3 of the thin-film sheet 31 to the plurality of pads 11 of the wafer WH, respectively. At the probe inspection step, when the contactors 3 in the thin-film sheet 31 including the region 30a protruding outer than its periphery are contacted to the pads 11, a part of the elastomer 4c arranged on the region 30a flows (moves) to the periphery of the region 30a as shown in FIG.

25 with arrows 51, and the elastomer 4c on the contactors 3 is thinned. As a result, in the protruding region 30a on the contactors 3, a reaction force from the elastomer 4c is increased, and the transmitted load per a unit area is increased. An amount of the transmitted load is changed depending on a difference in the height between the region 30a and its peripheral region. For example, if the difference in the height between the region 30a and its peripheral region is large, the flowing amount of the elastomer 4c which flows to the peripheral region is increased, and the transmitted load is increased. On the other hand, if the difference in the height between the region 30a and its peripheral region is small, the flowing amount of the elastomer 4c which flows to the peripheral region is decreased, and the transmitted load is decreased. Here, it can be considered that, if areas of the regions 30a and the differences in the height from the peripheral regions on all of the contactors 3 are uniformed, the load transmitted to the regions 30a on the contactors 3 can be uniformed. However, from a viewpoint of a processing accuracy or since the limitation of the contactors 3 and the wirings 23 is increased on the arranging layout, it is difficult to uniform the areas of the regions 30a and the differences in the height from the peripheral regions on all of the contactors 3. Therefore, depending on the variation in the difference in the height between the region 30a arranged on each contactor 3 and the peripheral region, the contact pressure of the contactor 3 and the pad 11 is varied. Such variation in the contact pressure of the contactor 3 caused by the differences in the height in the rear surface 2b is also caused in, for example, the region where the plurality of contactors 3 are arranged at an equal interval. And, as explained in the above-described first embodiment, if the variation in the contact pressure is large, the contact resistance is not uniformed, and the precise electrical inspection cannot be performed.

Next, the inventors of the present application have thought that the cause of the above-described problem is due to low flatness of the rear surface 2b, and have studied another mode shown in FIG. 57. A thin-film sheet 101 shown in FIG. 57 is different from the thin-film sheet 31 shown in FIG. 25 in a point that the rear surface 2b is flattened by forming a polyimide film 102 in the most upper layer including the rear surface 2b thicker than the polyimide film 25 in the lower layer. The polyimide resin forming the polyimide film 102 is a more flexible material than a metal material, and therefore, by forming the thick film, the uneven surface along the metal patterns in the lower layer can be improved. That is, the rear surface 2b can be flattened. However, according to the study of the inventors made by the present application, the present inventors have newly found out that, even when the thin-film sheet 101 is used, the variation in the contact pressure between the contactors 3 and the pads 11 is caused.

It is considered that a cause of the variation is due to the following reason. That is, by flattening the rear surface 2b, the amount of the transmitted load per the unit area in the rear surface 2b can be uniformed. However, the reason is that the amount of the transmitted load to each contactor 3 is varied by the layout of the contactors 3 and the wirings 23 of the thin-film sheet 101. As described above, the plurality of contactors 3 are formed on the principal surface 2a side so as to be arranged at the positions facing the pads 11 of the wafer WH which is the inspection target. And, the aligning patterns of the plurality of pads 11 of the wafer WH are determined by a demand on a circuit formed in a chip region or others, and therefore, all of the pads are not always arranged at an equal interval. Therefore, all of the plurality of contactors 3 formed on the principal surface 2a of the thin-film sheet 101 are not always arranged at an equal interval, either. For example, in some cases, one contactor group 3A (see FIG. 27 described later) includes: a region (dense-arrangement region) where the contactors 3 adjacent to each other are arranged at a first interval; and a region (dispersive-arrangement region) where the contactors are arranged at a second interval wider than the first interval. Also, for example, in one contactor group 3A, on one adjacent side of the contactor 3 arranged at an end portion of the contactor group 3A, another contactor 3 is arranged. However, on the other adjacent side thereof, a contactor 3 is not arranged. As described above, the contact pressures of the contactor 3 arranged in the dispersive-arrangement region and the contactor 3 arranged at the end portion of the contactor group 3A are higher than those of the contactors 3 arranged in the dense-arrangement region. This is because, in the dispersive-arrangement region or at the end portion of the contactor group 3A, it is difficult to disperse the transmitted load onto the periphery of the contactors 3, and therefore, the transmitted load to one contactor 3 is larger than that in the dense-arrangement region. In this manner, the present inventors have newly found out that, the variation in the contact pressure cannot be sufficiently suppressed by only flattening the rear surface 2b of the thin-film sheet 101.

Figure 26:
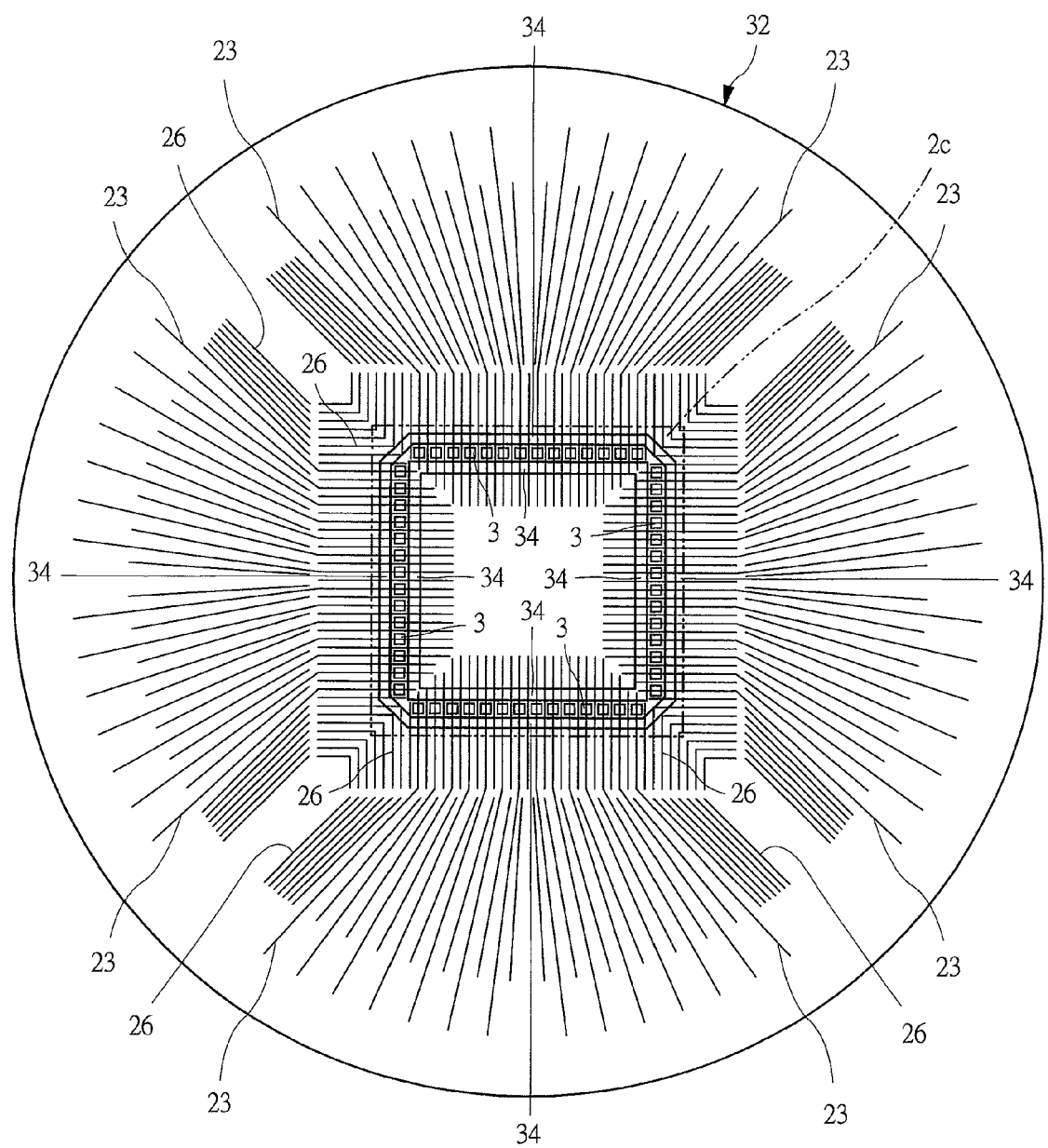
FIG. 26 is a plan view showing an outline of a wiring layout of a thin-film sheet which is a modification example of FIG. 8.
Figure 27:
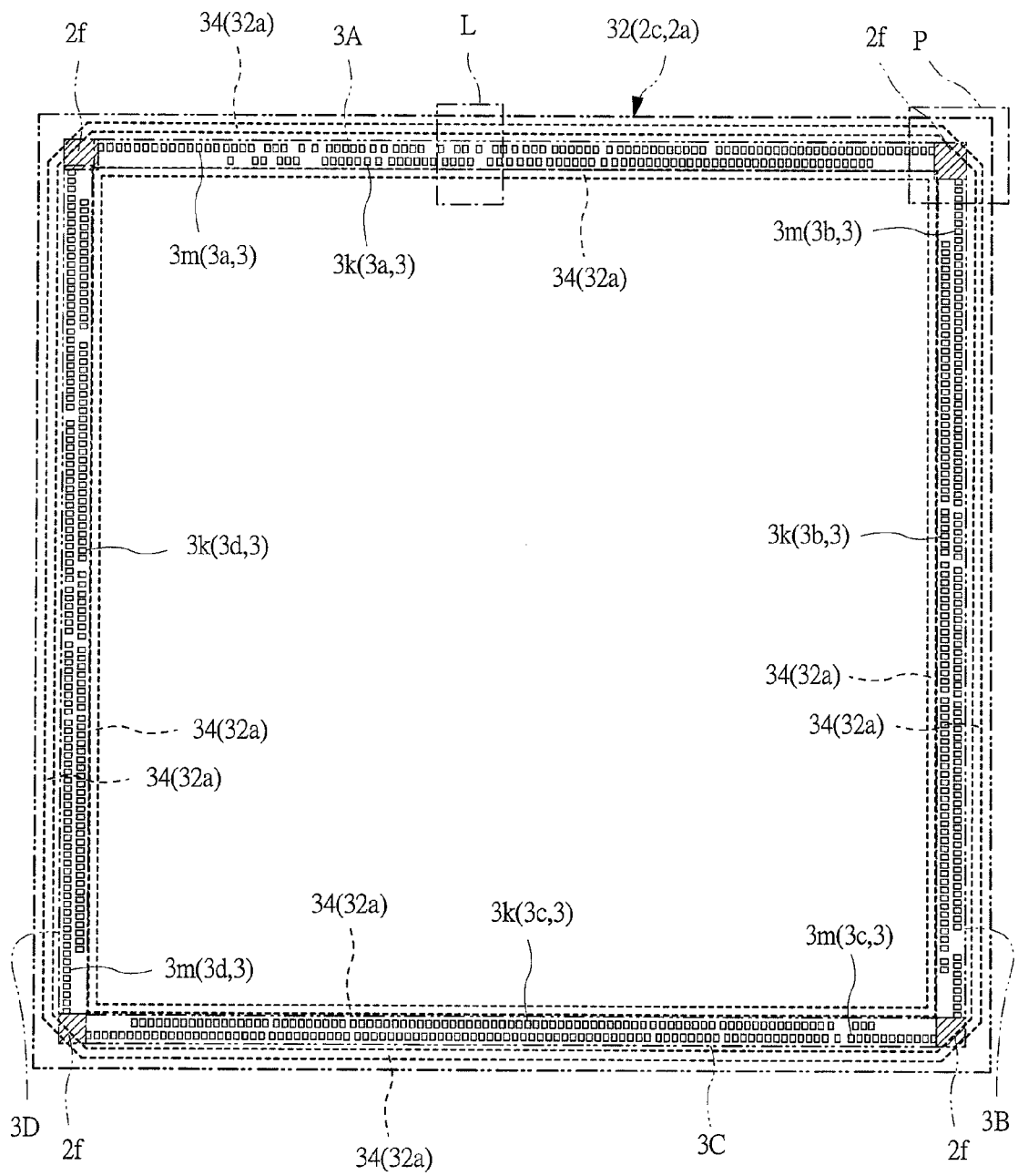
FIG. 27 is an enlarged plan view of a contactor arrangement region shown in FIG. 26.
Figure 28:
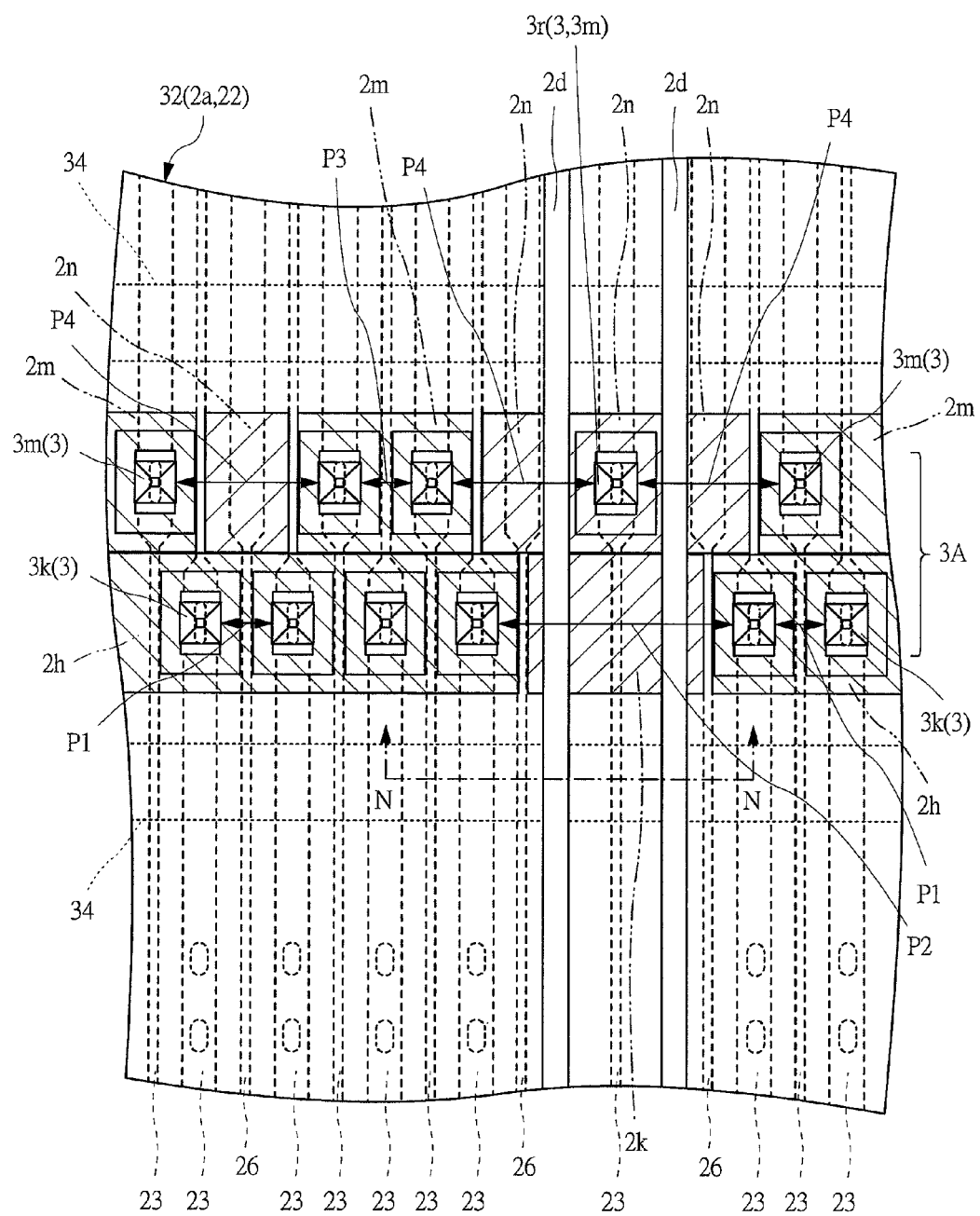
FIG. 28 is an enlarged plan view of an L portion of FIG. 27.
Figure 29:
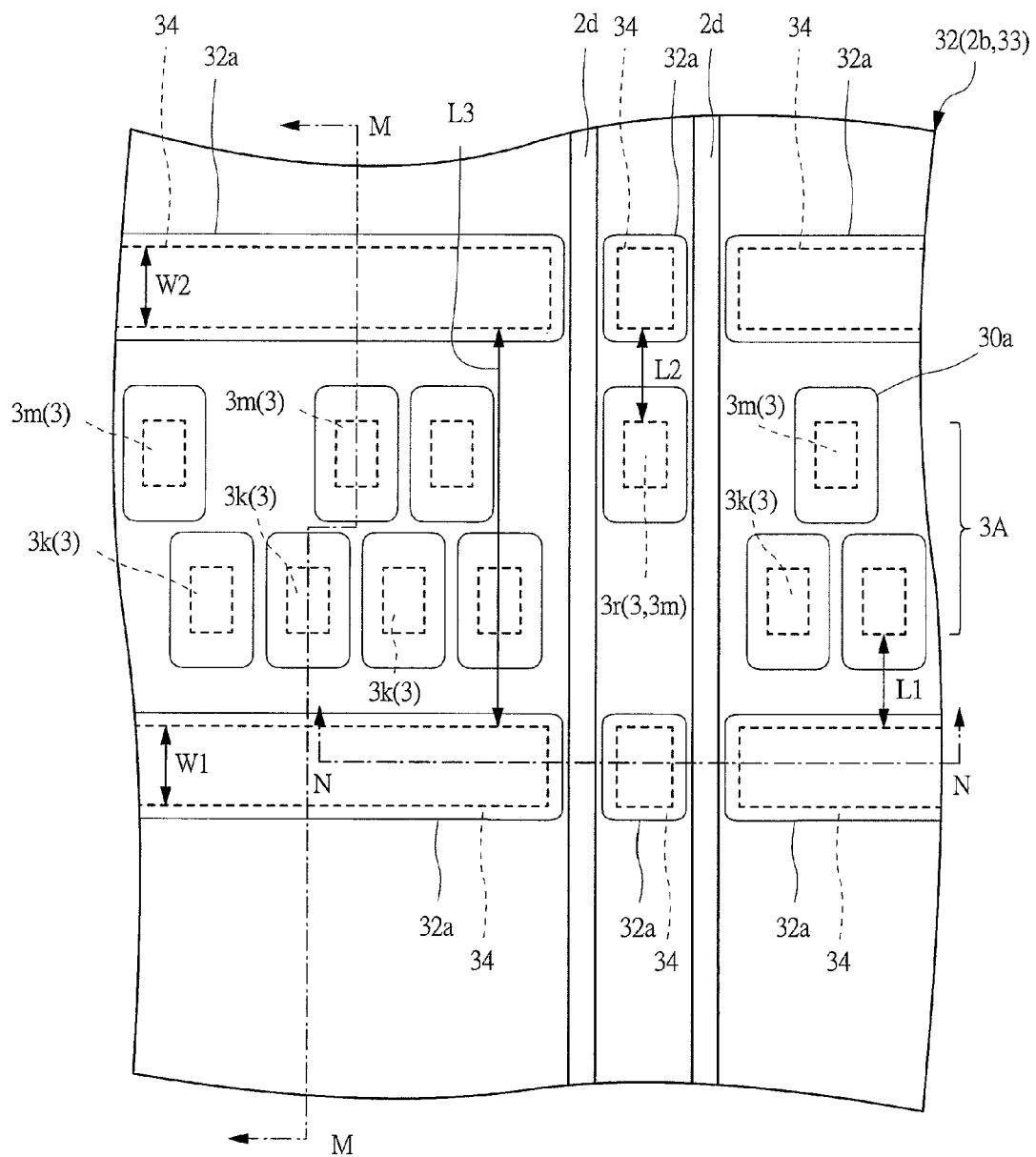
FIG. 29 is an enlarged plan view showing a rear surface side of a thin-film sheet shown in FIG. 28.
Figure 30:
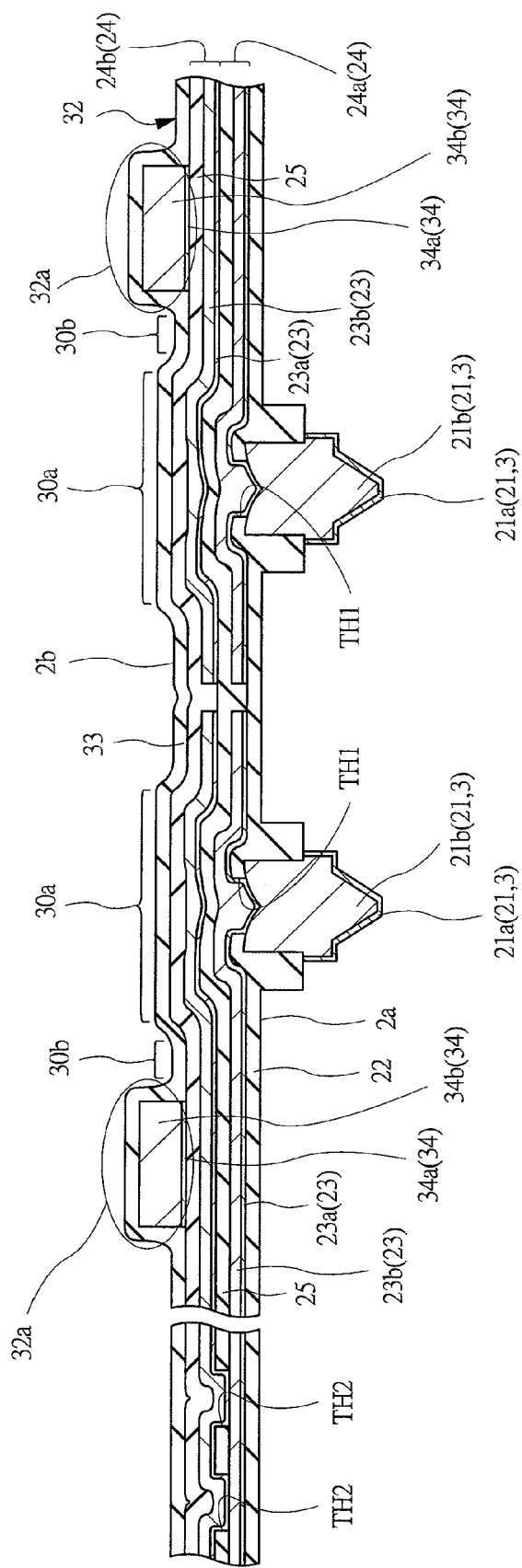
FIG. 30 is an enlarged cross-sectional view taken along line M-M of FIG. 29.

In consideration of the above problems, the inventors of the present application have studied a technique of suppressing the variation in the contact pressure of each of the plurality of contactors 3, and have found out a configuration of the present embodiment. Hereinafter, with reference to FIGS. 26 to 30, a structure of a thin-film sheet 32 will be explained. FIG. 26 is a plan view showing an outline of the wiring layout of a thin-film sheet which is a modification example of FIG. 8, and FIG. 27 is an enlarged plan view of a contactor arrangement region shown in FIG. 26. FIG. 28 is an enlarged plan view of an L portion of FIG. 27, FIG. 29 is an enlarged plan view showing the rear surface side of the thin-film sheet shown in FIG. 28, and FIG. 30 is an enlarged cross-sectional view taken along line M-M of FIG. 29. Note that a technique described below can be applied to both of a case that the plurality of contactors 3 are arranged in one row as explained in the above-described first embodiment and a case that the plurality of contactors 3 are arranged in a plurality of rows as explained in the above-described second embodiment. In the present embodiment, as a representative example, a mode applied to the thin-film sheet in which the contactors 3 are arranged in the plurality of rows as described in the second embodiment will be explained. Also, in the present embodiment, the structures of the wafer which is the target of the electrical inspection and the chip region are the same as the wafer WH shown in FIG. 2 and the chip region 10a shown in FIG. 19 explained in the above-described second embodiment, and therefore, their illustrations are omitted.

The thin-film sheet 32 of the present embodiment and the thin-film sheet 31 (see FIG. 23) explained in the above-described second embodiment are different in a point that, for example, a protruding portion 32a including a higher surface than a height of the region 30a is formed adjacent to the region 30a in the rear surface 2b of the thin-film sheet 32.

In the explanation with reference to FIG. 30, the thin-film sheet 32 includes a polyimide film (insulating film) 33 including the rear surface 2b. The polyimide film 33 is arranged on the wiring layer 24. More specifically, the polyimide film is arranged so as to cover the wiring layer 24a (polyimide film 25) which is the upper layer. Also, a belt member 34 shaped in belt is arranged between the upper-layer wiring layer 24a (polyimide film 25) and the polyimide film 33. And, the polyimide film 33 covering an upper surface of the upper-layer polyimide film 25 is formed along a pattern of each member arranged in a lower layer than the polyimide film 33, and therefore, a periphery of a region overlapped with the belt member 34 of the polyimide film 33 is protruded upper than other region to provide the protruding portion 32a. That is, the thin-film sheet 32 shown in FIG. 30 has a structure that the belt members 34 and the polyimide films 33 are further stacked on the wiring layer 24a of the thin-film sheet 31 shown in FIG. 23. The protruding portion 32a formed along the belt member 34 is higher than the region 30a on the contactor 3. In other words, in the rear surface 2b of the thin-film sheet 32, the plurality of regions 30a positioned above the plurality of contactors 3 are lower than the protruding portions 32a and are higher than the regions 30b between each of the plurality of regions 30a and each protruding portion 32a.

Also, as shown in FIG. 29, the belt members 34 and the protruding portions 32a formed along the belt members are arranged on both adjacent sides of the contactor group 3A in a plan view so as to be extended along the extending direction (aligning direction) of the contactor group 3A. The belt member 34 and the protruding portion 32a are not formed in a region where the belt member 34 and the protruding portion 32a are overlapped with the slit 2d in a plan view. In other words, the belt member 34 and the protruding portion 32a are divided by the slit 2d in the region where the belt member 34 and the protruding portion 32a are overlapped with the slit 2d in the plan view. Note that, although an illustration by an enlarged view is omitted, the belt member 34 and the protruding portions 32a formed along the belt member are formed on both adjacent sides of each of the contactor groups 3A, 3B, 3C, and 3D shown in FIG. 27 and along the extending direction of each of the contactor groups 3A, 3B, 3C, and 3D. In this manner, the protruding portion 32a can be further exactly interposed in the load transmission path reaching from the pressing portion 4 (see FIGS. 31 and 32 described later) to the contactor 3. Note that, in FIG. 29, the wirings 23 shown in FIG. 28 are not shown in order to easily understand the positional relation between the slit 2d and the belt member 34.

Figure 31:
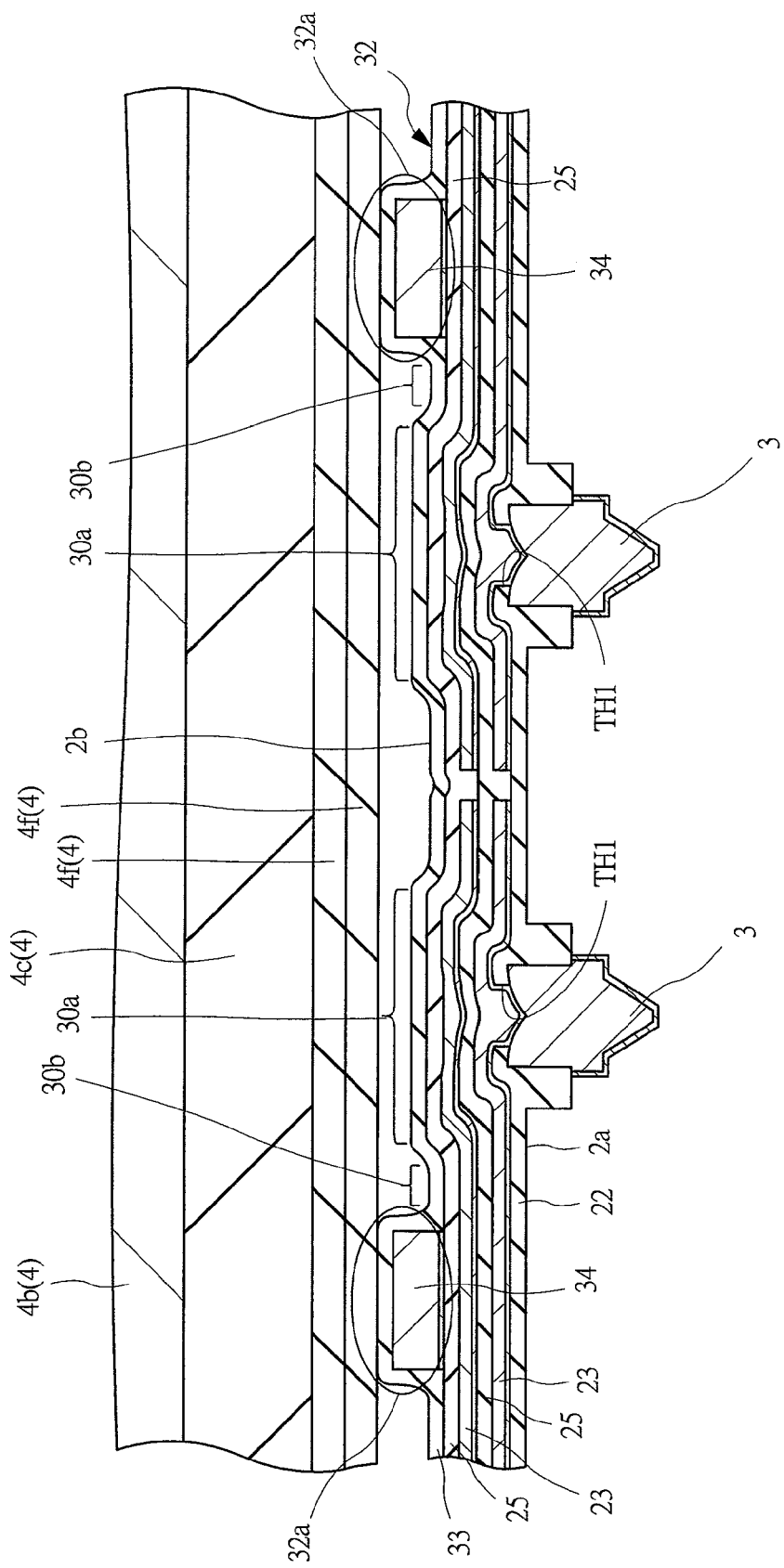
FIG. 31 is an enlarged cross-sectional view showing a pressing start state from a rear surface of a thin-film sheet shown in FIG. 30.
Figure 32:
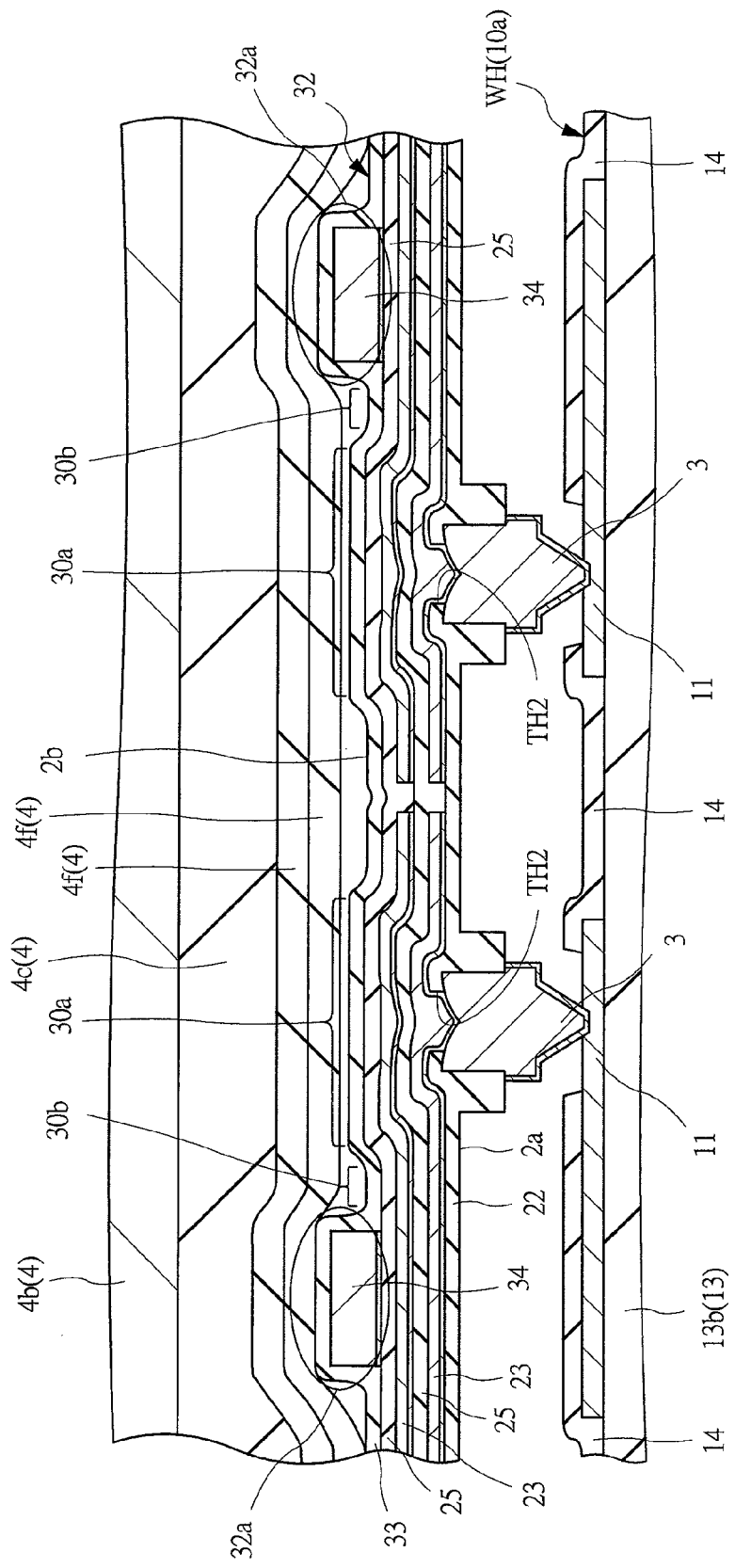
FIG. 32 is an enlarged cross-sectional view showing a state that contactors and pads of a wafer are contacted to each other by using a thin-film sheet shown in FIG. 30.
Figure 33:
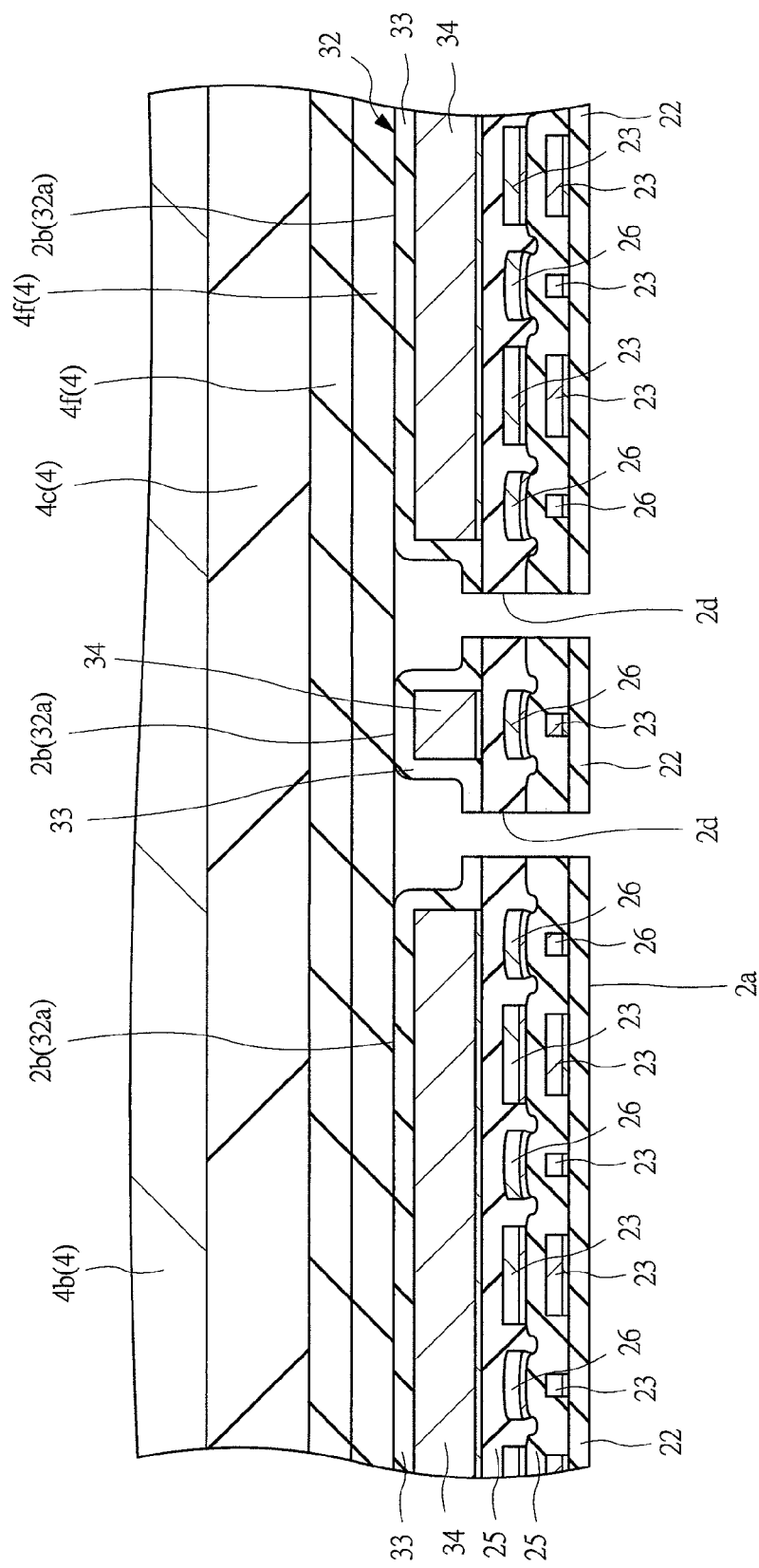
FIG. 33 is an enlarged cross-sectional view showing a state that contactors and pads of a wafer are contacted to each other in a cross-sectional surface taken along line N-N of FIG. 29.

Next, an operation in the case of performing the probe inspection step shown in FIG. 1 with using the thin-film sheet 32 will be explained. FIG. 31 is an enlarged cross-sectional view showing the state that the pressing is started from the rear surface of the thin-film sheet shown in FIG. 30, and FIG. 32 is an enlarged cross-sectional view showing a state that contactors and pads of a wafer are contacted to each other by using the thin-film sheet shown in FIG. 30. FIG. 33 is an enlarged cross-sectional view showing a state that contactors and pads of a wafer are contacted to each other in a cross-sectional surface taken along line N-N of FIG. 29. First, as the sheet stretching step explained in the above-described first embodiment, the rear surface 2b side (see FIG. 30) of the contactor arrangement region 2c of the thin-film sheet 32 shown in FIG. 26 is pressed by the pressing portion shown in FIG. 6 to push the contactor arrangement region 2c of the thin-film sheet 32 downward, so that the thin-film sheet 32 is spread along the pressing portion without loosening. At this time, as shown in FIG. 31, in the rear surface 2b, an upper surface of the protruding portion 32a arranged at the highest position and the pressing portion 4 (more specifically, a lower surface of the polyimide sheet 4f arranged in the most lower layer) are in close contact to each other. By further pressing after the close contact of the upper surface of the protruding portion 32a to the pressing portion 4, the polyimide sheet 4f of the pressing portion 4 is deformed along a shape of the protruding portion 32a, and the polyimide sheet 4f above the protruding portion 32a is embedded into the elastomer 4c which is more flexible than the protruding portion 32a and the polyimide sheet 4f. In other words, a part of the elastomer 4c above the protruding portion 32a flows to (is deformed in) a periphery of the protruding portion 32a. On the other hand, a region between two protruding portions 32a is positioned lower than the protruding portions 32a, and therefore, the deformation due to the flow of the elastomer 4c above the contactors 3 can be suppressed. Therefore, the pressing force applied from the pressing portion 4 to the thin-film sheet 32 is the largest above the protruding portion 32a, and the pressing force applied to the region 30a above the contactor 3 sandwiched between the protruding portions 32a is smaller than that above the protruding portion 32a. For example, as shown in FIG. 32, in some cases, a space is formed between the region 30a and the polyimide sheet 4f.

At the electrical inspection step shown in FIG. 1, as shown in FIG. 32, the plurality of contactors 3 and the pads 11 are contacted to each other. At this time, to the thin-film sheet 32, the load (contact load) is further applied from the pressurizing portion 5 (see FIG. 6) via the pressing portion 4. Similarly to the above-described pressing force, a magnitude of the contact load is the largest above the protruding portion 32a, and the contact load applied to the region 30a above the contactor 3 sandwiched between the protruding portions 32a is smaller than those above the protruding portions 32a. That is, the load (contact load) applied to the thin-film sheet 32 is mainly received from the pressing portion 4 to the protruding portion 32a, and is transmitted to the contactor 3 via the protruding portion 32a. In other words, the load applied to the thin-film sheet 32 is not transmitted from the region 30a above the contactor 3 to the contactor 3 in a direction orthogonal to the rear surface 2b, and is transmitted from the protruding portion 32a arranged adjacent to the region 30a to the contactor 3 in a direction oblique to the rear surface 2b. Therefore, even when the region 30a above the contactor 3 is protruded compared with its periphery, the variation in the transmitted load to the contactors 3 can be decreased. In this manner, by arranging the protruding portion 32a so as to be distant from the contactor 3 in a plan view, the variation in the transmitted load to the contactors 3 can be decreased, and the contact pressure of each contactor 3 can be uniformed.

Also, as shown in FIG. 29, the protruding portion 32a is arranged so as to be extended along the extending direction (aligning direction) of the contactor group 3A where the plurality of contactors 3a are arranged. Therefore, for example, as shown in FIG. 33, entire upper surfaces (rear surface 2b) of the protruding portions 32a continuously formed over the plurality of wirings 23 are in close contact to the polyimide sheet 4f which is the pressing tool of the pressing portion 4. That is, by the entire protruding portions 32a extended along the extending direction (aligning direction) of the contactor group 3A (see FIG. 11), the load transmitted from the pressing portion 4 is received. And, the load transmitted to the protruding portions 32a is dispersed and transmitted onto the plurality of contactors 3 sandwiched between the two protruding portions 32a. That is, the variation in the contact pressure of each of the plurality of contactors 3 sandwiched between the two protruding portions 32a can be decreased. For example, in FIG. 29, the load from the two protruding portions 32a arranged on both adjacent sides of each of the contactors 3 is dispersed and transmitted onto each of the plurality of contactors 3 (seven or three contactors 3k and 3m in a range shown in FIG. 29) arranged in the dense-arrangement region. In this manner, the contact pressure of each of the contactors 3 can be uniformed. That is, the contact pressure of the contactor 3 arranged in the dispersive-arrangement region and the contact pressure of the contactor 3 arranged in the other region (for example, dense-arrangement region) can be uniformed. As a result, the failure at the electrical inspection step caused by the variation in the contact pressure of each of the plurality of contactors 3 can be prevented or suppressed. For example, since the load is dispersed and transmitted onto the plurality of contactors 3, the conduction failure (open failure) due to the extreme low transmitted load to a part of the contactors 3 can be prevented or suppressed. Also, for example, since the load is dispersed and transmitted onto the plurality of contactors 3, the damages of the pads 11, the insulating film 13b (see FIG. 3), and the semiconductor integrated circuit due to the extreme high transmitted load to a part of the contactors 3 can be prevented or suppressed. For example, when the electrical inspection for the wafer WH with using the above-described Low-k insulating film as the insulating film 13b is performed, it is required to set the contact pressure of each of the contactors 3 to be low. For example, it is set that the transmitted load in the contact to each of the contactors 3 is about $5 \times 10^{-3}$ N. According to the present embodiment, even when the electrical inspection is performed with such a low load, the margin of the variation in the contact pressure can be reduced, and therefore, the conduction failure and the damage of the wafer WH can be prevented.

Further, as shown in FIG. 29, the protruding portion 32a is not formed in the region where the slit 2d is arranged on an extension of the protruding portion 32a. In other words, the protruding portion 32a is divided by the slit 2d. Therefore, as explained in the above-described first or second embodiment, the load transmission path from the periphery of the contactor 3 whose contact pressure tends to be higher than other regions can be divided by the slit 2d. For example, the load transmitted to the contactor 3r arranged in the dispersive-arrangement region in FIG. 29 can be decreased. Therefore, the contact pressure of the contactor 3r can be uniformed to the same magnitude as the contact pressures of the other contactors 3.

That is, in the present embodiment, by forming the protruding portion 32a on both adjacent sides of the contactor group along the extending direction (aligning direction) of the contactor group, the contact pressures of the contactors 3 arranged in the region sandwiched between the protruding portions 32a can be uniformed. Also, since the protruding portion 32a is not formed in the region where the slit 2d is formed, the contact pressure of the contactor 3r arranged in the dispersive-arrangement region can be uniformed to be the same as the contact pressures of the other contactors 3. As a result, the variation in the contact pressure of each of the plurality of contactors 3 can be decreased.

Figure 34:
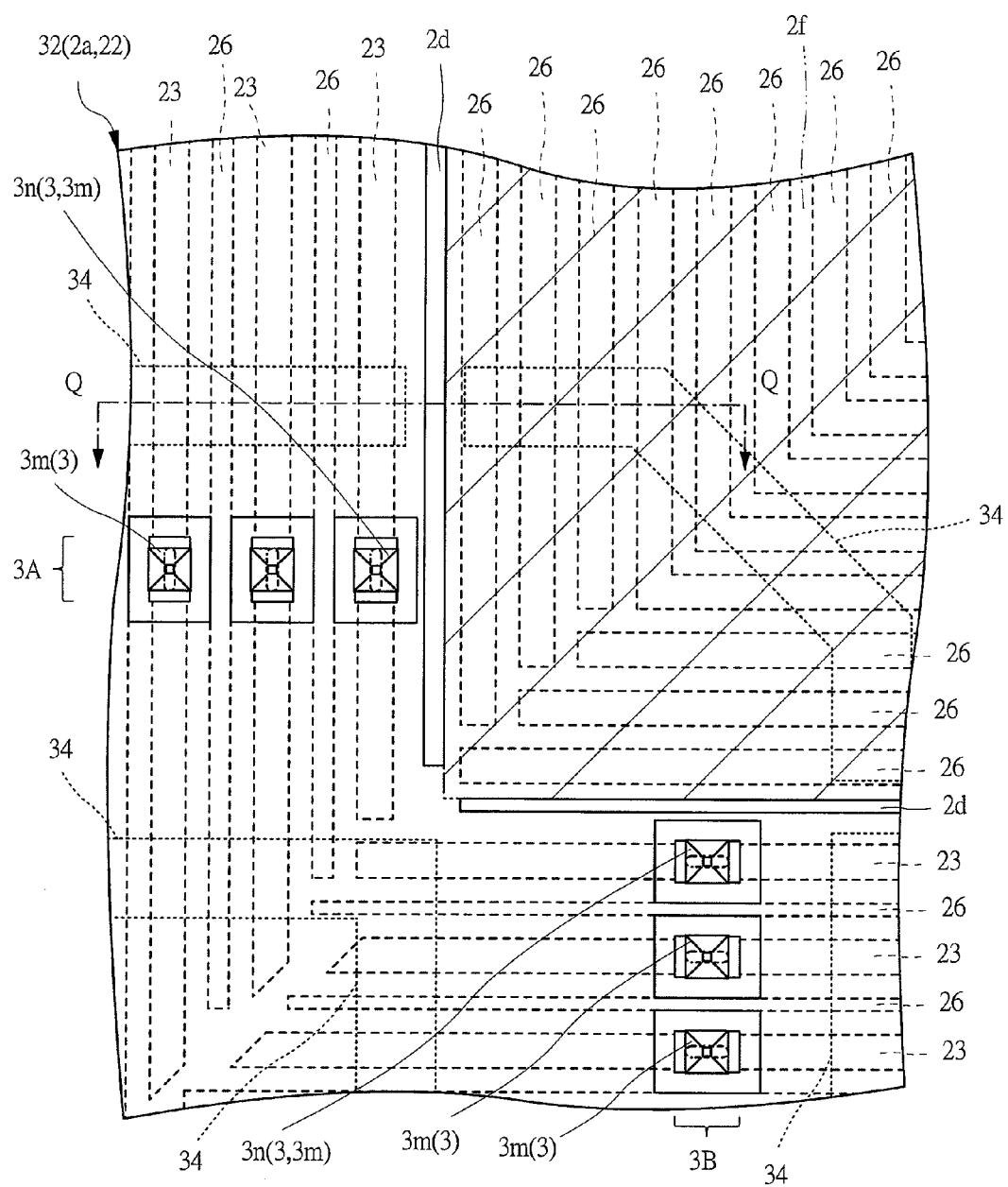
FIG. 34 is an enlarged plan view of a P portion of FIG. 27.
Figure 35:
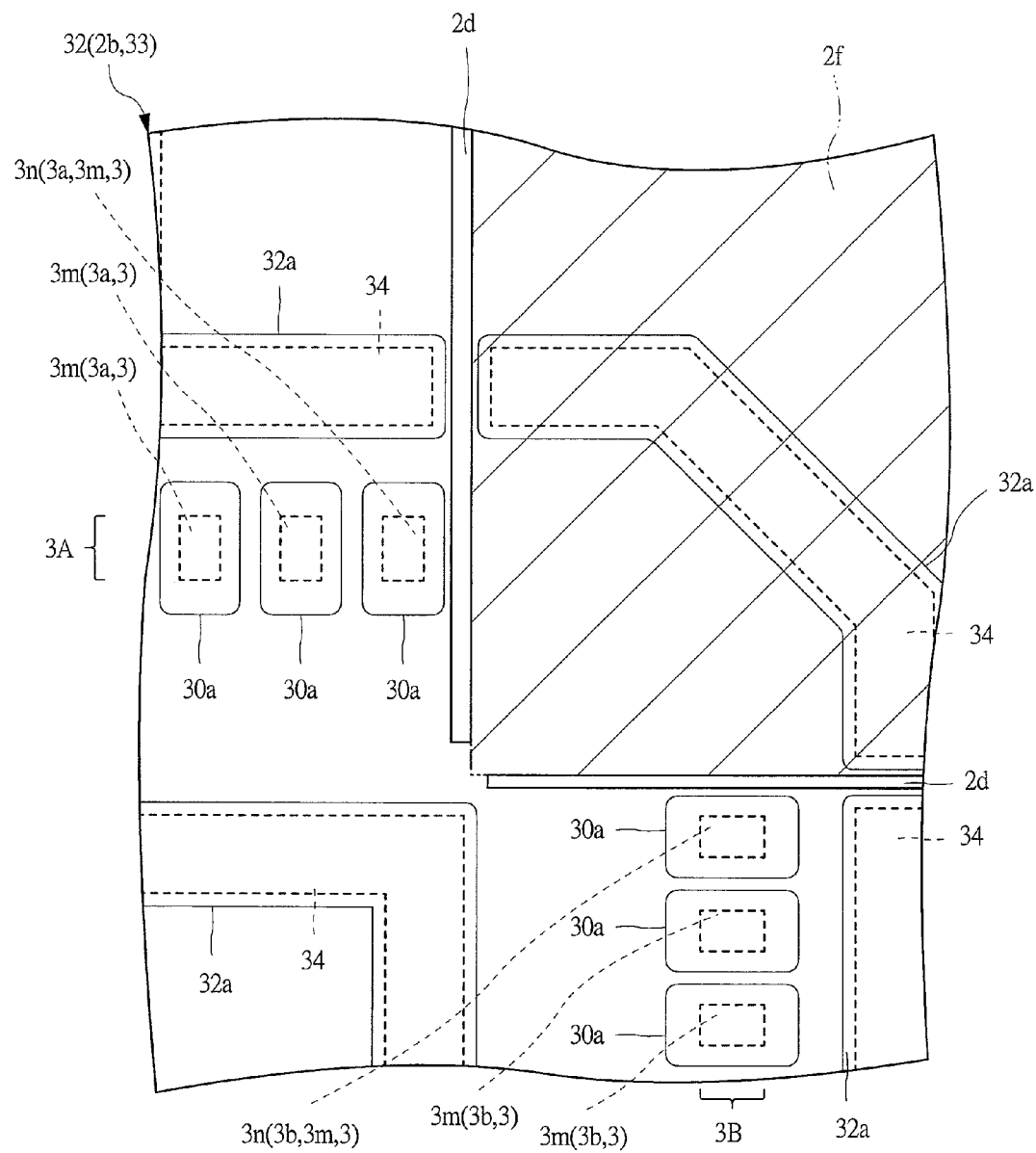
FIG. 35 is an enlarged plan view showing a rear surface side of a thin-film sheet shown in FIG. 34.
Figure 36:
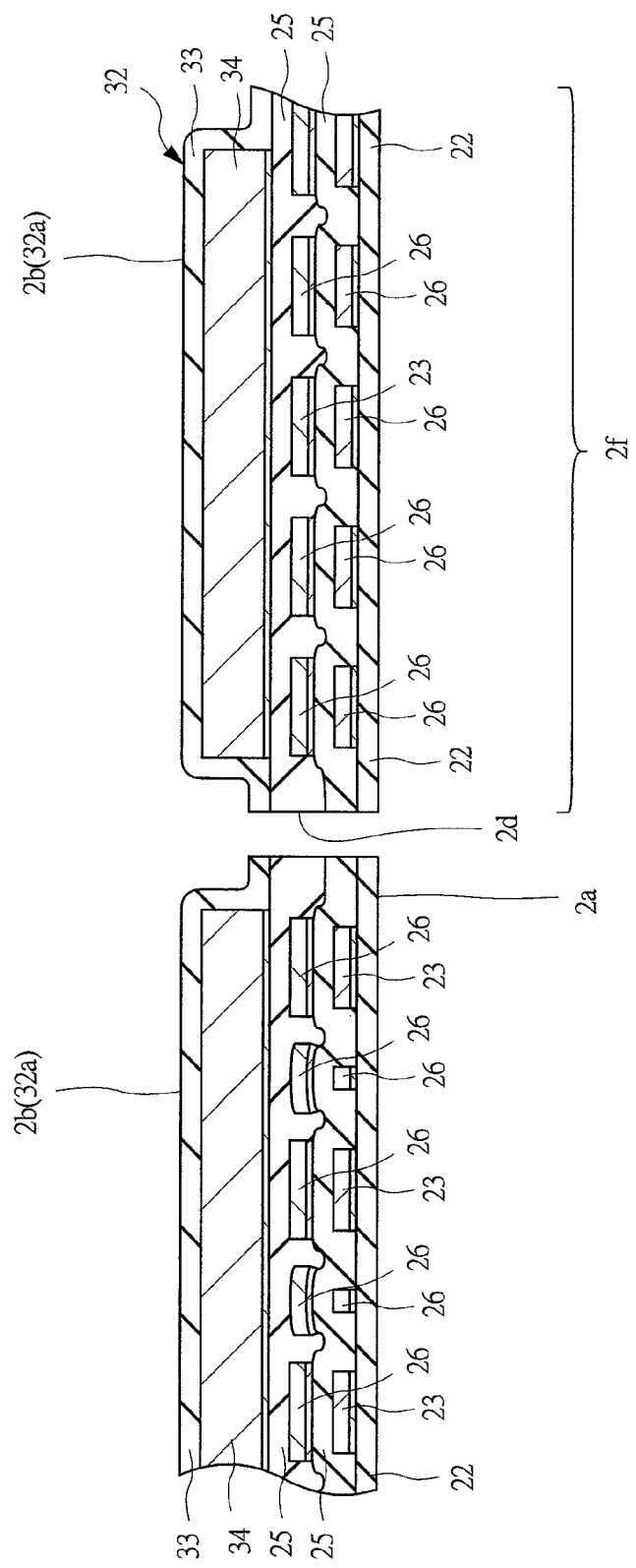
FIG. 36 is an enlarged cross-sectional view taken along line Q-Q of FIG. 34.

Further, in FIGS. 28 to 30, the region in the contactor group where the slit 2d is formed has been explained. However, the belt member 34 and the protruding portion 32a are extended to the end portion of each of the contactor groups 3A, 3B, 3C, and 3D shown in FIG. 27, that is, to the periphery of the corner region 2f of the contactor arrangement region 2c. FIG. 34 is an enlarged plan view of a P portion of FIG. 27, and FIG. 35 is an enlarged plan view showing the rear surface side of the thin-film sheet shown in FIG. 34. And, FIG. 36 is an enlarged cross-sectional view taken along line Q-Q of FIG. 34. Note that, in FIG. 35, in order to easily understand the positional relation between the slit 2d and the belt member 34, the wirings 23 shown in FIGS. 34 and 36 are not shown.

As shown in FIG. 35, the belt member 34 and the protruding portion 32a are extended to the end portion of each of the contactor groups 3A and 3B, that is, to the periphery of the corner region 2f of the contactor arrangement region 2c. Although illustrations by an enlarged view are omitted, as shown in FIG. 27, the belt member 34 and the protruding portion 32a are arranged on both adjacent sides of each of the contactor groups 3A, 3B, 3C, and 3D so as to reach both ends of each of the contactor groups 3A, 3B, 3C, and 3D. As shown in FIG. 35, by extending the belt member 34 and the protruding portion 32a so as to reach the end portions of each of the contactor groups 3A and 3B, the contact pressures of the plurality of contactors 3a and 3b arranged in the contactor groups 3A and 3B can be uniformed. The slit 2d explained in the above-described first or second embodiment is formed between the dummy wiring 26 and the contactor 3e arranged at the end portion of each of the contactor groups 3A and 3B, and the slit 2d includes the opening portion penetrating from one surface among the principal surface 2a and the rear surface 2b of the thin-film sheet 2 to the other surface similarly to FIG. 33 (for example, see FIG. 36).

Also, as shown in FIGS. 35 and 36, the protruding portion 32a is not formed in the region where the slit 2d is formed. In FIG. 35, the belt member 34 and the protruding portion 32a along the belt member are formed also in the corner region 2f. However, the belt member 34 and the protruding portion 32a are divided by the slits 2d. Therefore, the load transmission from the corner region 2f to the contactor 3n arranged at the end portion of each of the contactor groups 3A and 3B can be prevented or suppressed, and therefore, the contact pressure of the contactor 3n arranged at the end portion can be uniformed to be the same as the contact pressures of the other contactors 3.

Incidentally, as shown in FIG. 27, in the contactor arrangement region 2c shaped in quadrangle in a plan view, the belt member 34 and the protruding portion 32a are formed inner than each of the contactor groups 3A, 3B, 3C, and 3D and outer than each of the contactor groups 3A, 3B, 3C, and 3D. And, as shown in FIG. 35, the belt member 34 and the protruding portion 32a arranged outside are overlapped with the region where the slit 2d is formed in the plan view, and therefore, are divided by the slit 2d. On the other hand, the belt member 34 and the protruding portion 32a arranged inside not overlapped with the region where the slit 2d is formed in the plan view, and therefore, are not divided by the slit 2d. As shown in FIG. 34, in order to avoid intersection with the plurality of wirings 23 connected to the respective contactor groups and with other slits 2d, the slit 2d extending from each of the contactor groups 3A and 3B toward the inside (center direction) of the contactor arrangement region 2c (see FIG. 27) is shorter than the slit 2d extending from each of the contactor groups 3A and 3B toward the outside (outer edge direction) of the contactor arrangement region 2c. Therefore, as shown in FIG. 35, the belt member 34 and the protruding portion 32a arranged inside are not overlapped with the region where the slit 2d is formed in the plan view. In such a case, as shown in FIG. 35, the inside belt member 34 arranged along the contactor group 3A and the inside belt member 34 arranged along the contactor group 3B may be jointed with each other. More particularly, as shown in FIG. 35, when the lengths of the contactor groups 3A and 3B are long and the inside belt members 34 arranged along them are overlapped with each other, it is preferred to joint them from a viewpoint of dispersing the load.

<Preferred Mode of Peripheral Structure of Protruding Portion>

Next, a preferred mode of the periphery of the protruding portion 32a shown in FIGS. 27 to 35 will be explained.

First, in the present embodiment, in a plan view as shown in FIG. 29, the protruding portion 32a is arranged on both adjacent sides of the contactor group 3A so as to be extended along the contactor group 3A. As a modification example of FIG. 29, a mode (whose illustration is omitted) in which the protruding portion 32a is arranged in either one of the both adjacent sides of the contactor group 3A can be employed. In this case, the protruding portion 32a is arranged at a higher position than the region 30a above the contactor 3, and therefore, the flowing amount of the elastomer 4c (see FIG. 32) above the region 30a can be decreased less than, for example, that of the thin-film sheet 100 shown in FIG. 13. Also, by extending the protruding portion 32a along the extending direction (aligning direction) of the contactor group 3A, the transmitted load to the protruding portion 32a can be dispersed onto the plurality of contactors 3 arranged adjacent to the protruding portion 32a. Therefore, the variation in the contact pressure of each of the contactors 3 can be decreased lower than that of the comparative example shown in FIG. 13. However, from the viewpoint of exactly interposing the protruding portion 32a into the load transmission path from the pressing portion 4 (see FIG. 32) to the contactor 3, as shown in FIG. 29, it is preferred to arrange the protruding portion 32a on both adjacent sides of the contactor group 3A. More particularly, when the contactors 3 are arranged in the plurality of rows in one contactor group 3A as shown in FIG. 29, there is a concern of the variation in the contact pressure of each of the contactors 3 in a row distant from the protruding portion 32a, and therefore, it is preferred to arrange the protruding portion 32a on both adjacent sides of the contactor group 3A.

Also, from the viewpoint of further exactly interposing the protruding portion 32a into the load transmission paths from the pressing portion 4 (see FIG. 32) to the contactor 3, it is preferred that the protruding portion 32a is harder (difficulty deformable more) than the elastomer 4c and the polyimide sheet 4f. Further, from the viewpoint of improving the dispersibility of the load received by the protruding portion 32a to the plurality of contactors 3, it is preferred that the protruding portion 32a have a rigidity higher than that of the polyimide films 25 and 26 (see FIG. 30). In order to satisfy such a condition, in the present embodiment, the belt member 34 formed of a metal film is formed between the polyimide film 33 and the polyimide film 25 as shown in FIG. 30, and the protruding portion 32a is formed along the belt member 34. The belt member 34 is made of the same material as the wiring 23. That is, the belt member 34 is a stacked film obtained by sequentially stacking a metal film 34a and a metal film 34b from a lower layer. The metal film 34a is a base metal film for forming the belt member 34, and can be formed by sequentially depositing, for example, a chromium film having a film thickness of about 0.1 μm and a copper film having a film thickness of about 1 μm by a sputtering method or a vapor deposition method. Also, the metal film 34b is a main metal film for ensuring a necessary film thickness for the belt member 34, and can be exemplified by a copper film or a stacked film obtained by sequentially depositing a copper film and a nickel film from a lower layer. In this manner, since the belt member 34 formed of the metal films 34a and 34b is harder (difficulty deformable more) than the elastomer 4c and the polyimide sheet 4f, the protruding portion 32a can be further exactly interposed into the load transmission path from the pressing portion 4 (see FIG. 32) to the contactor 3. Further, since the belt member 34 is formed of the metal films 34a and 34b having the higher rigidity than those of the polyimide films 25 and 26, the dispersibility of the load received by the protruding portion 32a to the plurality of contactors 3 can be improved. Note that, in the present embodiment, the belt member 34 is not electrically connected to the wiring 23 and the contactor 3, and therefore, electrical conductivity is not required for the belt member 34. Therefore, the belt member 34 can be made of, for example, a resin material as long as the material is harder than the elastomer 4c and the polyimide sheet 4f or the material has a higher rigidity than those of the polyimide films 25 and 26. Further, by making the belt member 34 from the material having the higher rigidity than those of the polyimide films 25 and 26, it can be suppressed to wrinkle the thin-film sheet 32 when the thin-film sheet 32 is pressed by the pressing portion 4 (see FIG. 6).

Still further, from a function of dispersing and transmitting the load onto the plurality of contactors 3, for example, the side surface of the belt member 34 (side surface or end surface on the slit 2d side) shown in FIG. 30 can be exposed at the slit 2d from the polyimide film 33. However, by exposing a part of the belt member 34, the belt member 34 is easily corroded. Accordingly, from a viewpoint of preventing this corrosion, as shown in FIG. 30, it is preferred to cover the side surface of the belt member 34 on the slit 2d side arranged adjacent to the slit 2d by the polyimide film 33.

Figure 37:
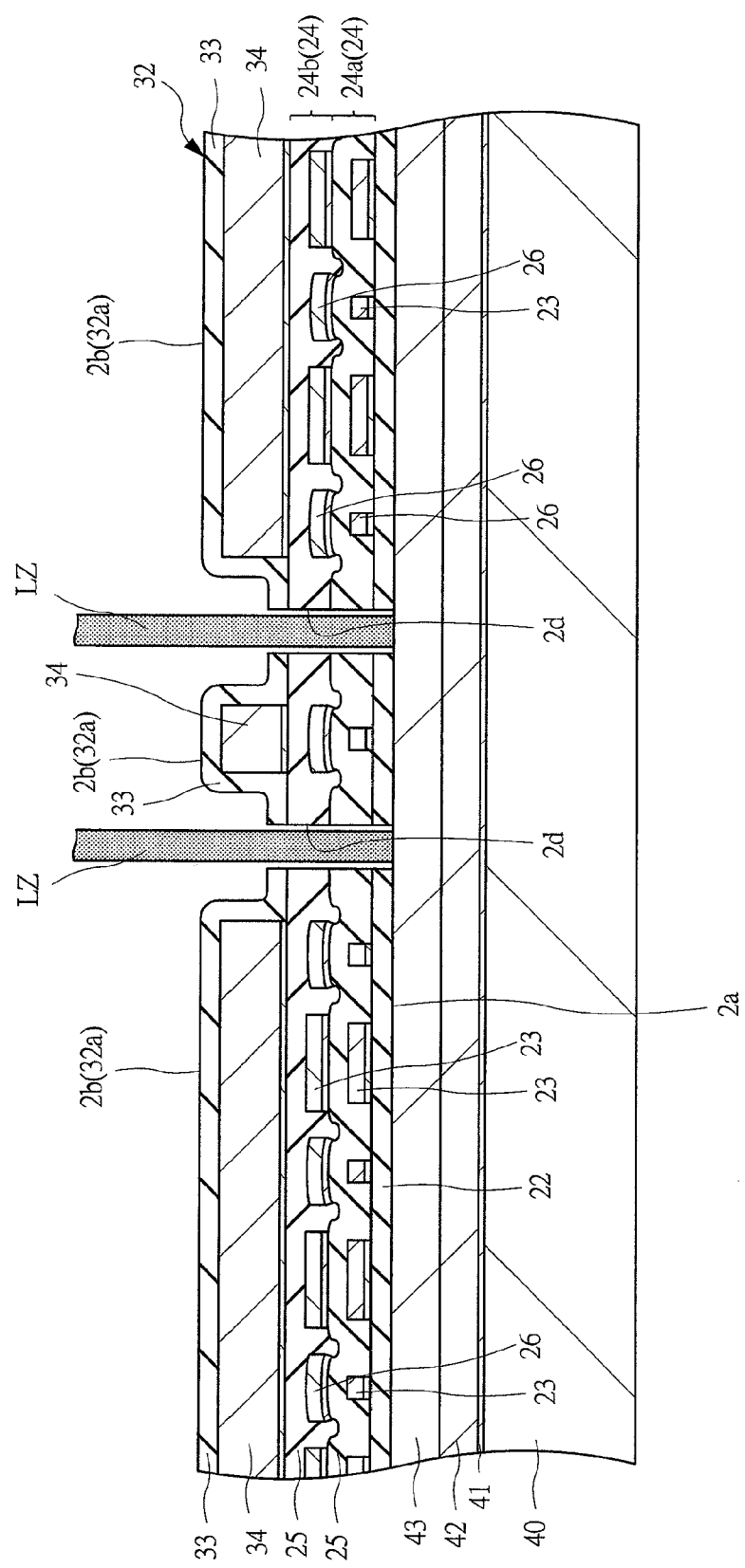
FIG. 37 is an enlarged cross-sectional view showing a modification example of a building step shown in FIG. 17.
Figure 38:
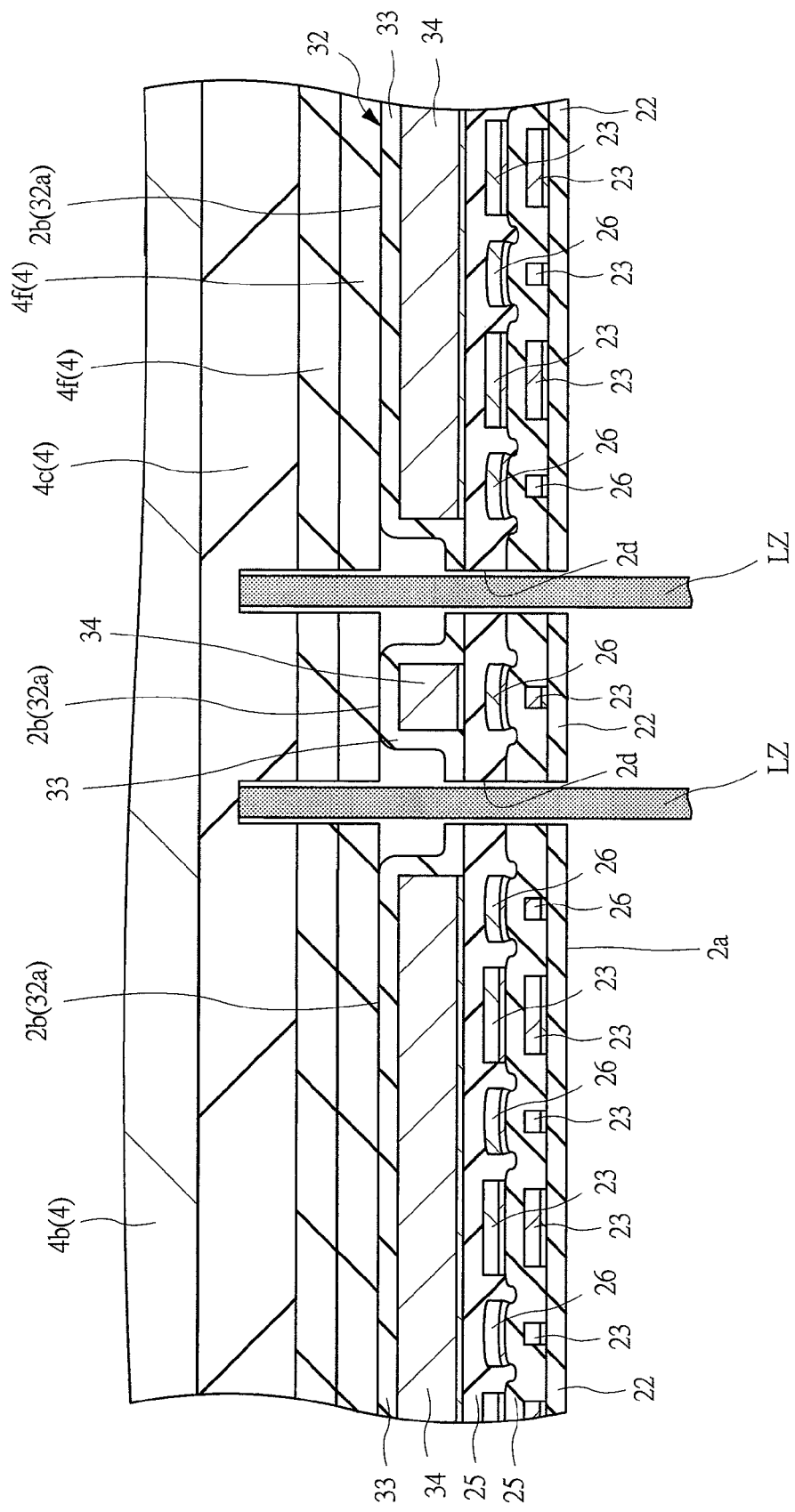
FIG. 38 is an enlarged cross-sectional view showing a modification example of the building step shown in FIG. 18.

Still further, similarly to the above-described embodiments, the slit 2d of the thin-film sheet 32 can be formed by, for example, irradiating the laser beam from one surface among the principal surface 2a and the rear surface 2b of the thin-film sheet 32 toward the other surface (laser irradiation step). However, in the present embodiment, since the belt member 34 made of the metal film is formed, the following mode is preferred. FIG. 37 is an enlarged cross-sectional view showing a modification example of the building step shown in FIG. 17, and FIG. 38 is an enlarged cross-sectional view showing another modification example of the building step shown in FIG. 18. For example, as shown in FIG. 37 which is the modification example of FIG. 17, the wiring layer 24b which is the most upper layer is stacked on the wiring layer 24a, and the belt member 34 formed of the metal films 34a and 34b (see FIG. 30) and the polyimide film 33 covering the belt member are further stacked thereon. Then, before removing the substrate 40, the conductive film 41, and the thin films 42 and 43, the slit can be formed by irradiating the laser beam LZ from the rear surface 2b side of the thin-film sheet 32. Still further, for example, as shown in FIG. 38 which is the modification example of FIG. 18, after connecting and retaining the thin-film sheet 32 to the wiring substrate 1 shown in FIG. 6, the slit can be formed by irradiating the laser beam LZ from the principal surface 2a side in the state that the rear surface 2b side of the thin-film sheet 32 is pressed (the above-described sheet stretching step) to stretch the thin-film sheet 32.

Here, in both cases of FIG. 37 and FIG. 38, it is preferred not to form the belt member 34 in the region to which the laser beam LZ is irradiated, that is, the region where the slit 2d is formed. Even when the belt member 34 made of the metal film is formed in the region to which the laser beam LZ is irradiated, the belt member can be cut by irradiating the region by the laser beam LZ having higher energy than that used for forming the slit 2d in the polyimide films 25 and 33. However, by irradiating the laser beam LZ having the high energy required for cutting the belt member 34 formed of the metal film to the polyimide films 25 and 33, the belt member may be excessively processed in some cases. Accordingly, from a viewpoint of preventing or suppressing the processing failure at the laser irradiation step, it is preferred not to form the belt member 34 in the region to which the laser beam LZ is irradiated, that is, the region where the slit 2d is formed. In order to perform the laser irradiation step in such a mode, for example, in the step of forming the belt member 34 formed of the metal films 34a and 34b (see FIG. 30) in the present embodiment, the belt member 34 is formed in a state that a mask (whose illustration is omitted) is previously arranged in the region where the slit is to be formed. In this manner, by stacking the polyimide film 33 covering the belt member 34 after removing the mask, the thin-film sheet 32 in which the belt member 34 is not formed in the region to which the laser beam LZ is irradiated is obtained as shown in FIGS. 37 and 38. Also, in this manner, as shown in FIG. 30, the side surface of the belt member 34 on the slit 2d side arranged adjacent to the slit 2d is covered by the polyimide film 33.

Note that, according to the building step shown in FIG. 38, similarly to the building step shown in FIG. 18 explained in the above-described first embodiment, an opening portion reaching the polyimide sheet 4f and a part of the elastomer 4c in the laser irradiation region is formed. Also, an opening portion penetrating through the elastomer 4c is formed in some cases.

Figure 39:
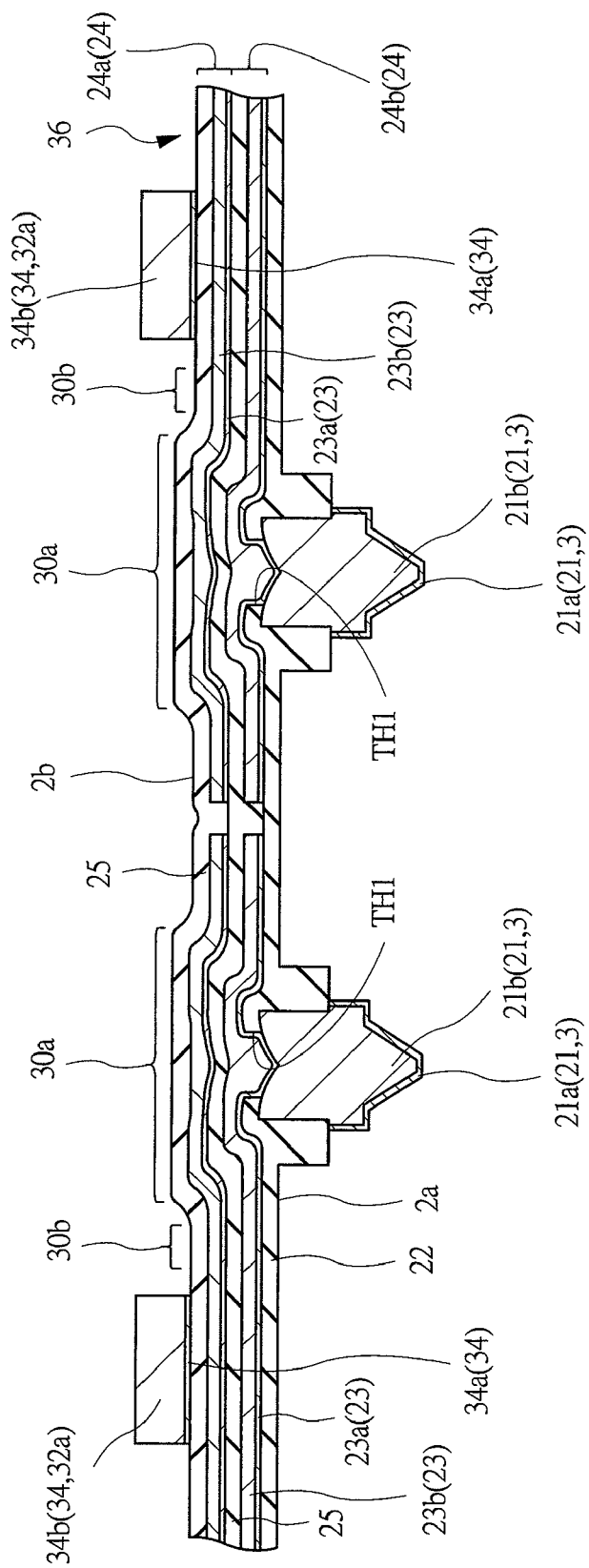
FIG. 39 is an enlarged cross-sectional view showing a modification example of a thin-film sheet shown in FIG. 30.

Further, in FIGS. 30 to 38, the belt member 34 is covered by the polyimide film 33. However, as a thin-film sheet 36 shown in FIG. 39 as a modification example, the belt member 34 can be exposed on the rear surface 2b side of the thin-film sheet 36. FIG. 39 is an enlarged cross-sectional view showing the modification example of the thin-film sheet shown in FIG. 30. In the thin-film sheet 36 shown in FIG. 39, the polyimide film 33 shown in FIG. 30 is not formed, and the upper surface of the polyimide film 25 arranged in the most upper layer is the rear surface 2b of the thin-film sheet 36. In this case, the belt member 34 formed on the polyimide film 25 is the protruding portion 32a. However, from a viewpoint of protecting the belt member 34 and the polyimide sheet 4f (see FIG. 32), as shown in FIG. 30, it is preferred to cover the belt member 34 by the polyimide film 33 as a protective film. For example, the corrosion of the belt member 34 and the peeling off thereof from the polyimide film 25 can be prevented or suppressed. Also, for example, the damage of the polyimide sheet 4f (see FIG. 32) due to direct friction with the belt member 34 can be prevented.

Figure 40:
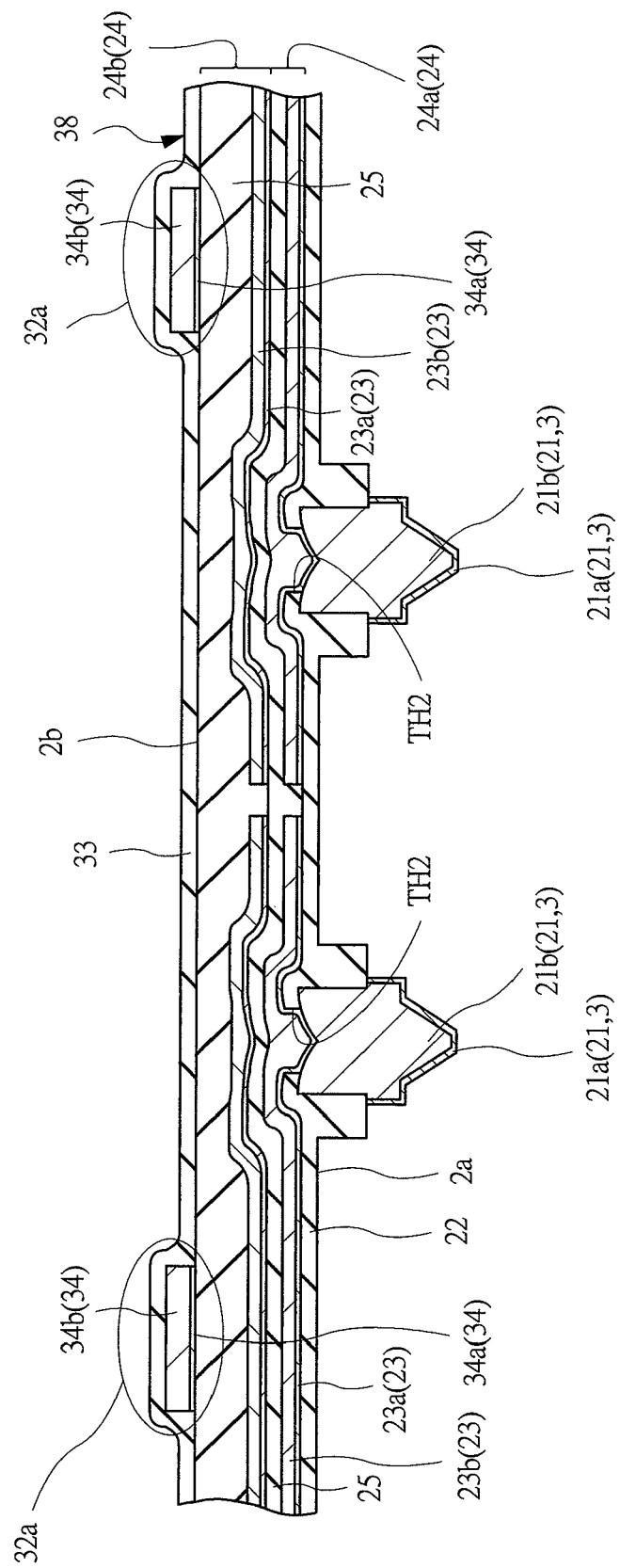
FIG. 40 is an enlarged cross-sectional view showing another modification example of the thin-film sheet shown in FIG. 30.

Still further, FIGS. 30 to 38 exemplify that the region 30a of the rear surface 2b of the thin-film sheet 32 which are above the contactor 3 is higher than the peripheral region 30b. However, like a thin-film sheet 38 shown in FIG. 40 as a modification example, the protruding portion 32a can be formed on the flattened rear surface 2b. FIG. 40 is an enlarged cross-sectional view showing another modification example of the thin-film sheet shown in FIG. 30. According to the thin-film sheet 38 shown in FIG. 40, similarly to the thin-film sheet 32 shown in FIGS. 30 to 38, the load received by the protruding portion 32a are dispersed and transmitted onto the plurality of contactors 3 by forming the protruding portion 32a, and therefore, the variation in the contact pressure of each of the contactors 3 can be decreased.

Further, in order to receive the load by the protruding portion 32a, it is preferred to form a thickness of the protruding portion 32a so that a height of the protruding portion 32a is at the highest position of the rear surface 2b of the contactor arrangement region 2c (see FIG. 9). Therefore, it is preferred to form a thickness of the belt member 34 equal to or larger than a thickness of the wiring 23. More particularly, it is preferred to form the belt member 34 thicker than the wiring 23 as shown in FIG. 30.

Still further, as shown in FIG. 29, when the belt member 34 is arranged on both adjacent sides of the contactor group 3A, it is preferred to set distances between the belt members 34 and the contactor group 3A to be an equal distance in a plan view. For example, in FIG. 29, among two belt members, a distance L1 from the belt member 34 arranged adjacent to one adjacent side of the contactor group 3A to the contactor group 3A is equal to a distance L2 from the belt member 34 arranged adjacent to the other adjacent side of the contactor group 3A to the contactor group 3A. Also, as shown in FIG. 29, the distances L1 and L2 are constant in the extending direction (aligning direction) of one contactor group 3A. In this manner, distances between the plurality of contactors 3 and the protruding portion 32a can be maintained substantially constant, and therefore, the load received by the protruding portion 32a can be dispersed onto the plurality of contactors so as to be well balanced. Further, particularly preferred specific values of the distances L1 and L2 are changed in accordance with sizes (planar dimensions) of the contactors 3. In the present embodiment, the distances L1 and L2 are set to 0.5 times or larger and two times or smaller a width of one contactor 3. For example, when the width of the contactor 3 (in a plan view, a length thereof in the direction orthogonal to the extending direction (aligning direction) of the contactor group 3A) is about 50 μm, the distances L1 and L2 are set to an arbitrary value of about 25 μm or larger and 100 μm or smaller. If the values of the distances L1 and L2 are extremely large, the region 30a of the rear surface 2b which are above the contactor 3 easily receive the load from the pressing portion 4 (see FIG. 32), and a load component without via the protruding portion 32a is generated. On the other hand, if the values of the distances L1 and L2 are extremely small, when the load received by the protruding portion 32a is dispersed onto the plurality of contactors 3, the variation in the dispersibility is easily generated. Therefore, it is preferred to set the distances L1 and L2 to be 0.5 times or larger and two times or smaller the width of one contactor 3.

Still further, as shown in FIG. 29, when the belt member 34 is arranged on both adjacent sides of the contactor group 3A, it is preferred to uniform the belt width of each belt member 34 in a plan view. For example, in FIG. 29, among two belt members 34, a belt width W1 of the belt member 34 arranged adjacent to one adjacent side of the contactor group 3A and a belt width W2 of the belt member 34 arranged adjacent to the other adjacent side of the contactor group 3A are equal to each other. Still further, the belt widths W1 and W2 are constant in the extending direction (aligning direction) of the single contactor group 3A. In this manner, the load amount received by each protruding portion 32a can be the same amount as the other. In order to set the load transmitted from the pressing portion 4 (see FIG. 32) to the plurality of contactors 3 via the protruding portion 32a to be a main load which determines the contact pressure, it is preferred to widen the band widths W1 and W2. In the present embodiment, it is set that the belt widths W1 and W2 are wider than a width of the wiring 23 arranged in the lower layer (see FIG. 10), and is equal to a width of one contactor 3. For example, it is set that, while the wiring width of the wiring 23 shown in FIG. 10 (wiring width in a region extended above the contactor 3) is about 20 to 25 μm, the belt widths W1 and W2 are about 40 to 60 μm. That is, the belt widths W1 and W2 are equivalent to the width of the contactor 3 (in a plan view, a length thereof in the direction orthogonal to the extending direction (aligning direction) of the contactor group 3A). In this manner, by widening the belt widths W1 and W2, the influence of the load transmitted to the plurality of contactors 3 without via the protruding portion 32a can be decreased. Note that the influence of the load transmitted to the plurality of contactors 3 without via the protruding portion 32a can be decreased as long as the belt widths W1 and W2 are equal to or larger than the width of one contactor 3, and therefore, upper limits of the belt widths W1 and W2 are not particularly determined. Therefore, the upper limits can be arbitrarily selected from a viewpoint of, for example, spreading the contactor arrangement region 2c (see FIG. 27) without loosening when the thin-film sheet 32 is pressed by the pressing portion 4 (see FIG. 6), handling at the building step of the thin-film sheet 32 and the probe card PRC (see FIG. 6), or others.

Still further, as shown in FIGS. 28 and 29, in the contactor group 3A, the plurality of contactors 3 are arranged in the plurality of rows (two rows) along the extending direction (aligning direction) of the contactor group 3A. This is because of correspondence to the aligning pattern of the pads 11 (see FIG. 19) in the chip region 10a (see FIG. 19) which is the inspection target. In this manner, when the contactors 3 are arranged in the plurality of rows in one contactor group 3A, it is considered to further arrange the belt member 34 (protruding portion 32a) between the contactor 3 of the first row and the contactor 3 of the second row as the modification example of FIG. 29. That is, three or more belt members 34 (protruding portions 32a) can be arranged along the extending direction (aligning direction) of the contactor group 3A. However, as shown in FIG. 29, when the distance between the contactor 3 of the first row and the contactor 3 of the second row is short, if the belt member 34 is arranged between the contactors 3 of the respective rows, a distance between the contactors 3 and the belt member 34 arranged therebetween becomes short, and therefore, it is concerned that the variation in the contact pressure of each contactor 3 may not be sufficiently decreased. Also, from a viewpoint of downsizing of a plane area of the semiconductor chip 10 (see FIG. 4), when the pads 11 (see FIG. 4) are arranged in the plurality of rows, it is preferred to arrange the pad 11 of the first row and the pad 11 of the second row so as to be close to each other. Accordingly, as shown in FIG. 29, even when the plurality of contactors 3 are arranged in the plurality of rows (two rows) along the extending direction (aligning direction) of the contactor group 3A, it is more preferred not to arrange the belt member 34 between the contactors 3 arranged in the plurality of rows. Also in this case, if the distance between the contactor 3 of the first row and the contactor 3 of the second row is short (about 58 μm in FIG. 29), the load can be dispersed and transmitted onto each contactor 3 of each row arranged between the two belt members 34 arranged on both adjacent sides of the contactor group 3A, and therefore, the variation in the contact pressure can be decreased. Obviously, if the distance between the contactor 3 of the first row and the contactor 3 of the second row is long (for example, two times or larger the width of one contactor 3), the belt member 34 (protruding portion 32a) can be arranged further between the contactor 3 of the first row and the contactor 3 of the second row.

Still further, in the thin-film sheet 32 shown in FIG. 27, the plurality of contactors 3 are arranged also in each of the contactor groups 3B, 3C, and 3D other than the contactor group 3A shown in FIG. 29 among the plurality of contactor groups arranged along the respective sides of the contactor arrangement region 2c shaped in quadrangle. As shown in FIG. 27, in the contactor group 3B arranged along a side intersecting with (orthogonal to) the contactor group 3A, a plurality of contactors 3b are arranged in a plurality of rows (two rows) along an extending direction (aligning direction) of the contactor group 3B. Also, in the contactor group 3C arranged along a side facing the contactor group A, a plurality of contactors 3c are arranged in a plurality of rows (two rows) along an extending direction (aligning direction) of the contactor group 3C. Further, in the contactor group 3D arranged along a side facing the contactor group 3B, a plurality of contactors 3d are arranged in a plurality of rows (two rows) along an extending direction (aligning direction) of the contactor group 3D. And, on both adjacent sides of each of the contactor groups 3B, 3C, and 3D, the belt member 34 and the protruding portion 32a formed along the belt member are arranged similarly to the both adjacent sides of the contactor group 3A. In this manner, when the contactor groups 3A, 3B, 3C, and 3D are arranged along the respective sides of the contactor arrangement region 2c, it is preferred to set distances L3 (see FIG. 29) between the belt members 34 arranged on the both adjacent sides of each of the contactor group 3A, 3B, 3C, and 3D to be equal to each other. By setting the distances L3 between the belt members 34 to be equal to each other, the respective distances L1 and L2 (see FIG. 29) can be uniformed in the contactor groups 3A, 3B, 3C, and 3D. As a result, the variation in the contact pressure among the contactors 3a, 3b, 3c, and 3d arranged in the respective contactor groups 3A, 3B, 3C, and 3D can be decreased.

Figure 41:
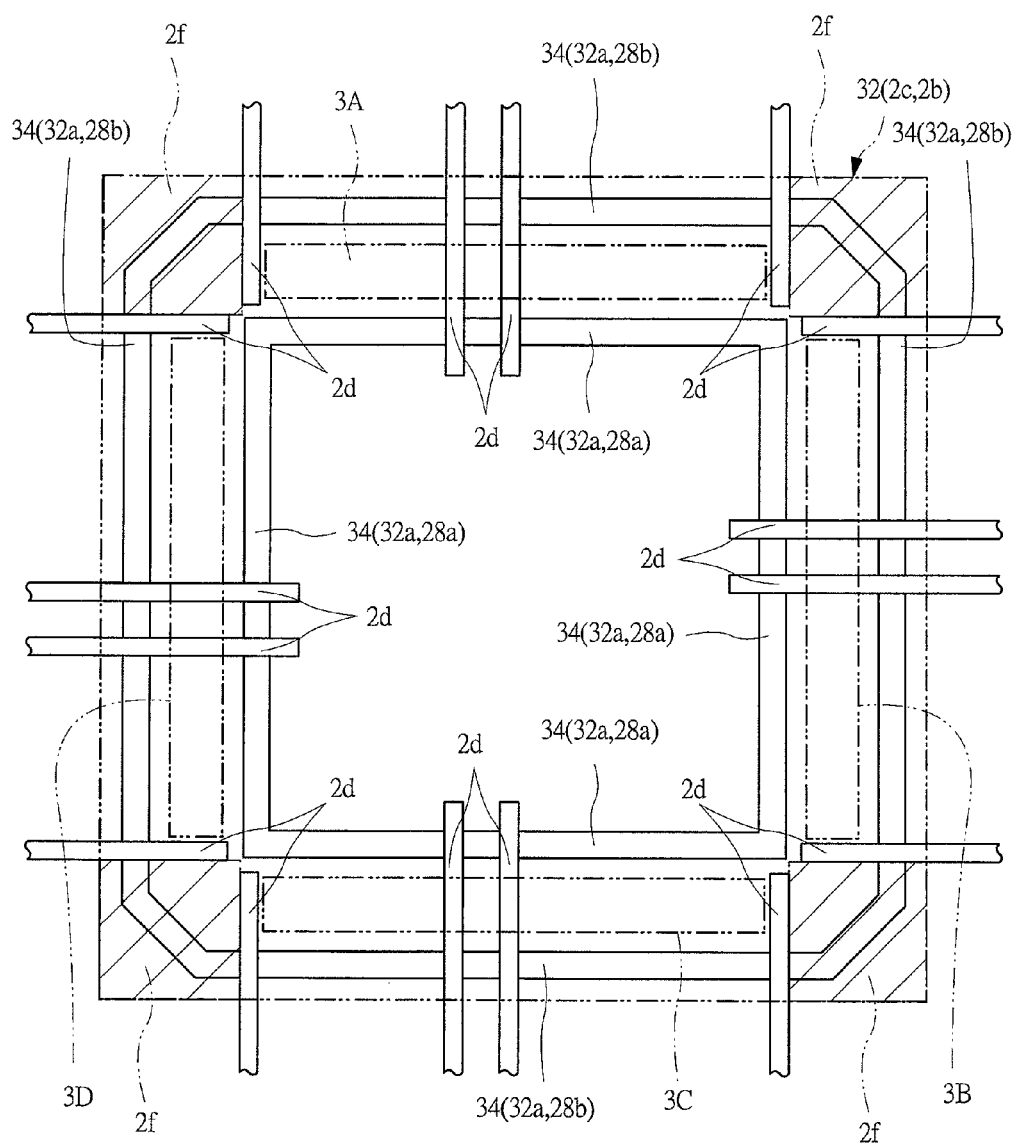
FIG. 41 is an enlarged plan view schematically showing a relative positional relation between an entire structure of a belt member shown in FIG. 29 and a contactor group.

Still further, as the entire structure of the belt members 34 and the protruding portions 32a, as shown in FIG. 41, the plurality of belt members 34 arranged inside and outside the contactor groups 3A, 3B, 3C, and 3D are circularly arranged along the respective sides of the contactor arrangement region 2c. FIG. 41 is an enlarged plan view schematically showing a relative positional relation between the contactor groups and the entire structure of the belt members shown in FIG. 29. In FIG. 41, the contactor groups 3A, 3B, 3C, and 3D form a quadrangle in a plan view. And, each of the belt members 34 arranged along each of the contactor groups 3A, 3B, 3C, and 3D forms a part of an inside loop body 28a arranged inside the quadrangle and an outside loop body 28b arranged outside the quadrangle in a plan view. In other words, in FIG. 41, the belt members 34 are arranged in the corner regions 2f of the contactor arrangement region 2c shaped in quadrangle in the plan view.

Figure 42:
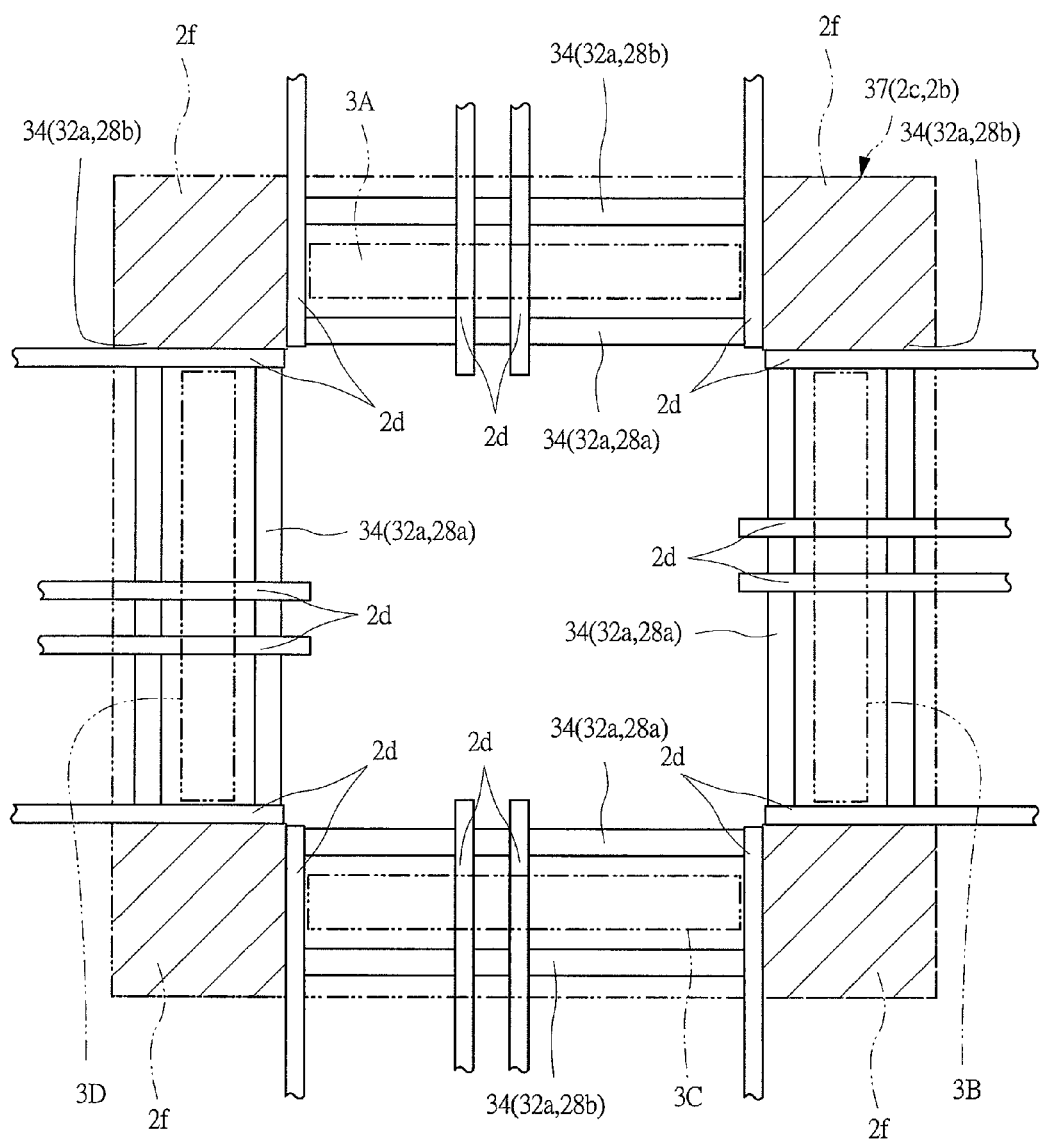
FIG. 42 is an enlarged plan view schematically showing a modification example of FIG. 41.

Still further, as a modification example of the entire structure of the belt members 34 and the protruding portions 32a shown in FIG. 41, the belt member 34 is not arranged in each corner portion (corner region 2f) of the inside loop body 28a and the outside loop body 28b as a thin-film sheet 37 shown in FIG. 42. FIG. 42 is an enlarged plan view schematically showing the modification example of FIG. 41. In the thin-film sheet 37 of FIG. 42, the belt member 34 of the outside loop body 28b and the belt member 34 of the inside loop body 28a are not arranged in the corner region 2f of the contactor arrangement region 2c, and the belt members 34 forming a part of the inside loop body 28a and the outside loop body 28b are independent members to each other. In this case, the contact pressure of each contactor 3 (see FIG. 27) can be controlled in each unit of the contactor groups 3A, 3B, 3C, and 3D. Also, by not forming the belt member 34 in the corner portion of the inside loop body 28a which is an inflection point between the extending directions, the mutual influence of the belt members 34 arranged along the respective contactor groups 3A, 3B, 3C, and 3D can be decreased.

In other points except for the above-described different points, the present embodiment is the same as the above-described second embodiment. Therefore, overlapping explanations are omitted. However, the techniques explained in the above-described first and second embodiments can be applied by replacing the thin-film sheet 2 or the thin-film sheet 31 by the thin-film sheet 32.

Fourth Embodiment

The above-described third embodiment has explained the technique of totally decreasing the variation in the contact pressure of each of the plurality of contactors 3 including the plurality of contactors 3 arranged in the dispersive-arrangement region and the plurality of contactors 3 arranged in the dense-arrangement region. However, the technique of forming the slit 2d in the dispersive-arrangement region explained in the first and second embodiments and the technique of forming the protruding portion 32a explained in the third embodiment can be independently applied to each other. In the present embodiment, as a modification example of the above-described third embodiment, a mode in which the slit 2*d* is not formed will be explained. Note that the present embodiment is an applied technique of the technique explained in the third embodiment, and therefore, the explanations overlapped with the third embodiment will be omitted as much as possible, and different points from the third embodiment will be mainly explained. Also, the technique explained below can be applied to both cases in which the plurality of contactors 3 are arranged in one row as explained in the first embodiment and in which the plurality of contactors 3 are arranged in the plurality of rows as explained in the second embodiment. In the present embodiment, as a representative example, a mode applied to the thin-film sheet in which the contactors 3 are arranged in the plurality of rows as the second embodiment will be explained.

Figure 43:
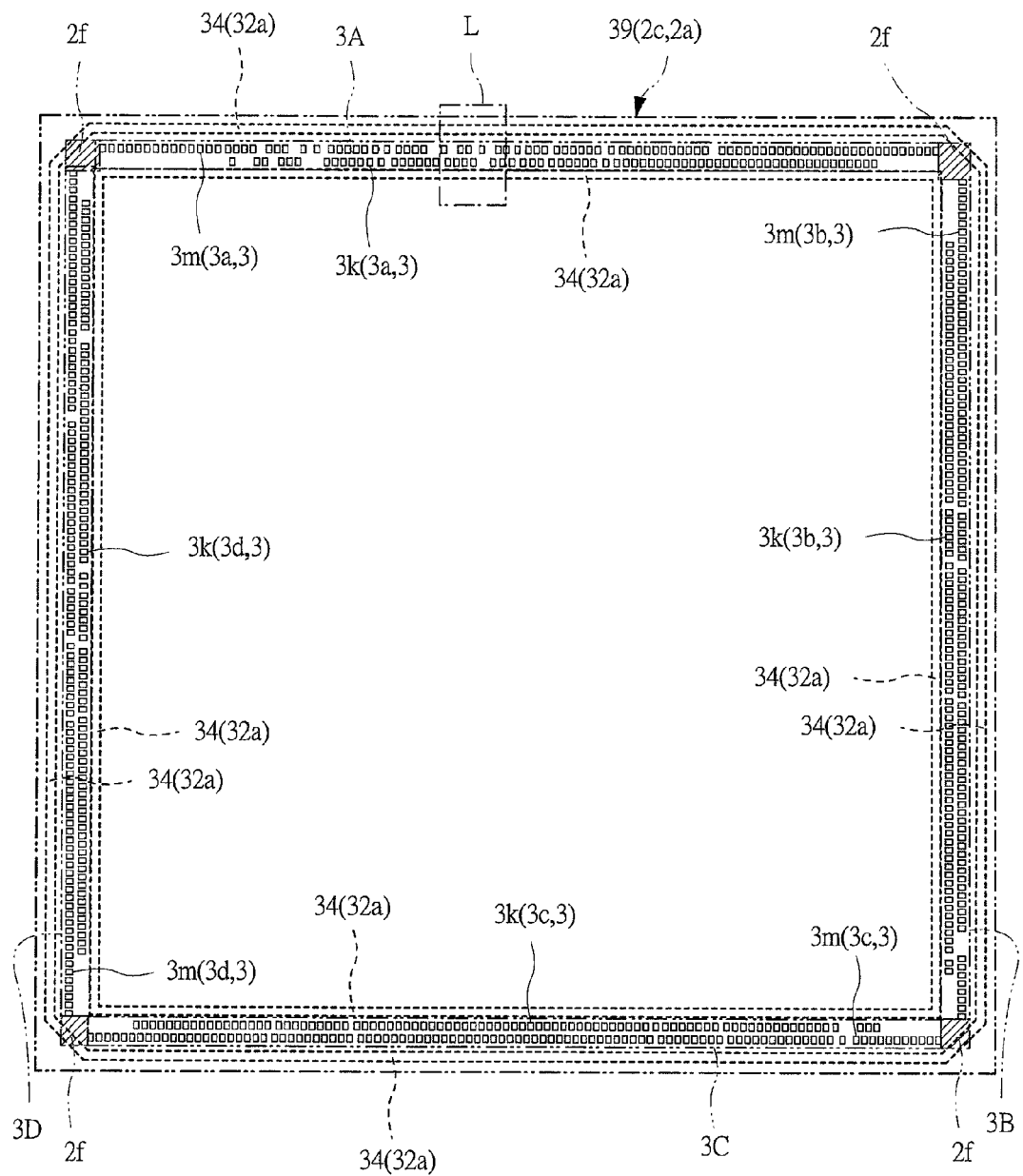
FIG. 43 is an enlarged plan view of a contactor arrangement region of a thin-film sheet which is a modification example of FIG. 27.
Figure 44:
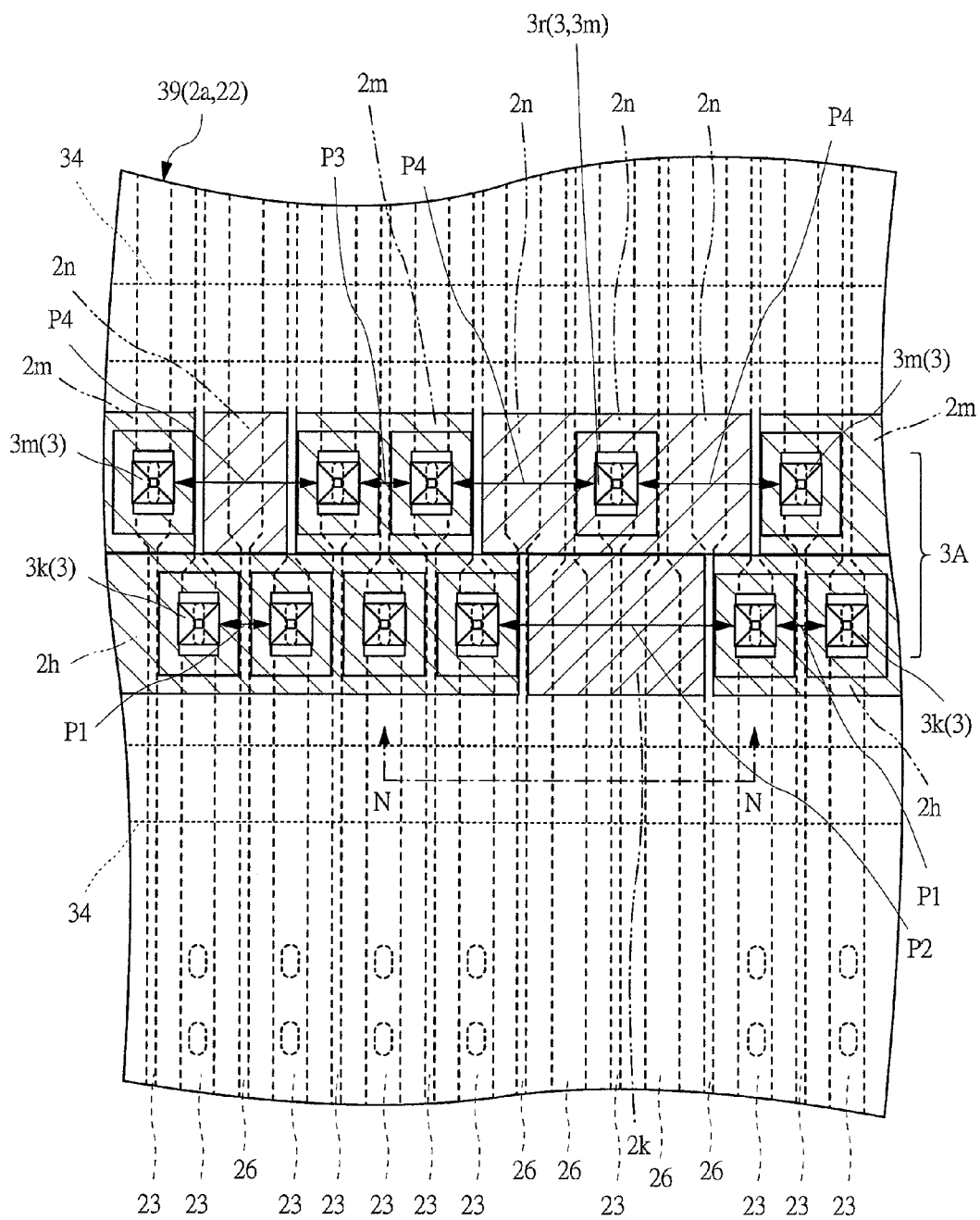
FIG. 44 is an enlarged plan view of an L portion of FIG. 43.
Figure 45:
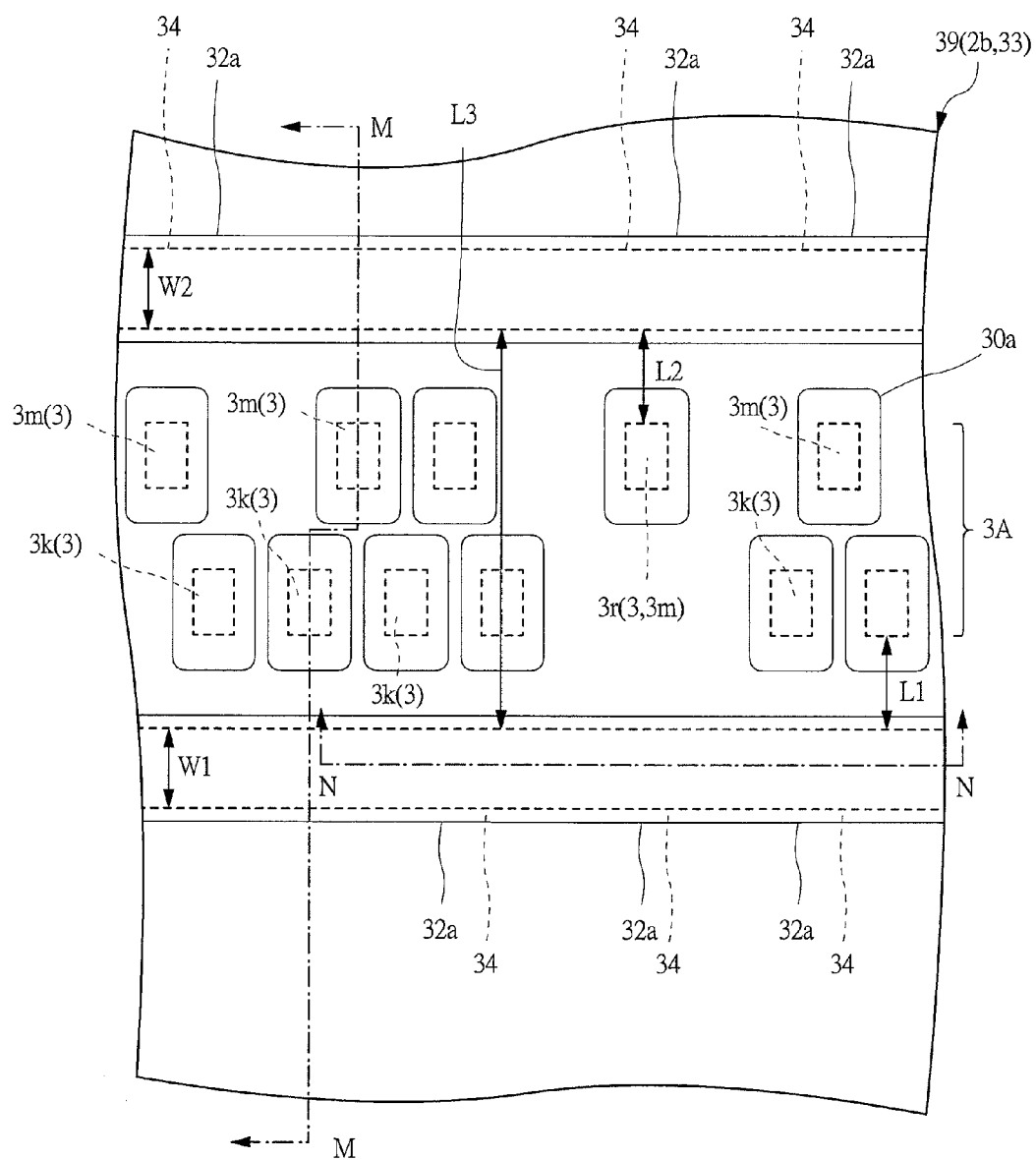
FIG. 45 is an enlarged plan view showing a rear surface side of a thin-film sheet shown in FIG. 44.
Figure 46:
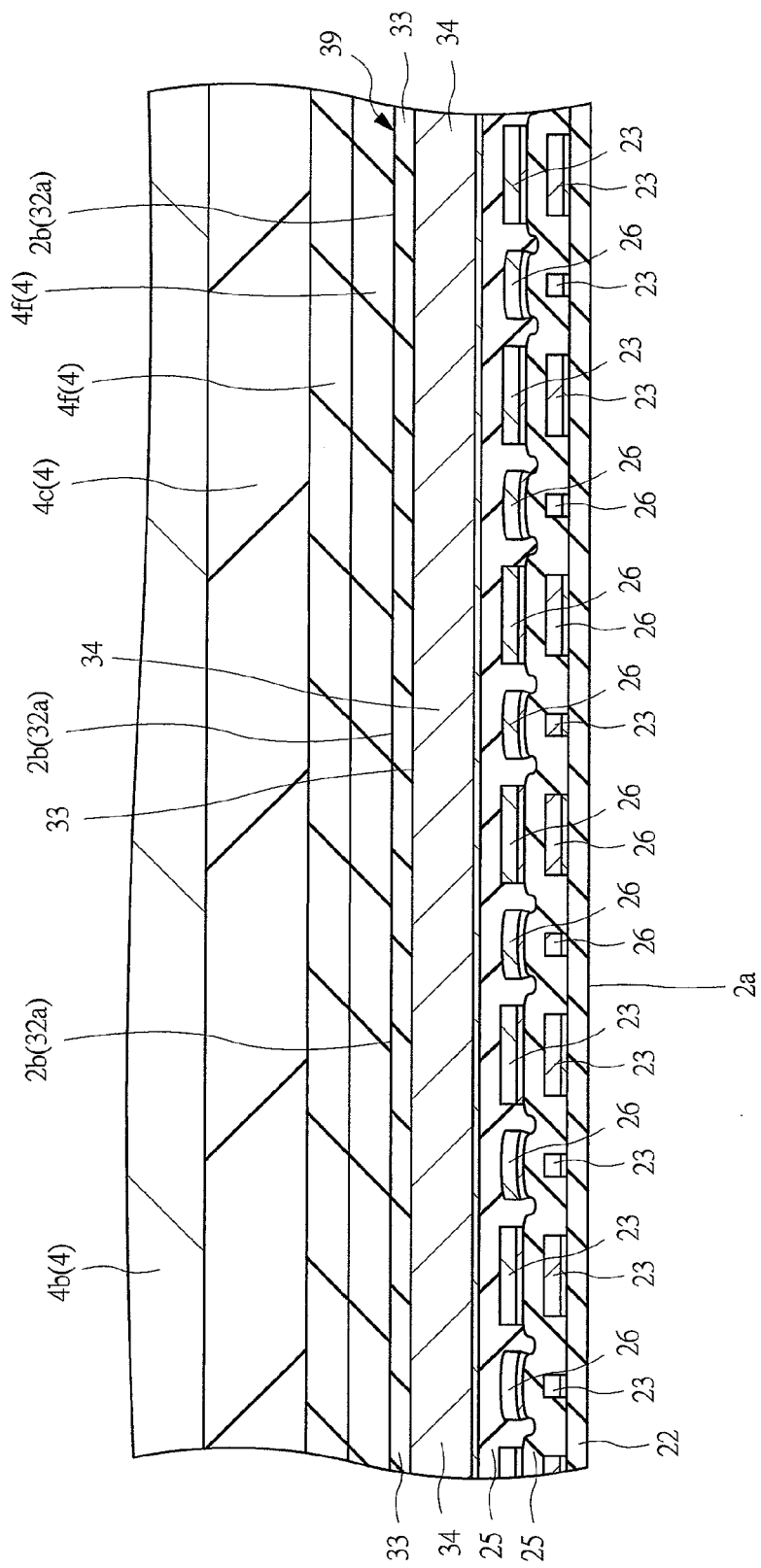
FIG. 46 is an enlarged cross-sectional view showing a state that contactors and pads of a wafer are contacted to each other in a cross-sectional surface taken along line N-N of FIG. 44.
Figure 47:
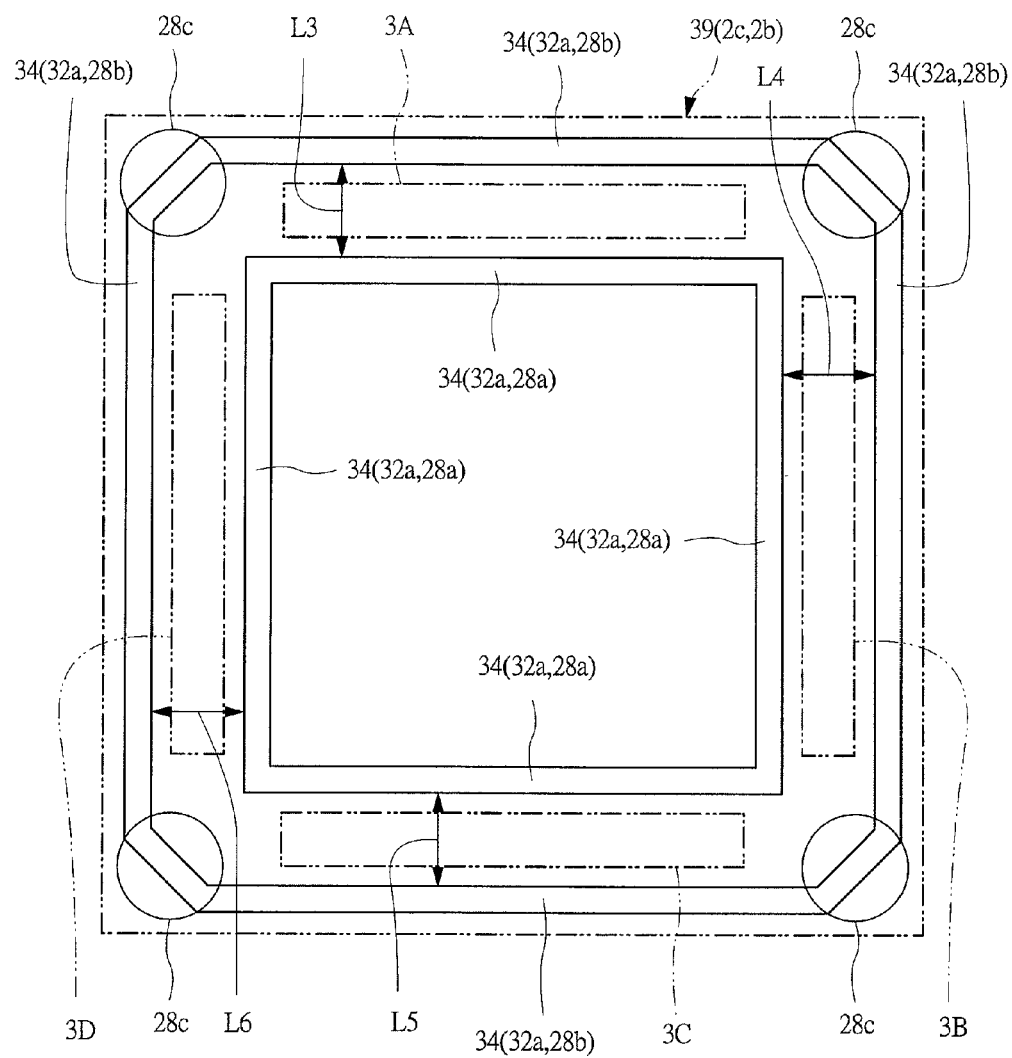
FIG. 47 is an enlarged plan view schematically showing a relative positional relation between an entire structure of a belt member shown in FIG. 45 and a contactor group.
Figure 48:
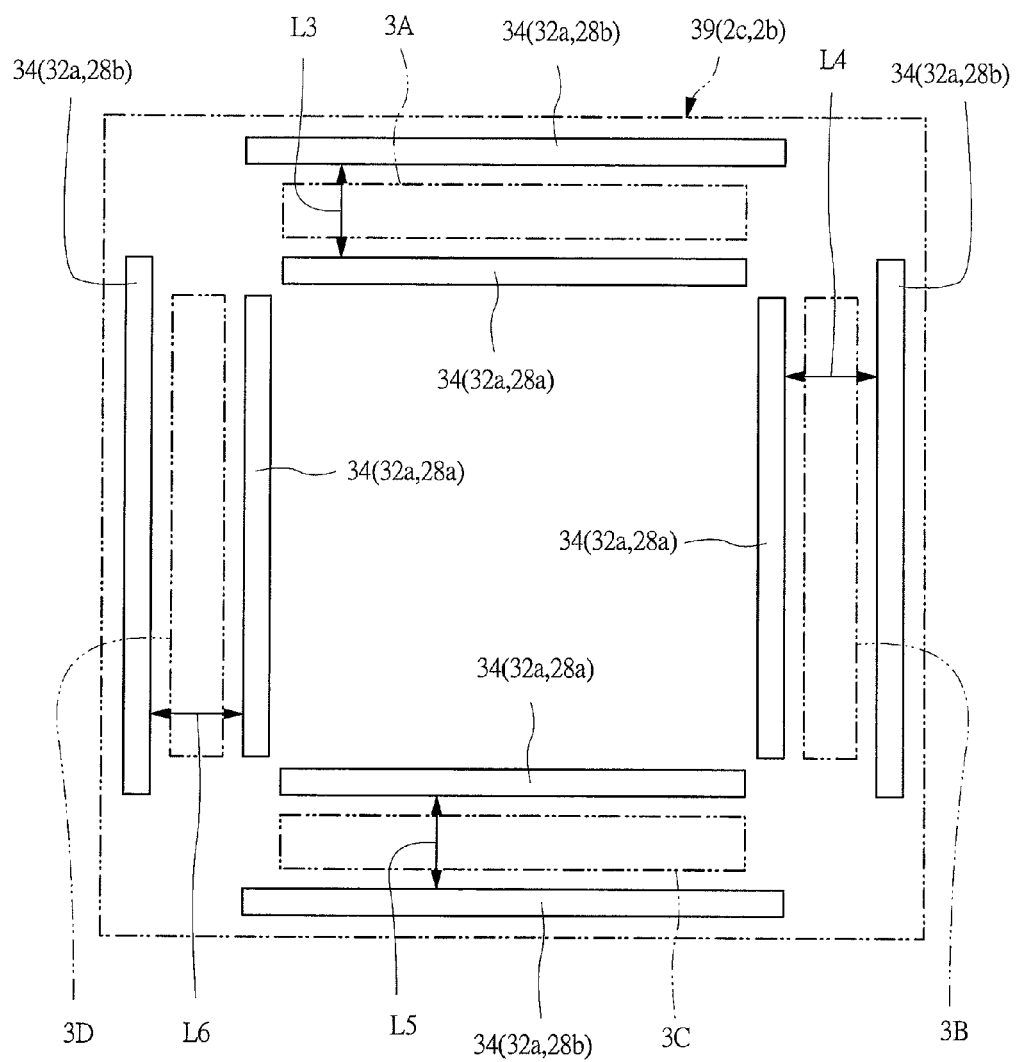
FIG. 48 is an enlarged plan view schematically showing a first modification example of FIG. 47.
Figure 49:
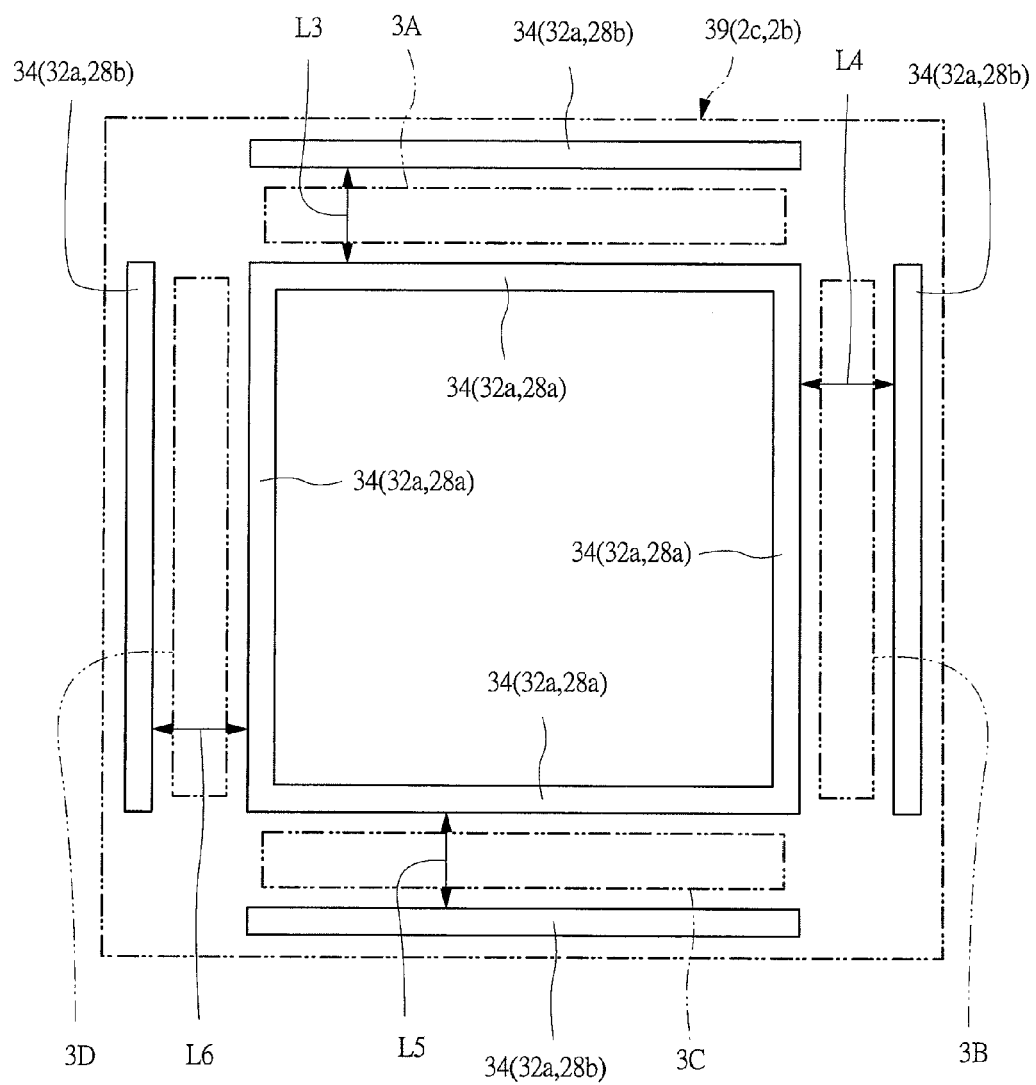
FIG. 49 is an enlarged plan view schematically showing a second modification example of FIG. 47.

FIG. 43 is an enlarged plan view of the contactor arrangement region of the thin-film sheet which is the modification example of FIG. 27. And, FIG. 44 is an enlarged plan view of an L portion of FIG. 43, and FIG. 45 is an enlarged plan view showing a rear surface side of a thin-film sheet shown in FIG. 44. FIG. 46 is an enlarged cross-sectional view showing a state that a contactor and a pad of a wafer are contacted to each other in a cross-sectional surface taken along line N-N of FIG. 44. And, FIG. 47 is an enlarged plan view schematically showing a relative positional relation between the contactor groups and the entire structure of the band members shown in FIG. 45. And, FIGS. 48 and 49 are enlarged plan views schematically showing first and second modification examples of FIG. 47, respectively. Note that the enlarged cross-sectional surface taken along line M-M shown in FIG. 45 is the same as FIG. 30 explained in the third embodiment, and therefore, its illustration is omitted. Also, in FIG. 45, in order to easily understand a planar positional relation between the protruding portions 32*a* and the contactors 3, the wirings 23 and the dummy wirings 26 shown in FIG. 44 are not shown.

A thin-film sheet 39 of the present embodiment shown in FIGS. 43 to 49 is different in the point that the slits 2*d* included in the thin-film sheet 32 explained in the third embodiment are not formed. That is, as seen from the comparison between FIGS. 44, 45, and 46 and FIGS. 28, 29, and 33 explained in the third embodiment, the slits 2*d* (see FIG. 28) are not formed in the dispersive-arrangement regions (regions 2*n* and 2*k* shown in FIG. 44) in the thin-film sheet 39 of the fourth embodiment. Also, as shown in FIG. 44, in a plan view, the belt member 34 and the protruding portion 32*a* arranged on both adjacent sides of the contactor group 3A are not divided by the slit 2*d* (see FIG. 28), and are arranged so as to be continuously extended along the extending direction (aligning direction) of the contactor group 3A. In other points except for the points described above, the thin-film sheet 39 is the same as the thin-film sheet 32 explained in the third embodiment. In this manner, even in the case of the thin-film sheet 39 in which the slits 2*d* are not formed, by arranging the protruding portions 32*a* distant from the contactors 3 in a plan view, the variation in the load transmitted to the contactors 3 can be decreased, and the contact pressures of the contactors 3 can be uniformed. Also, by arranging the protruding portions 32*a* so as to be continuously extended along the extending direction (aligning direction) of the contactor group 3A, the transmitted load to the protruding portions 32*a* is dispersed and transmitted onto the plurality of contactors 3 sandwiched between two protruding portions 32*a*. That is, the variation in the contact pressure of each of the plurality of contactors 3 sandwiched between the two protruding portions 32*a* can be decreased. For example, in FIG. 44, onto each of the plurality of contactors 3 (eleven contactors 3 in a region shown in FIG. 44), the load from the two protruding portions 32*a* arranged on both adjacent sides of each contactor 3 is dispersed and transmitted. In this manner, the contact pressure of the contactor 3 arranged in the dispersive-arrangement region and the contact pressure of the contactor 3 arranged in the other region (for example, dense-arrangement region) can be uniformed. As a result, the failure at the electrical inspection step caused by the variation in the contact pressure of each of the plurality of contactors 3 as explained in the third embodiment can be prevented or suppressed.

Still further, as shown in FIG. 44, when the protruding portions 32*a* remain (are not divided by the slits 2*d*) in the region where the slits 2*d* are formed, the variation in the transmitted load to the contactors 3 can be decreased, the contact pressures of the contactors 3 can be uniformed. In addition, at the sheet stretching step, the obstructive factor in stretching the thin-film sheet 2 without loosening can be removed.

Still further, as shown in FIG. 47, in some cases, the entire structure of the belt members 34 and the protruding portions 32*a* applies a structure in which four belt members 34 arranged inside the contactor groups 3A, 3B, 3C, and 3D are jointed to each other to be integrated, and four belt members 34 arranged outside the contactor groups 3A, 3B, 3C, and 3D are jointed to each other to be integrated. In FIG. 47, the contactor groups 3A, 3B, 3C, and 3D form a quadrangle in a plan view. And, each of the belt members 34 arranged along the contactor groups 3A, 3B, 3C, and 3D forms a part of the inside loop body 28*a* arranged inside the quadrangle and the outside loop body 28*b* arranged outside the quadrangle. In such a case, the load received by each of the protruding portions 32*a* arranged along the contactor groups 3A, 3B, 3C, and 3D is mutually affected; and therefore, it is particularly preferred to equalize the distances L3, L4, L5, and L6 between the belt members 34.

Still further, as shown in FIG. 47, when the outside loop body 28*b* is continuously formed without being divided at an intermediate portion, in each corner portion at which extended lines of sides of the outside loop body 28*b* intersect with each other, the connected two sides are connected to each other via an obliquely-arranged portion 28*c* obliquely arranged to each side so that the sides are not orthogonal to each other. The corner portion at which the two sides of the outside loop body 28*b* are connected to each other is an inflection point at which the extending directions of the belt members 34 are changed. Therefore, by providing the obliquely-arranged portions 28*c*, the mutual influence of the belt members 34 to each other is moderated. However, if the distances L1 and L2 (for example, see FIG. 29) of the belt members 34 and the contactor groups 3A, 3B, 3C, and 3D are changed by providing the obliquely-arranged portions 28*c*, it is preferred not to provide the obliquely-arranged portions 28*c*. For example, in a vicinity of the corner portion at which the sides of the inside loop body 28*a* shown in FIG. 47 intersect with each other, each of the contactor groups 3A, 3B, 3C, and 3D is arranged. Therefore, the obliquely-arranged portion is not provided in the corner portion at which the sides of the inside loop body 28*a* intersect with each other. In this manner, in each extending direction of the belt members 34 forming the inside loop body 28*a*, each distance L2 (for example, see FIG. 29) between the belt members 34 and the respective contactor groups 3A, 3B, 3C, and 3D can be uniformed.

Still further, as the modification example of the entire structure of the belt members 34 and the protruding portions 32*a* shown in FIG. 47, as shown in FIG. 48, the belt members 34 can be divided (not be jointed) at each corner portion of the inside loop body 28*a* and the outside loop body 28*b*. In this case, the belt members 34 are independent members to each other, and therefore, the contact pressure of each contactor 3 can be controlled in each unit of the contactor groups 3A, 3B, 3C, and 3D. Also, by not forming the belt members 34 in the corner portions which is the inflection points, the mutual influence of the belt members 34 arranged along the contactor groups 3A, 3B, 3C, and 3D can be decreased. In this manner, when the belt members 34 are divided, it is preferred to extend the belt members to the same positions as the contactors arranged at the end portions among the plurality of contactors 3a, 3b, 3c, and 3d arranged in the respective contactor groups 3A, 3B, 3C, and 3D or to positions closer to the corner portion sides. In this manner, the load of the plurality of contactors 3a, 3b, 3c, and 3d arranged in the respective contactor groups 3A, 3B, 3C, and 3D can be dispersed, and therefore, the variation in the contact pressure can be decreased.

Note that, as a modification example of the mode shown in FIG. 48 in which each of the inside loop body 28a and the outside loop body 28b is divided, either one of the inside loop body 28a and the outside loop body 28b can be divided. For example, in FIG. 49, the contactor groups 3A, 3B, 3C, and 3D are long, and are extended to the vicinity of the each corner portion of the inside loop body 28a. Therefore, in FIG. 49, although the slits 2d (see FIGS. 41 and 42) explained in the third embodiment are not formed, the belt members 34 are divided from (not are jointed to) each other in each corner portion of the outside loop body 28b. On the other hand, the inside loop body 28a is extended to each end portion of the contactor groups 3A, 3B, 3C, and 3D, and therefore, is continuously formed without being divided at an intermediate portion.

Other Modification Example

Next, other modification examples than the above-described ones will be explained. The above-described first to the fourth embodiments have described the example of arranging the plurality of contactors 3 in one row or two rows along each of the sides of the contactor arrangement region 2c shaped in quadrangle in the plan view. However, each aligning pattern of the contactors 3 is not limited to them. Although illustrations are omitted, the invention can be applied to, for example, a mixing structure of the contactor groups 3B, 3C, and 3D in which the plurality of contactors 3 are arranged in the plurality of rows as described in the second embodiment and the contactor group 3A in which the plurality of contactors 3a are arranged in one row as described in the first embodiment.

Further, in the thin-film sheet 32 of the third embodiment or the thin-film sheet 39 of the third embodiment, the mode applying the structure in which the plurality of contactors 3 are arranged in the plurality of rows (two rows) along the extending direction (aligning direction) of each of the contactor groups has been explained. However, the number of rows of the contactors 3 in each of the contactor groups and the arrangement of each of the contactor groups are not limited to the mode. For example, as the first embodiment, the invention can be applied to a structure in which the plurality of contactors 3 are arranged in one row in each of the contactor groups. When the plurality of contactors 3 are arranged in one row, the variation in the contact pressures of the contactors 3a can be decreased at higher precision than that when the contactors 3a are arranged in the plurality of rows as the thin-film sheet 32.

Still further, in the semiconductor chips 10 and 10c explained in the present embodiment, the plurality of pads 11 are arranged along each of their four sides. However, for example, the pads 11 are arranged along only one side or two sides of the fours sides in some cases. And, as corresponding to the arrangement of the pads 11, the number of the contactor groups is also changed to one or two. In this case, the slits 2d, the protruding portions 32a, and the belt members 34 may be formed on only the side where the contactor group is arranged.

Still further, the above-described first to fourth embodiments have shown the mode of arranging the contactor arrangement region 2c corresponding to one chip region 10a (see FIGS. 2 and 19) on one thin-film sheet and sequentially performing the electrical inspection for each chip region 10a. However, the electrical inspection can be performed for the plurality of chip regions 10a at one batch.

Figure 50:
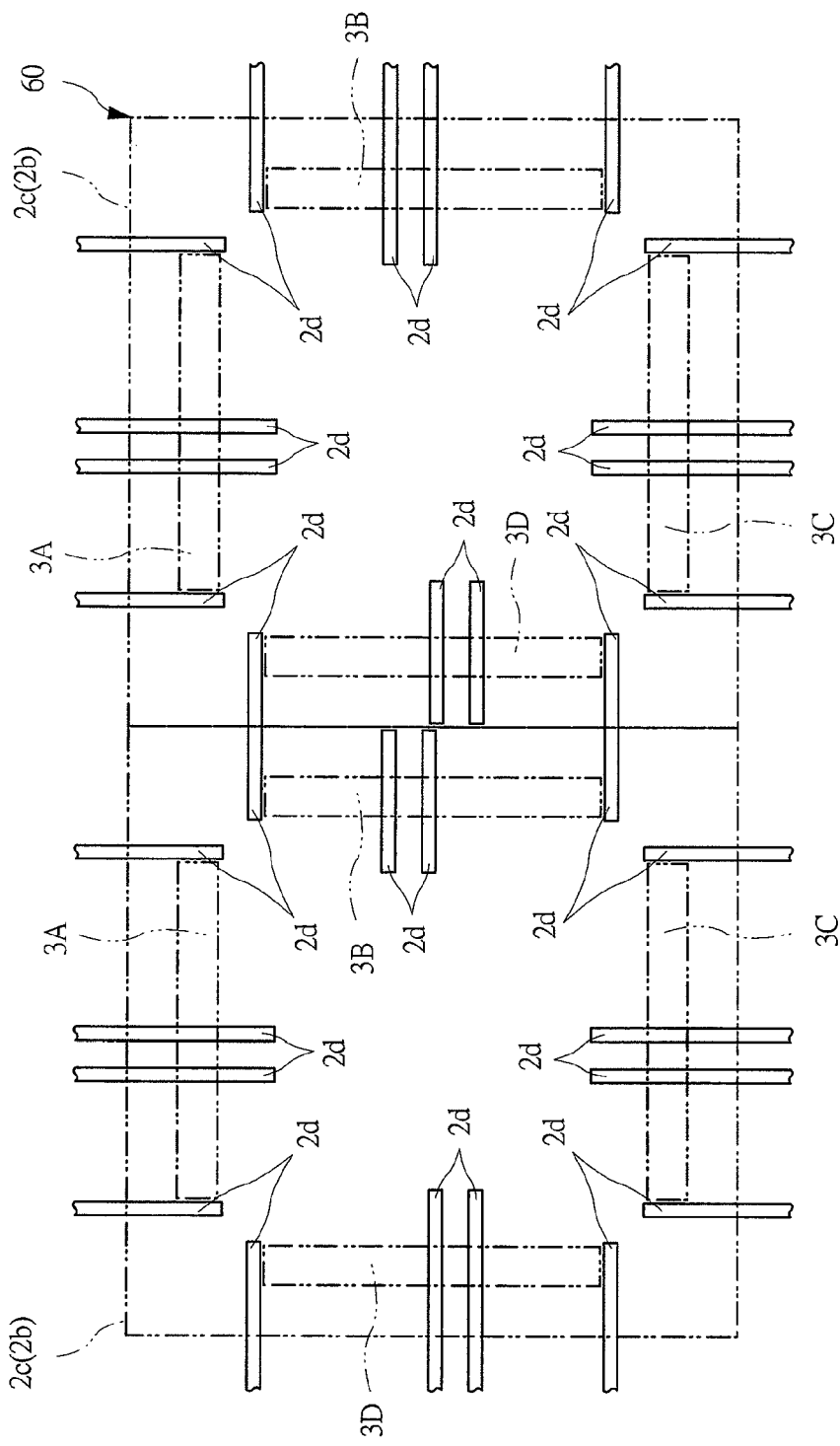
FIG. 50 is an enlarged plan view schematically showing a contactor arrangement region of a thin-film sheet used when the electrical inspection step shown in FIG. 1 is performed to a plurality of chip regions at one batch.
Figure 51:
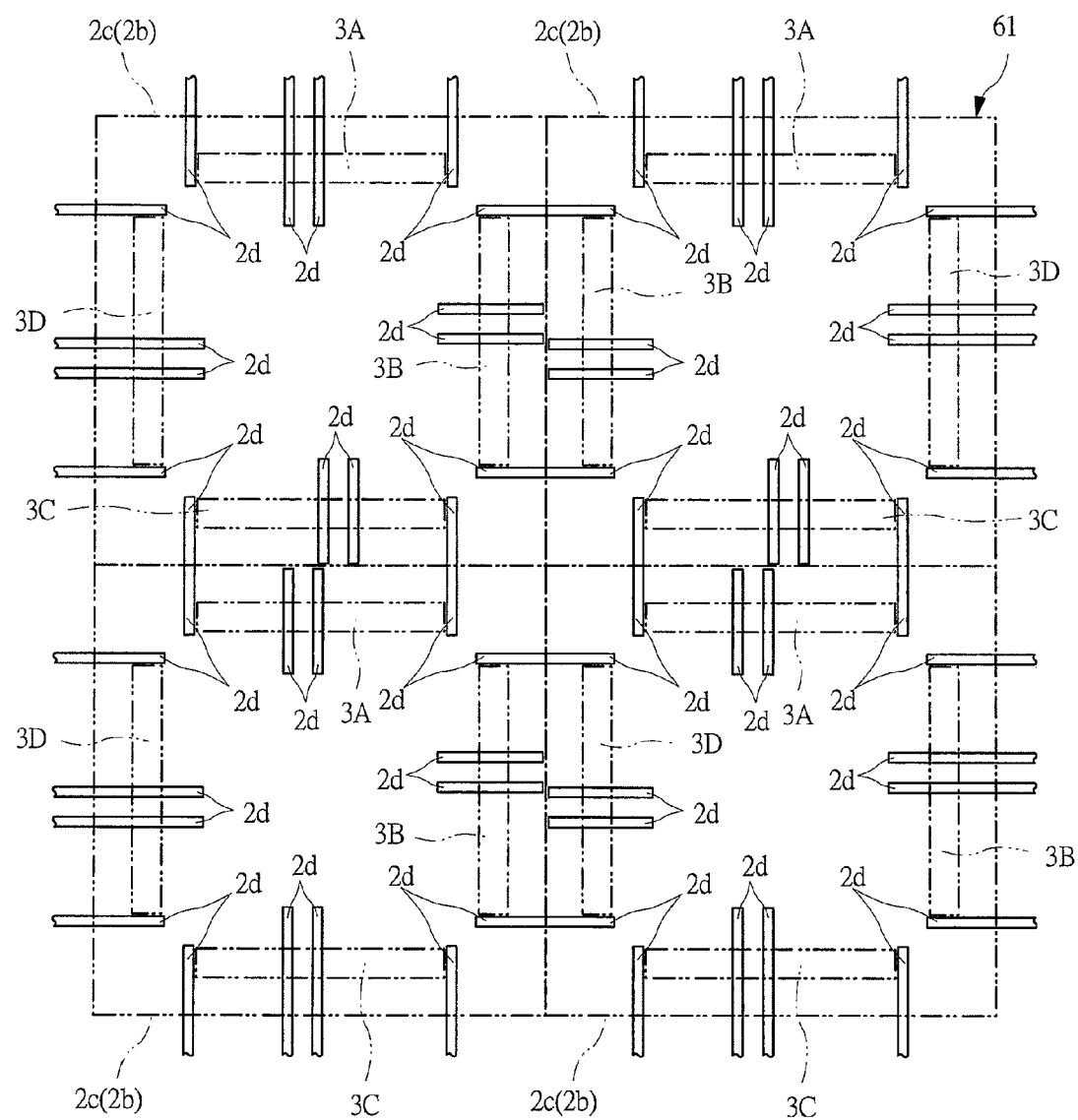
FIG. 51 is another enlarged plan view schematically showing the contactor arrangement region of the thin-film sheet used when the electrical inspection step shown in FIG. 1 is performed to the plurality of chip regions at one batch.
Figure 52:
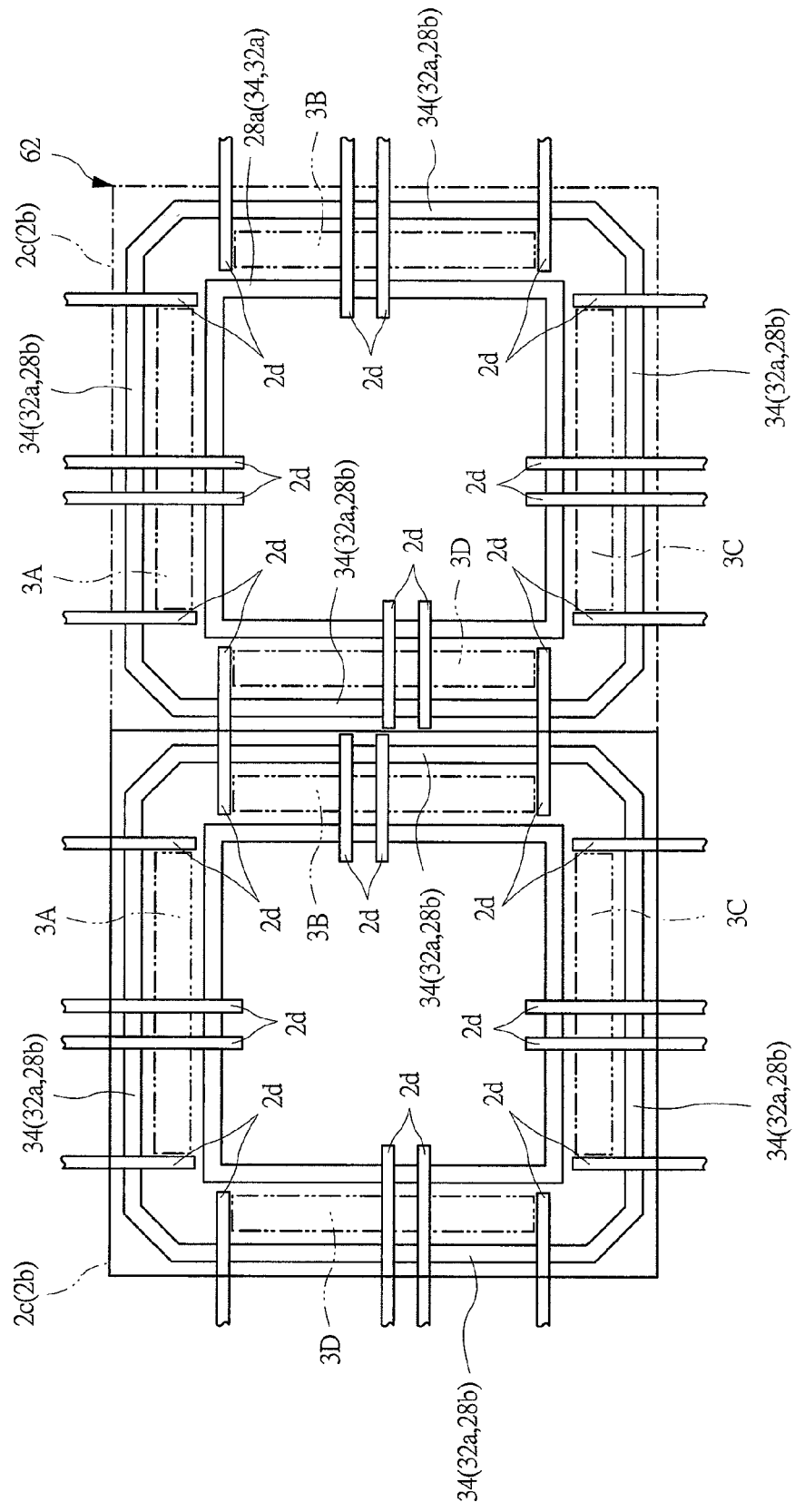
FIG. 52 is another enlarged plan view schematically showing the contactor arrangement region of the thin-film sheet used when the electrical inspection step shown in FIG. 1 is performed to the plurality of chip regions at one batch.
Figure 53:
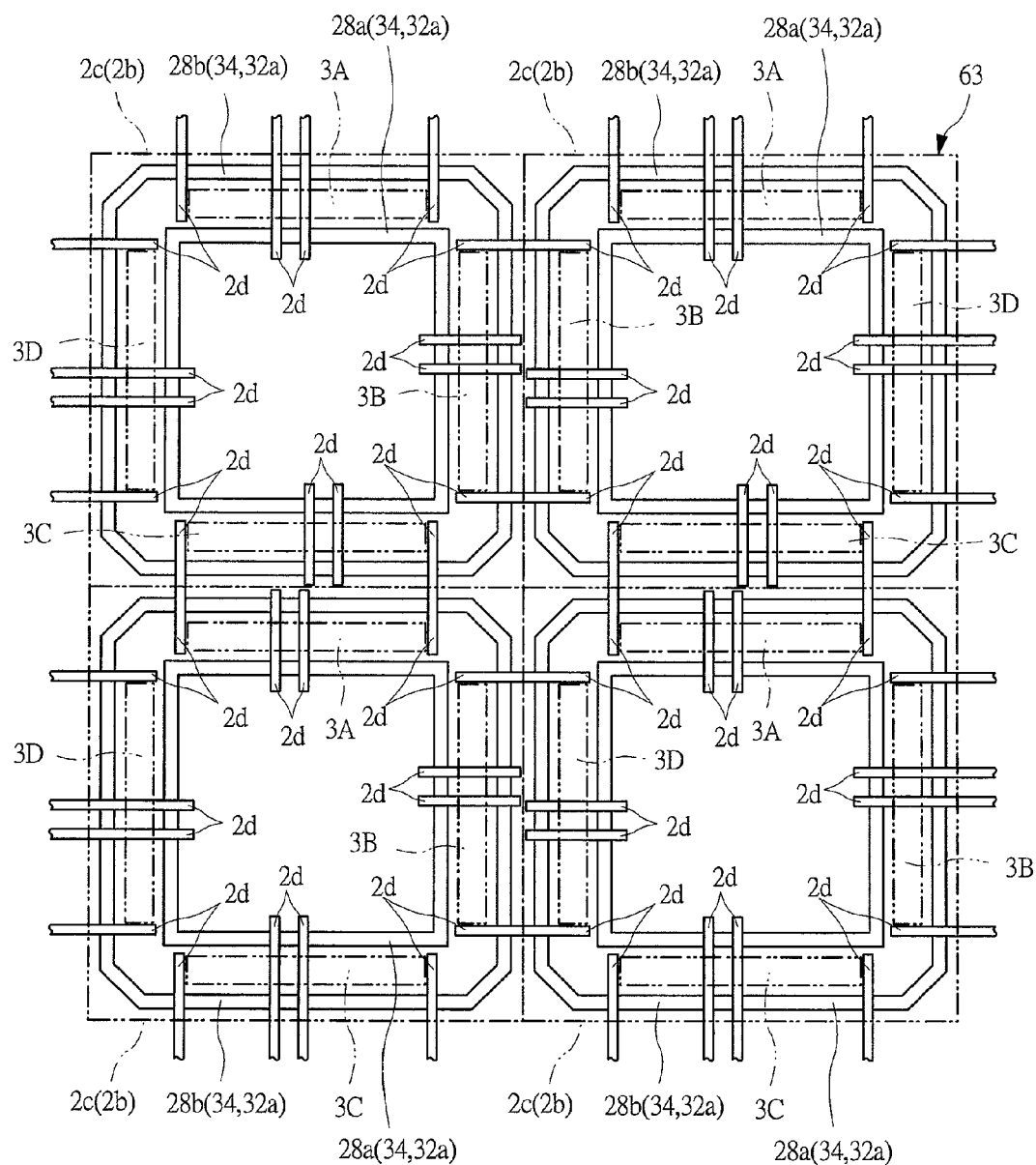
FIG. 53 is another enlarged plan view schematically showing the contactor arrangement region of the thin-film sheet used when the electrical inspection step shown in FIG. 1 is performed to the plurality of chip regions at one batch.
Figure 55:
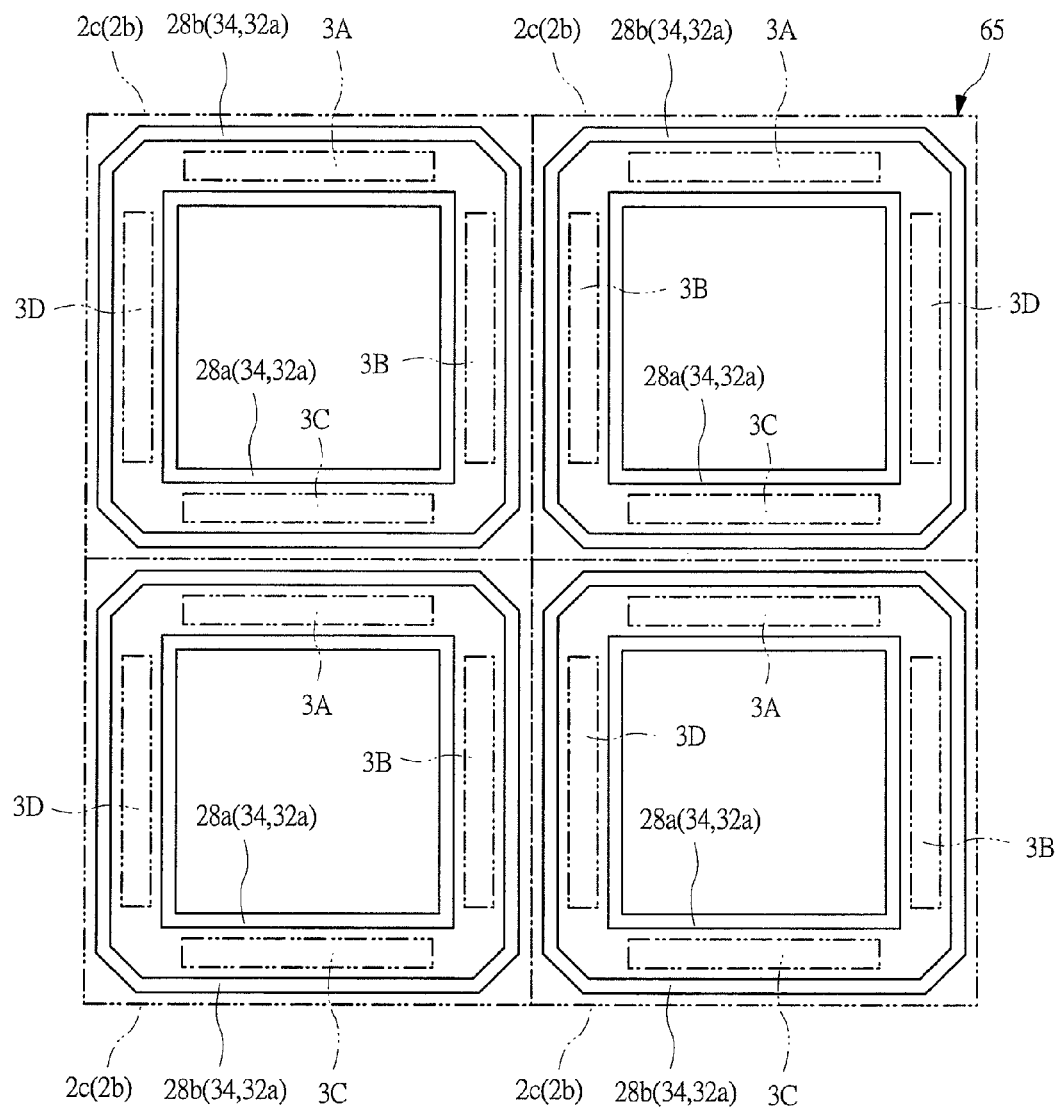
FIG. 55 is another enlarged plan view schematically showing the contactor arrangement region of the thin-film sheet used when the electrical inspection step shown in FIG. 1 is performed to the plurality of chip regions at one batch.

FIGS. 50 to 55 are enlarged plan views each schematically showing the contactor arrangement region of the thin-film sheet used when the electrical inspection step shown in FIG. 1 is performed for the plurality of chip regions at one batch. FIGS. 50 and 51 show modification examples of the above-described first embodiment and the second embodiment, and FIGS. 52 and 53 are modification examples of the third embodiment. And, FIGS. 54 and 55 are modification examples of the fourth embodiment. Each of thin-film sheets 60, 61, 62, 63, 64, and 65 shown in FIGS. 50 to 55 includes a plurality of (two in FIGS. 50, 52, and 54, and four in FIGS. 51, 53, and 55) contactor arrangement regions 2c. And, the contactor groups 3A, 3B, 3C, and 3D are arranged in each of the contactor arrangement regions 2c. By using such a configuration, the electrical inspection can be performed for the plurality of chip regions 10a (see FIG. 2) at one batch. Also, the arrangement layout of three or more contactor arrangement regions 2c is not limited to the mode in which the regions are arranged in a matrix as shown in FIGS. 51, 53 and 55. For example, three or more contactor arrangement regions 2c can be arranged so as to be aligned in one row.

Still further, in FIGS. 50 to 53, the slit 2d explained in any of the first to the third embodiments is formed at the end portion of each of the contactor groups 3A, 3B, 3C, and 3D. Therefore, the contact pressures of the contactors arranged at the end portion of each of the contactor groups 3A, 3B, 3C, and 3D can be decreased. Also, the slit 2d explained with reference to, for example, FIGS. 15, 16, 24, 28, and 29 is formed at the intermediate portion of each of the contactor groups 3A, 3B, 3C, and 3D. Therefore, the contact pressures of the contactor arranged in the dispersive-arrangement region and the contactor arranged at the end portion of the dense-arrangement region can be decreased. Incidentally, as shown in FIGS. 50 to 53, when one thin-film sheet 60, 61, 62, or 63 includes the plurality of contactor arrangement regions 2c, there are the contactor groups facing each other via a boundary of the contactor arrangement regions 2c. For example, in FIG. 50, the contactor group 3B arranged in a left-adjacent-side contactor arrangement region 2c and the contactor group 3D arranged in a right-adjacent-side contactor arrangement region 2c correspond to the contactor groups. Regarding the slit 2d formed so as to correspond to such contactor groups, the slit 2d arranged in one contactor arrangement region 2c may intersect with the slit 2d arranged in the other contactor arrangement region 2c in some cases. In this case, the slits 2d can be jointed with each other to be extended across the plurality of contactor arrangement regions 2c. Also, when the extension of the slits 2d across the plurality of contactor arrangement regions 2c becomes an obstructive factor for the wiring layout in other contactor arrangement region 2c, the obstructive factor can be suppressed by arranging both ends of each of the slits 2d inside the contactor arrangement region 2c.

Still further, as shown in FIGS. 52 and 53, the belt member 34 is arranged on both adjacent sides of each of the contactor groups 3A, 3B, 3C, and 3D. Therefore, the variation in the contact pressures of the plurality of contactors arranged in the region sandwiched between the belt members 34 can be decreased. Incidentally, as shown in FIGS. 52 and 53, when the plurality of contactor arrangement regions 2c are arranged so as to be aligned, the interval between the contactor arrangement regions 2c is changed depending on the interval between the chip regions 10a adjacent to each other shown in FIG. 2 (width of the scribe region 10b). And, depending on the width of the scribe region 10b, the belt member 34 cannot be arranged in each of the contactor arrangement regions 2c adjacent to each other as shown in FIGS. 52 to 55 in some cases. Accordingly, in a thin-film sheet 66 of FIG. 56 shown as a modification example of FIG. 54, one belt member 34 shared by the contactor arrangement regions 2c adjacent to each other is arranged. That is, in the outside loop body 28b included in each of the two contactor arrangement regions 2c (for example, see FIG. 47), the belt members 34 arranged to face each other are integrated. In this case, the integrated belt members 34 and the belt member 34 which is a part of the inside loop body 28a facing the belt members have a different belt width from each other in some cases. However, even in this case, the variation in the contact pressures of the contactors 3 can be decrease lower than the case in which the belt members 34 (protruding portions 32a) are not formed.

In the foregoing, the invention made by the inventors has been concretely described based on the embodiments. However, it is needless to say that the present invention is not limited to the foregoing embodiments and various modifications and alterations can be made within the scope of the present invention. For example, each modification example explained in each embodiment described above can be appropriately combined with the other for the application within the scope of the present invention.

SUMMARY OF INVENTION

The invention explained in detail in the present application includes the following constitutions. Hereinafter, the invention will be explained in each item.

[Item 1]

In a method of manufacturing a semiconductor integrated circuit device, the method includes: (a) a step of preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit; (b) a step of preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, and the first sheet being retained on the wiring substrate so that tips of the plurality of contact terminals face the principal surface side of the semiconductor wafer, and the pressing portion pressing a contact-terminal arrangement region of the first sheet, where the plurality of contact terminals are formed, from the rear surface via a buffer layer; and (c) a step of performing electrical inspection for the semiconductor integrated circuit by contacting the tips of the plurality of contact terminals of the first sheet to the plurality of chip electrodes of the semiconductor wafer. The first sheet includes: a first insulating film including the contact-terminal formation surface; a plurality of second wirings formed between the first insulating film and the rear surface, and electrically connected to the plurality of first wirings and the plurality of contact terminals, respectively; and a second insulating film including the rear surface, and formed on the first insulating film and the plurality of second wirings. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, a third wiring formed on the first insulating film along the plurality of second wirings and not electrically connected to the plurality of contact terminals is arranged on an opposite side to the first contact terminal group of the first contact terminal arranged at an end portion of the first contact terminal group among the plurality of first contact terminals in a plan view, and a slit formed of an opening portion penetrating from one surface among the contact-terminal formation surface and the rear surface of the first sheet to the other surface is formed along each of the plurality of second wirings between the first contact terminal arranged at the end portion of the first contact terminal group and the third wiring.

[Item 2]

In the method of manufacturing the semiconductor integrated circuit device in the Item 1, a length of the slit is longer than a width of the first contact terminal group in a direction orthogonal to an extending direction of the first contact terminal group.

[Item 3]

In the method of manufacturing the semiconductor integrated circuit device in the Item 2, in a plan view, the contact-terminal arrangement region shaped in quadrangle includes: the first contact terminal group arranged along a first side among four sides forming an outer edge of the contact-terminal arrangement region; a second contact terminal group in which a plurality of second contact terminals are arranged along a second side intersecting with the first side; and a first corner region at which the first contact terminal group and the second contact terminal group intersect with each other, and the slit is formed between the first corner region and the first contact terminal group and between the first corner region and the second contact terminal group, respectively.

[Item 4]

In the method of manufacturing the semiconductor integrated circuit device in the Item 3, the length of the slit in a direction from the first or second contact terminal group toward an outside of the contact-terminal arrangement region is longer than that in a direction from the first or second contact terminal group toward an inside of the contact-terminal arrangement region.

[Item 5]

In the method of manufacturing the semiconductor integrated circuit device in the Item 1, a side surface of the second wiring on the slit side is covered by the second insulating film.

[Item 6]

In the method of manufacturing the semiconductor integrated circuit device in the Item 1, the first contact terminal group includes: a first region where the plurality of first contact terminals are arranged at a first interval; and a second region where the plurality of first contact terminal are arranged at a second interval wider than the first interval, and the slit is formed along the second wiring between the first contact terminal arranged in the second region and the first contact terminal arranged at an end portion of the first region.

[Item 7]

In the method of manufacturing the semiconductor integrated circuit device in the Item 1, the step of (b) includes: (b1) a step of preparing a substrate; (b2) after the step of (b1), a step of sequentially stacking the plurality of contact terminals, the first insulating film, the plurality of second wirings and the third wiring, and the second insulating film on the substrate; (b3) after the step of (b2), a step of forming the slit by irradiating laser beam from the rear surface side of the first sheet; and (b4) after the step of (b3), a step of connecting and retaining the first sheet onto the wiring substrate.

[Item 8]

In the method of manufacturing the semiconductor integrated circuit device in the Item 1, the step of (b) includes: (b1) a step of preparing a substrate; (b2) after the step of (b1), a step of sequentially stacking the plurality of contact terminals, the first insulating film, the plurality of second wirings and the third wiring, and the second insulating film on the substrate; (b3) after the step of (b2), a step of connecting and retaining the first sheet onto the wiring substrate; (b4) after the step of (b3), a step of pressing the contact-terminal arrangement region from the rear surface of the contact-terminal arrangement region via the buffer layer by the pressing portion; and (b5) after the step of (b4), a step of forming the slit by irradiating laser beam from the contact-terminal formation surface side of the first sheet.

[Item 9]

In the method of manufacturing the semiconductor integrated circuit device in the Item 8, in the step of (b5), an opening portion reaching at least a part of the buffer layer arranged in an upper layer of the slit is formed.

[Item 10]

In the method of manufacturing the semiconductor integrated circuit device in the Item 1, the plurality of first contact terminals arranged in the first contact terminal group includes: a plurality of first-row contact terminals arranged in a first row along the first direction; and a plurality of second-row contact terminals arranged in a second row.

[Item 11]

In the method of manufacturing the semiconductor integrated circuit device in the Item 10, in a periphery of an end portion of the first contact terminal group, the plurality of first-row contact terminals are not arranged, and the plurality of second-row contact terminals are arranged in one row, the slit is formed between a contact terminal arranged at an end portion of the second row among the plurality of second-row contact terminals and the third wiring arranged on an opposite side to the first contact terminal group of the corresponding contact terminal, and the slit is not formed between a contact terminal arranged at an end portion of the first row among the plurality of first-row contact terminals and the second or third wiring arranged adjacent to the corresponding contact terminal.

[Item 12]

In the method of manufacturing the semiconductor integrated circuit device in the Item 10, the first row of the first contact terminal group includes: a first dense-arrangement region where the plurality of first-row contact terminals are arranged at a first interval; and a first dispersive-arrangement region where the plurality of first-row contact terminals are arranged at a second interval wider than the first interval, the second row of the first contact terminal group includes: a second dense-arrangement region where the plurality of second-row contact terminals are arranged at a third interval; and a second dispersive-arrangement region where the plurality of second-row contact terminals are arranged at a fourth interval wider than the third interval, and the slit is formed in a region where the first and second dispersive-arrangement regions are arranged along the first direction and adjacent to each other.

[Item 13]

In the method of manufacturing the semiconductor integrated circuit device in the Item 12, the slit is not formed in a region where the first dispersive-arrangement region and the second dense-arrangement region or where the first dense-arrangement region and the second dispersive-arrangement region are arranged adjacent to each other.

[Item 14]

In a method of manufacturing a semiconductor integrated circuit device, the method includes: (a) a step of preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit; (b) a step of preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface side of the semiconductor wafer, and the pressing portion which presses a contact-terminal arrangement region of the first sheet, where the plurality of contact terminals are formed, from the rear surface via a buffer layer; and (c) a step of performing electrical inspection for the semiconductor integrated circuit by contacting the tips of the plurality of contact terminals of the first sheet to the plurality of chip electrodes of the semiconductor wafer. The first sheet includes: a first insulating film including the contact-terminal formation surface; a plurality of second wirings formed between the first insulating film and the rear surface, and electrically connected to the plurality of first wirings and the plurality of contact terminals, respectively; a second insulating film including the rear surface, and formed on the first insulating film and the plurality of second wirings; and a protruding portion formed on the rear surface. The plurality of contact terminals including a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, a third wiring which is formed on the first insulating film along the plurality of second wirings and is not electrically connected to the plurality of contact terminals is arranged on an opposite side to the first contact terminal group of the first contact terminal arranged at an end portion of the first contact terminal group among the plurality of first contact terminals in a plan view, a slit which is formed of an opening portion penetrating from one surface among the contact-terminal formation surface and the rear surface of the first sheet to the other surface is formed along the plurality of second wirings between the first contact terminal arranged at the end portion of the first contact terminal group and the third wiring, and the protruding portion is arranged adjacent to the first contact terminal group in a plan view so as to be extended along the first contact terminal group, and the protruding portion is not formed in a region where the slit is arranged on an extension of the protruding portion.

[Item 15]

In the method of manufacturing the semiconductor integrated circuit device in the Item 14, a plurality of the protruding portions are formed on the rear surface, and the plurality of protruding portions are arranged both adjacent to the first contact terminal group in a plan view so as to be extended along the first contact terminal group.

[Item 16]

In the method of manufacturing the semiconductor integrated circuit device in the Item 15, a third insulating film covering the first insulating film and the plurality of second wirings is formed between the second insulating film and the plurality of second wirings, a plurality of belt members made of a material having a higher rigidity than that of the second insulating film are formed between the second insulating film and the third insulating film, the plurality of belt members include a plurality of first belt members arranged both adjacent to the first contact terminal group in a plan view so as to be extended as a belt shape along the first contact terminal group, and the plurality of protruding portions are formed along the plurality of belt members.

[Item 17]

In the method of manufacturing the semiconductor integrated circuit device in the Item 16, each of the plurality of belt members is formed of a metal film.

[Item 18]

In the method of manufacturing the semiconductor integrated circuit device in the Item 17, side surfaces of the second and third wirings on the slit side and side surfaces of the plurality of belt members on the slit side are covered by the second insulating film.

[Item 19]

In the method of manufacturing the semiconductor integrated circuit device in the Item 17, the step of (b) includes: (b1) a step of preparing a substrate; (b2) after the step of (b1), a step of sequentially stacking the plurality of contact terminals, the first insulating film, the plurality of second wirings and the third wiring, the third insulating film, the plurality of belt members, and the second insulating film on the substrate; (b3) after the step of (b2), a step of forming the slit by irradiating laser beam from the rear surface side of the first sheet; and (b4) after the step of (b3), a step of connecting and retaining the first sheet onto the wiring substrate, and the plurality of belt members are not formed in a region to which the laser beam is irradiated at the step of (b3).

[Item 20]

In the method of manufacturing the semiconductor integrated circuit device in the Item 17, the step of (b) includes: (b1) a step of preparing a substrate; (b2) after the step of (b1), a step of sequentially stacking the plurality of contact terminals, the first insulating film, the plurality of second wirings and the third wiring, the third insulating film, the plurality of belt members, and the second insulating film on the substrate; (b3) after the step of (b2), a step of connecting and retaining the first sheet onto the wiring substrate; (b4) after the step of (b3), a step of pressing the contact terminal arrangement region from the rear surface of the contact terminal arrangement region via the buffer layer by the pressing portion; and (b5) after the step of (b4), a step of forming the slit by irradiating laser beam from the contact-terminal formation surface side of the first sheet, and the plurality of belt members are not formed in a region to which the laser beam is irradiated at the step of (b5).

[Item 21]

In a probe card, the probe card includes a wiring substrate, a first sheet, and a pressing portion, the wiring substrate on which a plurality of first wirings are formed, the first sheet including: a plurality of contact terminals to be contacted to the plurality of chip electrodes formed on a principal surface of a semiconductor wafer; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface of the semiconductor wafer, and the pressing portion which presses a region of the first sheet where the plurality of contact terminals are formed, from the rear surface via a buffer layer. The first sheet includes: a first insulating film including the contact-terminal formation surface; a plurality of second wirings formed between the first insulating film and the rear surface, and electrically connected to the plurality of first wirings and the plurality of contact terminals, respectively; and a second insulating film including the rear surface, and formed on the first insulating film and the plurality of second wirings. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, a third wiring which is formed on the first insulating film along the plurality of second wirings and is not electrically connected to the plurality of contact terminals is arranged on an opposite side to the first contact terminal group of the first contact terminal arranged at an end portion of the first contact terminal group among the plurality of first contact terminals in a plan view, and a slit which is formed of an opening portion penetrating from one surface among the contact-terminal formation surface and the rear surface of the first sheet to the other surface is formed along the plurality of second wirings between the first contact terminal arranged at the end portion of the first contact terminal group and the third wiring.

[Item 22]

In a method of manufacturing a semiconductor integrated circuit device, the method includes: (a) a step of preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit; (b) a step of preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface side of the semiconductor wafer, and the pressing portion which presses a region of the first sheet, where the plurality of contact terminals are formed, from the rear surface via a buffer layer; and (c) a step of performing electrical inspection for the semiconductor integrated circuit by contacting the tips of the plurality of contact terminals of the first sheet to the plurality of chip electrodes of the semiconductor wafer. The first sheet includes: a first insulating film including the contact-terminal formation surface; a plurality of second wirings formed between the first insulating film and the rear surface, and electrically connected to the plurality of first wirings and the plurality of contact terminals, respectively; a second insulating film including the rear surface, and formed on the first insulating film and the plurality of second wirings; and a protruding portion formed on the rear surface. The plurality of contact terminals include a plurality of first contact terminals formed in a first contact terminal group arranged along a first direction in a plan view, and the protruding portion is arranged distant from the first contact terminal group in a plan view.

[Item 23]

In a method of manufacturing a semiconductor integrated circuit device, the method includes: (a) a step of preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit; (b) a step of preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface side of the semiconductor wafer, and the pressing portion which presses a region of the first sheet, where the plurality of contact terminals are formed, from the rear surface via a buffer layer; and (c) a step of performing electrical inspection for the semiconductor integrated circuit by contacting the tips of the plurality of contact terminals of the first sheet to the plurality of chip electrodes of the semiconductor wafer. The first sheet includes: a first insulating film including the contact-terminal formation surface; a plurality of second wirings formed between the first insulating film and the rear surface, and electrically connected to the plurality of first wirings and the plurality of contact terminals, respectively; a second insulating film including the rear surface, and formed on the first insulating film and the plurality of second wirings; and a protruding portion formed on the rear surface. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, and the protruding portion is arranged adjacent to the first contact terminal group in a plan view so as to be extended along the first contact terminal group.

[Item 24]

In the method of manufacturing the semiconductor integrated circuit device in the Item 23, a plurality of the protruding portions are formed on the rear surface, and the plurality of protruding portions are arranged both adjacent to the first contact terminal group in a plan view so as to be extended along the first contact terminal group.

[Item 25]

In the method of manufacturing the semiconductor integrated circuit device in the Item 24, a third insulating film covering the first insulating film and the plurality of second wirings is formed between the second insulating film and the plurality of second wirings, a plurality of belt members made of a material having a higher rigidity than that of the second insulating film are formed between the second insulating film and the third insulating film, the plurality of belt members include a plurality of first belt members arranged both adjacent to the first contact terminal group in a plan view so as to be extended as a belt shape along the first contact terminal group, and the plurality of protruding portions are formed along the plurality of belt members.

[Item 26]

In the method of manufacturing the semiconductor integrated circuit device in the Item 25, the plurality of second wirings and the plurality of contact terminals are connected to each other via a plurality of through holes formed on the plurality of contact terminals of the first insulating film, and, in the rear surface, each height of a plurality of first regions positioned on the plurality of contact terminals is lower than a height of the protruding portion, and is higher than a height of a second region between the plurality of first regions and the protruding portion.

[Item 27]

In the method of manufacturing the semiconductor integrated circuit device in the Item 24, in a plan view, a distance from a first belt member arranged on one adjacent side of the first contact terminal group among the plurality of first belt members to the first contact terminal group is equal to a distance from a first belt member arranged on the other adjacent side of the first contact terminal group to the first contact terminal group.

[Item 28]

In the method of manufacturing the semiconductor integrated circuit device in the Item 26, in a plan view, a belt width of a first belt member arranged on one adjacent side of the first contact terminal group among the plurality of first belt members is equal to a belt width of a first belt member arranged on the other adjacent side of the first contact terminal group.

[Item 29]

In the method of manufacturing the semiconductor integrated circuit device in the Item 26, in the first contact terminal group, the plurality of first contact terminals are arranged in one row or a plurality of rows along the first direction, and, in the case of the plurality of rows, the plurality of belt members are not formed in a plan view between the plurality of first contact terminals arranged in the plurality of rows.

[Item 30]

In the method of manufacturing the semiconductor integrated circuit device in the Item 25, each of the plurality of chip regions is shaped in quadrangle in a plan view, and a plurality of first chip electrodes are arranged as a first chip electrode group, a plurality of second chip electrodes are arranged as a second chip electrode group, a plurality of third chip electrodes are arranged as a third chip electrode group, and a plurality of fourth chip electrodes are arranged as a fourth chip electrode group, along four sides forming an outer edge of each chip-mounting region, respectively. At the step of (c), the first contact terminal group in which the plurality of first contact terminals are formed to face the plurality of first chip electrodes is arranged, a second contact terminal group in which the plurality of second contact terminals are formed to face the plurality of second chip electrodes is arranged, a third contact terminal group in which the plurality of third contact terminals are formed to face the plurality of third chip electrodes is arranged, and a fourth contact terminal group in which the plurality of fourth contact terminals are formed to face the plurality of fourth chip electrodes is arranged, on the contact-terminal formation surface of the first sheet. In a plan view, the plurality of belt members include: the plurality of first belt members extended as a belt shape both adjacent to the first contact terminal group along the first contact terminal group; a plurality of second belt members extended as a belt shape both adjacent to the second contact terminal group along the second contact terminal group; a plurality of third belt members extended as a belt shape both adjacent to the third contact terminal group along the third contact terminal group; and a plurality of fourth belt members extended as a belt shape both adjacent to the fourth contact terminal group along the fourth contact terminal group. The plurality of protruding portions are formed along each of the plurality of first, second, third, and fourth belt members, and a distance between the plurality of first belt members, a distance between the plurality of second belt members, a distance between the plurality of third belt members, and a distance between the plurality of fourth belt members are equal to each other.

[Item 31]

In the method of manufacturing the semiconductor integrated circuit device in the Item 30, the first, second, third, and fourth contact terminal groups forms quadrangle in a plan view, and each of the plurality of first, second, third, and fourth belt members forms a part of a first loop body arranged inside the quadrangle and a second loop body arranged outside the quadrangle in a plan view.

[Item 32]

In the method of manufacturing the semiconductor integrated circuit device in the Item 31, the first loop body is continuously formed without being divided at an intermediate portion.

[Item 33]

In the method of manufacturing the semiconductor integrated circuit device in the Item 32, the second loop body is continuously formed without being divided at an intermediate portion.

[Item 34]

In the method of manufacturing the semiconductor integrated circuit device in the Item 33, the second loop body includes four sides along respective sides of the quadrangle formed by the first, second, third, and fourth contact terminal groups, and, in a corner portion at which extension lines of the sides of the second loop body intersect with each other, the two sides are connected via an obliquely-arranged portion arranged obliquely to the respective sides so that the connected two sides are not orthogonal to each other.

[Item 35]

In the method of manufacturing the semiconductor integrated circuit device in the Item 24, each of the plurality of belt members is formed of a metal film.

[Item 36]

A probe card includes: a wiring substrate, a first sheet, and a pressing portion, the wiring substrate on which a plurality of first wirings are formed, the first sheet including: a plurality of contact terminals to be contacted to a plurality of chip electrodes formed on a principal surface of a semiconductor wafer; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface of the semiconductor wafer, and the pressing portion which presses a region of the first sheet where the plurality of contact terminals are formed, from the rear surface via a buffer layer. The first sheet includes: a first insulating film including the contact-terminal formation surface; a plurality of second wirings formed between the first insulating film and the rear surface, and electrically connected to the plurality of first wirings and the plurality of contact terminals, respectively; a second insulating film including the rear surface, and formed on the first insulating film and the plurality of second wirings; and a protruding portion formed on the rear surface. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, and the protruding portion is arranged adjacent to the first contact terminal group so as to be extended along the first contact terminal group in a plan view.

[Item 37]

In the probe card in the Item 36, a plurality of the protruding portions are formed on the rear surface, and the plurality of protruding portions are arranged both adjacent to the first contact terminal group in a plan view so as to be extended along the first contact terminal group.

[Item 38]

In the probe card in the Item 37, a third insulating film covering the first insulating film and the plurality of second wirings is formed between the second insulating film and the plurality of second wirings, a plurality of belt members made of a material having a higher rigidity than that of the second insulating film are formed between the second insulating film and the third insulating film, the plurality of belt members include a plurality of first belt members arranged both adjacent to the first contact terminal group in a plan view so as to be extended as a belt shape along the first contact terminal group, and the plurality of protruding portions are formed along the plurality of belt members.

[Item 39]

In the probe card in the Item 38, the plurality of second wirings and the plurality of contact terminals are connected to each other via a plurality of through holes formed on the plurality of contact terminals of the first insulating film, and, in the rear surface, each height of a plurality of first regions positioned on the plurality of contact terminals is lower than a height of the protruding portion, and is higher than a height of a second region between the plurality of first regions and the protruding portion.

[Item 40]

In the probe card in the Item 39, in a plan view, a distance from a first belt member arranged on one adjacent side of the first contact terminal group among the plurality of first belt members to the first contact terminal group is equal to a distance from a first belt member arranged on the other adjacent side of the first contact terminal group to the first contact terminal group.

[Item 41]

In the probe card in the Item 39, the plurality of contact terminals are formed in a contact-terminal arrangement region on the contact-terminal formation surface of the first sheet, and the contact-terminal arrangement region is shaped in quadrangle in a plan view. Along four sides forming an outer edge of the contact-terminal arrangement region, the plurality of first contact terminals are arranged as the first contact terminal group, a plurality of second contact terminals are arranged as a second contact terminal group, a plurality of third contact terminals are arranged as a third contact terminal group, and a plurality of fourth contact terminals are arranged as a fourth contact terminal group, respectively. In a plan view, the plurality of belt members include: the plurality of first belt members extended as a belt shape both adjacent to the first contact terminal group along the first contact terminal group; a plurality of second belt members extended as a belt shape both adjacent to the second contact terminal group along the second contact terminal group; a plurality of third belt members extended as a belt shape both adjacent to the third contact terminal group along the third contact terminal group; and a plurality of fourth belt members extended as a belt shape both adjacent to the fourth contact terminal group along the fourth contact terminal group. The plurality of protruding portions are formed along the plurality of first, second, third, and fourth belt members, respectively, and a distance between the plurality of first belt members, a distance between the plurality of second belt members, a distance between the plurality of third belt members, and a distance between the plurality of fourth belt members are equal to each other.

[Item 42]

A semiconductor inspection apparatus includes: a mount on which a semiconductor wafer is placed; and a probe card electrically connected to a tester for inspecting electrical characteristics of the semiconductor wafer. The probe card includes a wiring substrate, a first sheet, and a pressing portion, the wiring substrate on which a plurality of first wirings are formed, the first sheet including: a plurality of contact terminals to be contacted to a plurality of chip electrodes formed on a principal surface of the semiconductor wafer; a contact-terminal formation surface on which the plurality of contact terminals are formed; and a rear surface positioned on an opposite side to the contact-terminal formation surface, and the first sheet being retained on the wiring substrate so that tips of the plurality of contact terminals face the principal surface of the semiconductor wafer, and the pressing portion pressing a region of the first sheet, where the plurality of contact terminals are formed, from the rear surface via a buffer layer. The first sheet includes: a first insulating film including the contact-terminal formation surface; a plurality of second wirings formed between the first insulating film and the rear surface, and electrically connected to the plurality of first wirings and the plurality of contact terminals, respectively; and a second insulating film including the rear surface, and formed on the first insulating film and the plurality of second wirings. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in the plan view, a third wiring formed on the first insulating film along the plurality of second wirings and not electrically connected to the plurality of contact terminals is arranged on an opposite side to the first contact terminal group of the first contact terminal arranged at an end portion of the first contact terminal group among the plurality of first contact terminals in the plan view, and a slit formed of an opening portion penetrating from one surface among the contact-terminal formation surface and the rear surface of the first sheet to the other surface is formed along the plurality of second wirings between the first contact terminal arranged at the end portion of the first contact terminal group and the third wiring.

[Item 43]

A semiconductor inspection apparatus includes: a mount on which a semiconductor wafer is placed; and a probe card electrically connected to a tester for inspecting electrical characteristics of the semiconductor wafer. The probe card includes a wiring substrate, a first sheet, and a pressing portion, the wiring substrate on which a plurality of first wirings are formed, the first sheet including: a plurality of contact terminals to be contacted to a plurality of chip electrodes formed on a principal surface of the semiconductor wafer; a contact-terminal formation surface on which the plurality of contact terminals are formed; and a rear surface positioned on an opposite side to the contact-terminal formation surface, and the first sheet being retained on the wiring substrate so that tips of the plurality of contact terminals face the principal surface of the semiconductor wafer, and the pressing portion pressing a region of the first sheet, where the plurality of contact terminals are formed, from the rear surface via a buffer layer. The first sheet includes: a first insulating film including the contact-terminal formation surface; a plurality of second wirings formed between the first insulating film and the rear surface, and electrically connected to the plurality of first wirings and the plurality of contact terminals, respectively; and a second insulating film including the rear surface, and formed on the first insulating film and the plurality of second wirings. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, a third wiring formed on the first insulating film along the plurality of second wirings and not electrically connected to the plurality of contact terminals is arranged on an opposite side to the first contact terminal group of the first contact terminal arranged at an end portion of the first contact terminal group among the plurality of first contact terminals in a plan view, a slit formed of an opening portion penetrating from one surface among the contact-terminal formation surface and the rear surface of the first sheet to the other surface is formed along the plurality of second wirings between the first contact terminal arranged at the end portion of the first contact terminal group and the third wiring, and the protruding portion is arranged adjacent to the first contact terminal group in a plan view so as to be extended along the first contact terminal group, and the protruding portion is not formed in a region where the slit is arranged on extension of the protruding portion.

[Item 44]

A semiconductor inspection apparatus includes: a mount on which a semiconductor wafer is placed; and a probe card electrically connected to a tester for inspecting electrical characteristics of the semiconductor wafer. The probe card includes a wiring substrate, a first sheet, and a pressing portion, the wiring substrate on which a plurality of first wirings are formed, the first sheet including: a plurality of contact terminals to be contacted to a plurality of chip electrodes formed on a principal surface of the semiconductor wafer; a contact-terminal formation surface on which the plurality of contact terminals are formed; and a rear surface positioned on an opposite side to the contact-terminal formation surface, and the first sheet being retained on the wiring substrate so that tips of the plurality of contact terminals face the principal surface of the semiconductor wafer, and the pressing portion pressing a region of the first sheet, where the plurality of contact terminals are formed, from the rear surface via a buffer layer. The first sheet includes: a first insulating film including the contact-terminal formation surface; a plurality of second wirings formed between the first insulating film and the rear surface, and electrically connected to the plurality of first wirings and the plurality of contact terminals, respectively; a second insulating film including the rear surface, and formed on the first insulating film and the plurality of second wirings, and a protruding portion formed on the rear surface. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, and the protruding portion is arranged distant from the first contact terminal group in the plan view.

[Item 45]

A semiconductor inspection apparatus includes: a mount on which a semiconductor wafer is placed; and a probe card electrically connected to a tester for inspecting electrical characteristics of the semiconductor wafer. The probe card includes a wiring substrate, a first sheet, and a pressing portion, the wiring substrate on which a plurality of first wirings are formed, the first sheet including: a plurality of contact terminals to be contacted to a plurality of chip electrodes formed on a principal surface of the semiconductor wafer; a contact-terminal formation surface on which the plurality of contact terminals are formed; and a rear surface positioned on an opposite side to the contact-terminal formation surface, and the first sheet being retained on the wiring substrate so that tips of the plurality of contact terminals face the principal surface of the semiconductor wafer, and the pressing portion pressing a region of the first sheet, where the plurality of contact terminals are formed, from the rear surface via a buffer layer. The first sheet includes: a first insulating film including the contact-terminal formation surface; a plurality of second wirings formed between the first insulating film and the rear surface, and electrically connected to the plurality of first wirings and the plurality of contact terminals, respectively; a second insulating film including the rear surface, and formed on the first insulating film and the plurality of second wirings; and a protruding portion formed on the rear surface. The plurality of contact terminals include a plurality of first contact terminals formed in a first contact terminal group arranged along a first direction in a plan view, the plurality of second wirings connected to the plurality of first contact terminals among the plurality of second wirings are arranged so as to be extended along a direction intersecting with the first direction in a plan view, and the protruding portion is arranged adjacent to the first contact terminal group in a plan view so as to be extended along the first contact terminal group.

The present invention can be used for a semiconductor integrated circuit device for performing electrical inspection by pressing a contact terminal of a probe card onto an electrode and for a probe card used in the electrical inspection.

What is claimed is:

1. A method of manufacturing a semiconductor integrated circuit device, the method comprising the steps of:
    (a) preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit;
    (b) preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, and the first sheet being retained on the wiring substrate so that tips of the plurality of contact terminals face the principal surface side of the semiconductor wafer, and the pressing portion pressing a contact-terminal arrangement region of the first sheet, where the plurality of contact terminals are formed, from the rear surface via a buffer layer; and
    (c) performing electrical inspection for the semiconductor integrated circuit by contacting the tips of the plurality of contact terminals of the first sheet to the plurality of chip electrodes of the semiconductor wafer,
    the first sheet including:
        a first insulating film including the contact-terminal formation surface;
        a plurality of second wirings formed between the first insulating film and the rear surface, and electrically connected to the plurality of first wirings and the plurality of contact terminals, respectively; and
        a second insulating film including the rear surface, and formed on the first insulating film and the plurality of second wirings,
    the plurality of contact terminals including a plurality of first contact terminals formed in a first contact terminal group arranged along a first direction in a plan view,
    the plurality of second wirings connected to the plurality of first contact terminals among the plurality of second wirings being arranged so as to be extended along a direction intersecting with the first direction in a plan view,
    a third wiring formed on the first insulating film along the plurality of second wirings and not electrically connected to the plurality of contact terminals being arranged on an opposite side to the first contact terminal group of the first contact terminal arranged at an end portion of the first contact terminal group among the plurality of first contact terminals in a plan view, and
    a slit formed of an opening portion penetrating from one surface among the contact-terminal formation surface and the rear surface of the first sheet to the other surface being formed along the plurality of second wirings between the first contact terminal arranged at the end portion of the first contact terminal group and the third wiring.

2. The method of manufacturing the semiconductor integrated circuit device according to claim 1, wherein
    a length of the slit is longer than a width of the first contact terminal group in a direction orthogonal to an extending direction of the first contact terminal group.

3. The method of manufacturing the semiconductor integrated circuit device according to claim 2, wherein,
    in a plan view, the contact-terminal arrangement region shaped in quadrangle includes: the first contact terminal group arranged along a first side among four sides forming an outer edge of the contact-terminal arrangement region; a second contact terminal group in which a plurality of second contact terminals are arranged along a second side intersecting with the first side; and a first corner region at which the first contact terminal group and the second contact terminal group intersect with each other, and
    the slit is formed between the first corner region and the first contact terminal group and between the first corner region and the second contact terminal group, respectively.

4. The method of manufacturing the semiconductor integrated circuit device according to claim 3, wherein
    the length of the slit in a direction from the first or second contact terminal group toward an outside of the contact-terminal arrangement region is longer than the length of the slit in a direction from the first or second contact terminal group toward an inside of the contact-terminal arrangement region.

5. The method of manufacturing the semiconductor integrated circuit device according to claim 1, wherein
a side surface of the second wiring on the slit side is covered by the second insulating film.

6. The method of manufacturing the semiconductor integrated circuit device according to claim 1, wherein
the first contact terminal group includes: a first region where the plurality of first contact terminals are arranged at a first interval; and a second region where the plurality of first contact terminals are arranged at a second interval wider than the first interval, and
the slit is formed along the second wiring between the first contact terminal arranged in the second region and the first contact terminal arranged at an end portion of the first region.

7. The method of manufacturing the semiconductor integrated circuit device according to claim 1, wherein
the step of (b) includes the steps of:
(b1) preparing a substrate;
(b2) after the step of (b1), sequentially stacking the plurality of contact terminals, the first insulating film, the plurality of second wirings and the third wiring, and the second insulating film on the substrate; and
(b3) after the step of (b2), forming the slit by irradiating laser beam from the rear surface side of the first sheet; and
(b4) after the step of (b3), connecting and retaining the first sheet onto the wiring substrate.

8. The method of manufacturing the semiconductor integrated circuit device according to claim 1, wherein
the step of (b) includes the steps of:
(b1) preparing a substrate;
(b2) after the step of (b1), sequentially stacking the plurality of contact terminals, the first insulating film, the plurality of second wirings and the third wiring, and the second insulating film on the substrate;
(b3) after the step of (b2), connecting and retaining the first sheet onto the wiring substrate;
(b4) after the step of (b3), pressing the contact-terminal arrangement region from the rear surface of the contact-terminal arrangement region via the buffer layer by the pressing portion; and
(b5) after the step of (b4), forming the slit by irradiating laser beam from the contact-terminal formation surface side of the first sheet.

9. The method of manufacturing the semiconductor integrated circuit device according to claim 8, wherein,
in the step of (b5), an opening portion reaching at least a part of the buffer layer arranged in an upper layer of the slit is formed.

10. The method of manufacturing the semiconductor integrated circuit device according to claim 1, wherein
the plurality of first contact terminals arranged in the first contact terminal group includes: a plurality of first-row contact terminals arranged in a first row along the first direction; and a plurality of second-row contact terminals arranged in a second row,
in a periphery of an end portion of the first contact terminal group, the plurality of first-row contact terminals are not arranged, and the plurality of second-row contact terminals are arranged in one row,
the slit is formed between a contact terminal arranged at an end portion of the second row among the plurality of second-row contact terminals and the third wiring arranged on an opposite side to the first contact terminal group of the corresponding contact terminal, and
the slit is not formed between a contact terminal arranged at an end portion of the first row among the plurality of first-row contact terminals and the second or third wiring arranged adjacent to the corresponding contact terminal.

11. The method of manufacturing the semiconductor integrated circuit device according to claim 1, wherein
the plurality of first contact terminals arranged in the first contact terminal group includes: a plurality of first-row contact terminals arranged in a first row along the first direction; and a plurality of second-row contact terminals arranged in a second row,
the first row of the first contact terminal group includes: a first dense-arrangement region where the plurality of first-row contact terminals are arranged at a first interval; and a first dispersive-arrangement region where the plurality of first-row contact terminals are arranged at a second interval wider than the first interval,
the second row of the first contact terminal group includes: a second dense-arrangement region where the plurality of second-row contact terminals are arranged at a third interval; and a second dispersive-arrangement region where the plurality of second-row contact terminals are arranged at a fourth interval wider than the third interval, and
the slit is formed in a region where the first and second dispersive-arrangement regions are arranged along the first direction and adjacent to each other.

12. The method of manufacturing the semiconductor integrated circuit device according to claim 1, wherein
the first sheet includes a protruding portion formed on the rear surface, and
the protruding portion is arranged adjacent to the first contact terminal group in a plan view so as to be extended along the first contact terminal group, and the protruding portion is not formed in a region where the slit is arranged on an extension of the protruding portion.

13. A method of manufacturing a semiconductor integrated circuit device, the method comprising the steps of:
(a) preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit;
(b) preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface side of the semiconductor wafer, and the pressing portion which presses a region of the first sheet, where the plurality of contact terminals are formed, from the rear surface via a buffer layer; and
(c) performing electrical inspection for the semiconductor integrated circuit by contacting the tips of the plurality of contact terminals of the first sheet to the plurality of chip electrodes of the semiconductor wafer,
the first sheet including:
a first insulating film including the contact-terminal formation surface;

a plurality of second wirings formed between the first insulating film and the rear surface, and electrically connected to the plurality of first wirings and the plurality of contact terminals, respectively;

a second insulating film including the rear surface, and formed on the first insulating film and the plurality of second wirings; and a protruding portion formed on the rear surface, the plurality of contact terminals including a plurality of first contact terminals formed in a first contact terminal group arranged along a first direction in a plan view, and the protruding portion being arranged distant from the first contact terminal group in a plan view.

14. A method of manufacturing a semiconductor integrated circuit device, the method comprising the steps of:

(a) preparing a semiconductor wafer, which is partitioned into a plurality of chip regions, in which a semiconductor integrated circuit is formed in each of the plurality of chip regions, and on whose principal surface a plurality of chip electrodes are electrically connected to the semiconductor integrated circuit;

(b) preparing a first card including a wiring substrate, a first sheet, and a pressing portion, the wiring substrate on which a plurality of first wirings are formed, the first sheet including: a plurality of contact terminals to be contacted to the plurality of chip electrodes; a contact-terminal formation surface on which the plurality of contact terminals are formed; and a rear surface positioned on an opposite side to the contact-terminal formation surface, the first sheet being retained on the wiring substrate so that tips of the plurality of contact terminals face the principal surface side of the semiconductor wafer, and the pressing portion which presses a region of the first sheet, where the plurality of contact terminals are formed, from the rear surface via a buffer layer; and (c) performing electrical inspection for the semiconductor integrated circuit by contacting the tips of the plurality of contact terminals of the first sheet to the plurality of chip electrodes of the semiconductor wafer, the first sheet including:

a first insulating film including the contact-terminal formation surface;

a plurality of second wirings formed between the first insulating film and the rear surface, and electrically connected to the plurality of first wirings and the plurality of contact terminals, respectively;

a second insulating film including the rear surface, and formed on the first insulating film and the plurality of second wirings; and a protruding portion formed on the rear surface, the plurality of contact terminals including a plurality of first contact terminals formed in a first contact terminal group arranged along a first direction in a plan view, the plurality of second wirings connected to the plurality of first contact terminals among the plurality of second wirings being arranged so as to be extended along a direction intersecting with the first direction in a plan view, and the protruding portion being arranged adjacent to the first contact terminal group in a plan view so as to be extended along the first contact terminal group.

15. The method of manufacturing the semiconductor integrated circuit device according to claim 14, wherein a plurality of the protruding portions are formed on the rear surface, and the plurality of protruding portions are arranged both adjacent to the first contact terminal group in a plan view so as to be extended along the first contact terminal group.

16. The method of manufacturing the semiconductor integrated circuit device according to claim 15, wherein a third insulating film covering the first insulating film and the plurality of second wirings is formed between the second insulating film and the plurality of second wirings, a plurality of belt members made of a material having a higher rigidity than a rigidity of the second insulating film are formed between the second insulating film and the third insulating film, the plurality of belt members include a plurality of first belt members arranged both adjacent to the first contact terminal group in a plan view so as to be extended as a belt shape along the first contact terminal group, and the plurality of protruding portions are formed along the plurality of belt members.

17. The method of manufacturing the semiconductor integrated circuit device according to claim 16, wherein the plurality of second wirings and the plurality of contact terminals are connected to each other via a plurality of through holes formed on the plurality of contact terminals of the first insulating film, and, in the rear surface, each height of a plurality of first regions positioned on the plurality of contact terminals is lower than a height of the protruding portion, and is higher than a height of a second region between the plurality of first regions and the protruding portion.

18. The method of manufacturing the semiconductor integrated circuit device according to claim 15, wherein, in a plan view, a distance from a first belt member arranged on one adjacent side of the first contact terminal group among the plurality of first belt members to the first contact terminal group is equal to a distance from a first belt member arranged on the other adjacent side of the first contact terminal group to the first contact terminal group.

19. The method of manufacturing the semiconductor integrated circuit device according to claim 17, wherein, in a plan view, a belt width of a first belt member arranged on one adjacent side of the first contact terminal group among the plurality of first belt members is equal to a belt width of a first belt member arranged on the other adjacent side of the first contact terminal group.

20. The method of manufacturing the semiconductor integrated circuit device according to claim 17, wherein, in the first contact terminal group, the plurality of first contact terminals are arranged in one row or a plurality of rows along the first direction, and, in the case of the plurality of rows, the plurality of belt members are not formed in a plan view between the plurality of first contact terminals arranged in the plurality of rows.

* * * * *